(12) United States Patent
Wang et al.

(10) Patent No.: US 11,408,089 B2
(45) Date of Patent: Aug. 9, 2022

(54) DEVICES AND METHODS FOR GROWING CRYSTALS

(71) Applicant: MEISHAN BOYA ADVANCED MATERIALS CO., LTD., Sichuan (CN)

(72) Inventors: Yu Wang, Meishan (CN); Tian Yang, Meishan (CN); Zhenxing Liang, Meishan (CN); Min Li, Meishan (CN)

(73) Assignee: MEISHAN BOYA ADVANCED MATERIALS CO., LTD., Meishan (CN)

(*) Notice: Subject to any disclaimer, the term of this patent is extended or adjusted under 35 U.S.C. 154(b) by 0 days.

(21) Appl. No.: 17/520,815

(22) Filed: Nov. 8, 2021

(65) Prior Publication Data

US 2022/0056612 A1 Feb. 24, 2022

Related U.S. Application Data

(63) Continuation of application No. PCT/CN2021/085468, filed on Apr. 2, 2021.

(30) Foreign Application Priority Data

May 6, 2020 (CN) .......................... 202010373329.8
Jul. 2, 2020 (CN) ......................... 202010626511.X

(51) Int. Cl.
*C30B 23/00* (2006.01)
*C30B 23/06* (2006.01)
(Continued)

(52) U.S. Cl.
CPC ............ *C30B 23/002* (2013.01); *C30B 23/06* (2013.01); *C30B 29/36* (2013.01); *C30B 33/06* (2013.01);
(Continued)

(58) Field of Classification Search
CPC ....... C30B 23/002; C30B 23/06; C30B 29/36; C30B 33/06
See application file for complete search history.

(56) References Cited

U.S. PATENT DOCUMENTS 4,619,811 A 10/1986 Nishizawa
5,343,827 A 9/1994 Bordui et al.
(Continued)

FOREIGN PATENT DOCUMENTS

CN 1544715 A 11/2004
CN 101323973 A 12/2008
(Continued)

OTHER PUBLICATIONS

International Search Report in PCT/CN2021/085468 dated May 26, 2021, 8 pages.
(Continued)

*Primary Examiner* — Hua Qi
(74) *Attorney, Agent, or Firm* — Metis IP LLC

(57) ABSTRACT

The present disclosure provides a device for preparing a crystal and a method for growing a crystal. The device may include a growth chamber configured to execute a crystal growth; and a temperature control system configured to heat the growth chamber to cause that a radial temperature difference in the growth chamber does not exceed a first preset range of an average temperature in the growth chamber during the crystal growth. The method may include placing a seed crystal and a source material in a growth chamber to grow a crystal; and controlling a heating component based on information of a temperature sensing component, to cause that a radial temperature difference in the growth chamber does not exceed a first preset range of an average temperature in the growth chamber during a crystal growth.

20 Claims, 17 Drawing Sheets

(51) Int. Cl.
*C30B 29/36* (2006.01)
*C30B 33/06* (2006.01)

(52) U.S. Cl.
CPC ........ *Y10T 117/00* (2015.01); *Y10T 117/1008* (2015.01)

(56) References Cited

U.S. PATENT DOCUMENTS

| | | | |
|---|---|---|---|
| 2003/0037724 A1* | 2/2003 | Snyder | .................. C30B 23/06 117/208 |
| 2008/0053372 A1 | 3/2008 | Anttila et al. | |
| 2008/0220232 A1 | 9/2008 | Nakabayashi et al. | |
| 2009/0165718 A1 | 7/2009 | Lee et al. | |
| 2013/0280466 A1 | 10/2013 | Zwieback et al. | |
| 2015/0113799 A1* | 4/2015 | Takada | ............... H05K 13/0465 29/739 |
| 2015/0376813 A1 | 12/2015 | Tsuchida et al. | |
| 2016/0097143 A1 | 4/2016 | Rengarajan et al. | |
| 2016/0122902 A1* | 5/2016 | Harada | .................. C30B 29/36 117/109 |
| 2018/0057925 A1 | 3/2018 | Ma et al. | |
| 2019/0323145 A1 | 10/2019 | Xu et al. | |
| 2020/0263320 A1 | 8/2020 | Okayama et al. | |

FOREIGN PATENT DOCUMENTS

| | | |
|---|---|---|
| CN | 202717878 U | 2/2013 |
| CN | 102978691 A | 3/2013 |
| CN | 104152992 A | 11/2014 |
| CN | 104313693 A | 1/2015 |
| CN | 204417642 U | 6/2015 |
| CN | 105040104 A | 11/2015 |
| CN | 105316758 A | 2/2016 |
| CN | 105525351 A | 4/2016 |
| CN | 106048715 A | 10/2016 |
| CN | 106048729 A | 10/2016 |
| CN | 106435732 A | 2/2017 |
| CN | 106637410 A | 5/2017 |
| CN | 106906515 A | 6/2017 |
| CN | 107916454 A | 4/2018 |
| CN | 108018605 A | 5/2018 |
| CN | 207391600 U | 5/2018 |
| CN | 108277534 A | 7/2018 |
| CN | 207845760 U | 9/2018 |
| CN | 208151525 U | 11/2018 |
| CN | 209062038 U | 7/2019 |
| CN | 110541199 A | 12/2019 |
| CN | 111074348 A | 4/2020 |
| CN | 111088524 A | 5/2020 |
| CN | 111088525 A | 5/2020 |
| CN | 111235630 A | 6/2020 |
| CN | 111254486 A | 6/2020 |
| CN | 111501096 A | 8/2020 |

OTHER PUBLICATIONS

Written Opinion in PCT/CN2021/085468 dated May 26, 2021, 8 pages.
First Office Action in Chinese Application No. 202010373329.8 dated Jun. 16, 2020, 16 pages.
First Office Action in Chinese Application No. 202010626511.X dated Aug. 13, 2020, 14 pages.
Second Office Action in Chinese Application No. 202011524796.2 dated Aug. 18, 2021, 13 pages.
First Office Action in Chinese Application No. 202110363902.1 dated Sep. 2, 2021, 14 pages.
First Office Action in Chinese Application No. 202110383899.3 dated Sep. 23, 2021, 11 pages.
First Office Action in Chinese Application No. 202110363900.2 dated Sep. 3, 2021, 12 pages.
First Office Action in Chinese Application No. 202110364841.0 dated Sep. 8, 2021, 14 pages.
Huang, Jie et al., Normally-off Metamorphic AlInAs/AlInAs HEMTs on Si Substrates Grown by MOCVD, Chinese Physics B, 24(7): 078102-1-078102-5, 2015.
Zhou, Lin, Sapphire Crystal Growth Method Study ,Silicon Valley, 2013, 6 pages.
Zhang, Qunshe, et al., Effects of Different Height and Space of a Multi-turn Inductive Coil on Temperature Distribution in the Large-size 6H-SIC Growth System, Journal of Synthetic Crystals, 36(1): 180-183, 2007.

* cited by examiner

1900

```
┌─────────────────────────────────────────────┐  1910
│ Placing a seed crystal at a top portion of a│
│ growth chamber, and placing a source material│
│   at a bottom portion of the growth chamber │
└─────────────────────────────────────────────┘
                      │
                      ▼
┌─────────────────────────────────────────────┐  1920
│  Mounting a first temperature compensation  │
│     component and a second temperature      │
│ compensation component to an upper surface  │
│ and/or a lower surface of the growth chamber│
│                 respectively                │
└─────────────────────────────────────────────┘
                      │
                      ▼
┌─────────────────────────────────────────────┐  1930
│  Disposing a heating component outside the  │
│               growth chamber                │
└─────────────────────────────────────────────┘
                      │
                      ▼
┌─────────────────────────────────────────────┐  1940
│  Heating the growth chamber by the heating  │
│  component and the temperature compensation │
│                  component                  │
└─────────────────────────────────────────────┘
                      │
                      ▼
┌─────────────────────────────────────────────┐  1950
│   Adjusting heating powers of the heating   │
│    component and/or the temperature         │
│  compensation component by a control        │
│ component during the crystal growth based on│
│ at least one crystal growth parameter, so that a│
│  temperature field between the crystal growth│
│  interface and a source material is maintained│
│                   stable                    │
└─────────────────────────────────────────────┘
```

2210 — Obtaining a plurality of orthohexagonal seed crystals in a hexagonal crystal system by performing a first cutting on a plurality of seed crystals in the hexagonal crystal system to be expanded, respectively, wherein cutting faces of the plurality of orthohexagonal seed crystals correspond to a same lattice plane family 2220 — Splicing the plurality of orthohexagonal seed crystals in the hexagonal crystal system 2230 — Obtaining a seed crystal in the hexagonal crystal system to be grown by performing a second cutting on the plurality of spliced orthohexagonal seed crystals in the hexagonal crystal system 2240 — Obtaining an intermediate seed crystal in the hexagonal crystal system by performing a gap growth on the seed crystal in the hexagonal crystal system to be grown under a first setting condition 2250 — Obtaining the target seed crystal in the hexagonal crystal system by performing an epitaxial growth on the intermediate seed crystal in the hexagonal crystal system under a second setting condition

FIG. 22

DEVICES AND METHODS FOR GROWING CRYSTALS

CROSS-REFERENCE TO RELATED APPLICATION

This application is a Continuation of International Application No. PCT/CN2021/085468 filed on Apr. 2, 2020, which claims priority to Chinese Patent Application No. 202010373329.8 filed on May 6, 2020 and Chinese Patent Application No. 202010626511.X filed on Jul. 2, 2020, the contents of which are hereby incorporated by reference.

TECHNICAL FIELD

The present disclosure relates to the field of crystal preparation, and in particular to devices and methods for growing crystals.

BACKGROUND

Semiconductor crystals (e.g., silicon carbide single crystals) have excellent physical and chemical properties, and therefore become important materials for manufacturing high-frequency and high-power devices. Physical Vapor Transport (PVT) is a manner for preparing the semiconductor crystals. Materials are decomposed and sublimated into vapor components under a high-temperature condition, the vapor components are transported to a seed crystal in a low-temperature region driven by an axial temperature gradient, and a crystal is generated through vapor deposition on a surface of the seed crystal. However, during the crystal growth, there is not only the axial temperature gradient but also a radial temperature gradient. When large-sized crystals are intended to be grown, a relatively large radial temperature gradient may cause crystal growth defects and may reduce the quality and yield of the crystals. In addition, due to the large radial temperature gradient in a source material coverage region, a molar ratio of sublimated vapor components is un-uniformly distributed along a radial direction, which is not conducive to a stable crystal growth. Therefore, it is desirable to provide an improved crystal preparation device and a growth method thereof to prepare large-size and high-quality crystals.

SUMMARY

An aspect of the present disclosure provides a crystal preparation device. The device may include a growth chamber and a temperature control system. The growth chamber may be configured to execute a crystal growth. The temperature control system may be configured to heat the growth chamber to cause that a radial temperature difference in the growth chamber does not exceed a first preset range of an average temperature in the growth chamber during the crystal growth.

Another aspect of the present disclosure provides a crystal preparation device. The device may include a growth chamber, a heating component, and a temperature compensation component. The growth chamber may be configured to place a seed crystal and a source material. The heating component may be configured to heat the growth chamber. The temperature compensation component may be configured to provide temperature compensation during a crystal growth. The temperature compensation component may be located on an upper surface and/or a lower surface of the growth chamber. The temperature compensation component may include at least one heating unit.

Still another aspect of the present disclosure provides a crystal preparation device. The device may include a growth chamber and a heating component. The growth chamber may be configured to place a seed crystal and a source material. The seed crystal may be placed on a top of the growth chamber, and the source material may be placed at a bottom of the growth chamber. The heating component may be configured to heat the growth chamber. The heating component may be located outside the growth chamber. The heating component may include a resistance heating element.

Still another aspect of the present disclosure provides a method for preparing a crystal. The method may include placing a seed crystal and a source material in a growth chamber to grow a crystal; controlling a heating component based on information of a temperature sensing component, to cause that a radial temperature difference in the growth chamber does not exceed a first preset range of an average temperature in the growth chamber during a crystal growth.

Still another aspect of the present disclosure provides a method for growing a seed crystal. The method may include obtaining a plurality of orthohexagonal seed crystals in a hexagonal crystal system by performing a first cutting on a plurality of seed crystals in the hexagonal crystal system to be expanded, respectively. Cutting faces of the plurality of orthohexagonal seed crystals may correspond to a same lattice plane family. The method may include splicing the plurality of orthohexagonal seed crystals in the hexagonal crystal system. The method may also include obtaining a seed crystal in the hexagonal crystal system to be grown by performing a second cutting on the plurality of spliced orthohexagonal seed crystals in the hexagonal crystal system. The method may include obtaining an intermediate seed crystal in the hexagonal crystal system by performing a gap growth on the seed crystal in the hexagonal crystal system to be grown under a first setting condition. The method may further include obtaining a target seed crystal in the hexagonal crystal system by performing an epitaxial growth on the intermediate seed crystal in the hexagonal crystal system under a second setting condition. A diameter of the target seed crystal in the hexagonal crystal system may be larger than a diameter of the seed crystals in the hexagonal crystal system to be expanded.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein:

FIG. 19 is a flowchart illustrating an exemplary process for crystal growth according to some embodiments of the present disclosure;

FIG. 22 is a flowchart illustrating an exemplary process for preparing a seed crystal according to some embodiments of the present disclosure.

Figure 1:
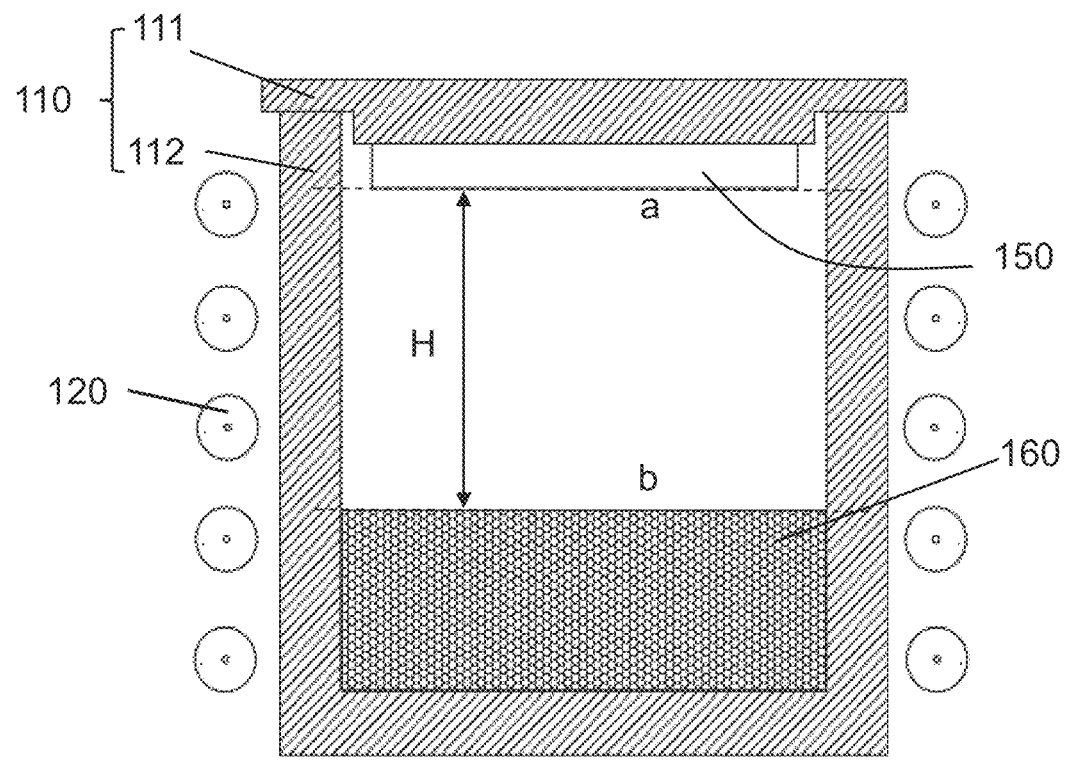
FIG. 1 is a schematic diagram illustrating an exemplary crystal preparation device according to some embodiments of the present disclosure.

In the drawings, 100 represents a crystal preparation device, 110 represents a growth chamber, 120 represents a heating component, 111 represents a growth chamber cover, 112 represents a growth chamber body, 130 represents a heat insulation layer, 150 represents a seed crystal, 160 represents a source material, 1210 represents a temperature compensation component, 1210-1 represents a first temperature compensation component, 1210-2 represents a second temperature compensation component, 1211 represents a second electrode, 1212 represents at least one heating unit, 1213 represents a first electrode, 1214 represents a copper wire, 1215 represents an electrode fixing plate, 1215-1 represents a first hole, 1215-2 represents a second hole, 1215-3 represents a thermometer hole; 1215-4 represents at least two holes, 1216 represents a fixing frame, 1220 represents a first heating component, 1230 represents a resistance heating element, 1230-1 represents a first heating module; 1230-2 represents a second heating module, 1230-3 represents a third heating module, 1230-11 represents a first sub-resistance heating element, 1230-12 represents a second sub-resistance heating element, 1230-13 represents a third sub-resistance heating element, 1230-14 represents a fourth sub-resistance heating element, 1230-21 represents a fifth sub-resistance heating element, 1230-22 represents a sixth sub-resistance heating element, 1230-23 represents a seventh sub-resistance heating element, 1230-31 represents an eighth sub-resistance heating element, 1230-32 represents a ninth sub-resistance heating element, 1230-33 represents a tenth sub-resistance heating element, 1230-34 represents an eleventh sub-resistance heating element, 1230-35 represents a twelfth sub-resistance heating element, 1230-36 represents a thirteenth sub-resistance heating element, 1230-37 represents a fourteenth sub-resistance heating element, 1230-38 represents a fifteenth sub-resistance heating element, 1230-39 represents a sixteenth sub-resistance heating element, 1240 represents a second heating element, 1241 represents at least one conduction ring, 1242 represents a first conduction electrode, 1243 represents a second conduction electrode, 1244 represents a first electrode pin, 1245 represents a second electrode pin, 1246 represents a first electrode hole A, 1247 represents a first electrode hole B, 1248 represents a second electrode hole, 1250 represents at least one flow channel, 1251 represents a first flow channel circumference, 1252 represents a second flow channel circumference, 1253 represents a third flow channel circumference, 1254 represents a fourth flow channel circumference, 210 represents a temperature sensing component, 220 represents a heating component, 230 represents a control component, 2310 represents a seed crystal in a hexagonal crystal system to be expanded, 2321 represents an orthohexagonal seed crystals in the hexagonal crystal system with a lattice plane family $\{1\bar{1}00\}$, 2322 represents an orthohexagonal seed crystal in the hexagonal crystal system with a lattice plane family $\{11\bar{2}0\}$, 2330 represents a plurality of orthohexagonal seed crystals in the hexagonal crystal system being tightly spliced, 2340 represents a seed crystal in the hexagonal crystal system to be grown after a second cutting, and 2341 represents a splicing gap.

DETAILED DESCRIPTION

In the following detailed description, numerous specific details are set forth by way of examples in order to provide a thorough understanding of the relevant disclosure. Obviously, drawings described below are only some examples or embodiments of the present disclosure. Those skilled in the art, without further creative efforts, may apply the present disclosure to other similar scenarios according to these drawings. Unless obviously obtained from the context or the context illustrates otherwise, the same numeral in the drawings refers to the same structure or operation. It should be understood that the purposes of these illustrated embodiments are only provided to those skilled in the art to practice the application, and not intended to limit the scope of the present disclosure. It should be understood that the drawings are not drawn in scale.

It should be understood that, in order to facilitate the description of the present disclosure, the terms "center," "upper surface," "lower surface," "upper," "lower," "top," "bottom," "inner," "outer," "axial," "radial," "periphery," "outside," etc. indicate a positional relationship based on a positional relationship shown in the drawings, rather than indicating that devices, components, or units must have the specific positional relationship, which may not be intended to limit the scope of the present disclosure.

It will be understood that the terms "system," "device," "unit," and/or "module" used herein are one method to distinguish different components, elements, parts, sections, or assemblies of different levels. However, the terms may be displaced by another expression if they achieve the same purpose.

As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

The flowcharts used in the present disclosure illustrate operations that systems implement according to some embodiments in the present disclosure. It is to be expressly understood, the operations of the flowchart may be implemented not in order. Conversely, the operations may be implemented in inverted order, or simultaneously. Moreover, one or more other operations may be added to the flowcharts. One or more operations may be removed from the flowcharts.

FIG. 1 is a schematic diagram illustrating an exemplary crystal preparation device according to some embodiments of the present disclosure.

The crystal preparation device 100 may be configured to prepare crystals. In some embodiments, the crystal preparation device 100 may prepare crystals based on physical vapor transport (PVT). A seed crystal may be bonded to a top portion of a growth chamber of the crystal preparation device 100, a source material may be placed at a bottom portion of the growth chamber, and a heating element (e.g., an induction coil) may be disposed outside the growth chamber for heating the growth chamber. During a crystal growth, an axial temperature gradient between the source material and the seed crystal may be formed by controlling a temperature field distribution in the growth chamber. The source material may be decomposed and sublimated into vapor components under a high-temperature condition. The vapor components may be transported to the seed crystal in a low-temperature region driven by the axial temperature gradient. Since a temperature of a region where the seed crystal is located is relatively low, a crystal may be generated on a surface of the seed crystal based on the vapor components. In some embodiments, the crystal may include a silicon carbide crystal, an aluminum nitride crystal, a zinc oxide crystal, a zinc antimonide crystal, or the like, or any combination thereof.

As shown in FIG. 1, the crystal preparation device 100 may include a growth chamber 110 and a heating component 120. The heating component 120 may be configured to heat the growth chamber 110 and provide a temperature field required for the crystal growth to prepare the crystal.

The growth chamber 110 may be configured to provide a place for the crystal growth. In some embodiments, the growth chamber 110 may be configured to grow the seed crystal and then further grow the crystal based on the seed crystal. In some embodiments, the seed crystal and the source material may be placed inside the growth chamber 110. The crystal may be grown based on the seed crystal and the source material. In some embodiments, the growth chamber 110 may include a growth chamber cover 111 and a growth chamber body 112. In some embodiments, the growth chamber body 112 may be a container with a growth chamber bottom cover and without a growth chamber cover. In some embodiments, the growth chamber cover 111 may be located on a top portion of the growth chamber body 112 and may be used to seal a top opening of the growth chamber body 112. In some embodiments, the growth chamber 110 may include a crucible. The crucible may include a crucible cover and a crucible body. In some embodiments, a shape of the growth chamber body 112 may include a cylinder, a cuboid, a cube, etc. In some embodiments, a shape of the growth chamber cover 111 may include a circular disk, a rectangular disk, a square disk, etc. In some embodiments, the shape of the growth chamber cover 111 may be matched with the shape of the growth chamber body 112. In some embodiments, the shape of the growth chamber body 112 may be a cylindrical tank which includes a tank bottom and a tank sidewall, and a shape of the growth chamber cover 111 may be a circular disk. In some embodiments, the shape of the growth chamber body 112 may be a rectangular tank which includes a tank bottom and a tank sidewall, and the shape of the growth chamber cover 111 may be a rectangular disk or a square disk.

In some embodiments, a material of the growth chamber 110 may include but not limited to graphite. In some embodiments, the material of the growth chamber 110 may include graphite and silicon carbide. In some embodiments, a mass of the graphite may account for 40% to 90% of a mass of the growth chamber 110. In some embodiments, the mass of the graphite may account for 45% to 85% of the mass of the growth chamber 110. In some embodiments, the mass of the graphite may account for 50% to 80% of the mass of the growth chamber 110. In some embodiments, the mass of the graphite may account for 55% to 75% of the mass of the growth chamber 110. In some embodiments, the mass of the graphite may account for 60% to 70% of the mass of the growth chamber 110. In some embodiments, the graphite mass may account for 64 to 66% of the mass of the growth chamber 110. In some embodiments, a material of the growth chamber cover 111 and a material of growth chamber body 112 may be the same or different.

The heating component 120 may be configured to heat the growth chamber 110 and provide the temperature field required for the crystal growth to prepare the crystal. In some embodiments, under the action of the temperature field inside the growth chamber 110, the source material may be sublimated and decomposed to generate the vapor components. The vapor components may be transported to the seed crystal driven by the axial temperature gradient and may grow and crystallize on a surface of the seed crystal. In some embodiments, the heating component 120 may be located outside and/or inside the growth chamber 110. In some embodiments, the heating component 120 may include a resistance heating device, an electromagnetic induction heating device, or the like, or any combination thereof. As shown in FIG. 1, the heating component 120 may include an electromagnetic induction heating device disposed around the outside of the growth chamber 110. In some embodiments, the electromagnetic induction heating device may include an induction coil. The induction coil may generate eddy currents on a surface of the growth chamber 110 under the action of alternating currents of different frequencies. Under the action of the eddy currents, electrical energy generated on the surface of the growth chamber 110 may be converted into heat energy to heat the growth chamber 110. In some embodiments, the heating component 120 may include a resistance heating device. In some embodiments, the heating component 120 may include a graphite resistance heating device. After the graphite is energized, heat energy generated by the Joule effect of the current flowing through the graphite can be used to heat the growth chamber 110.

As shown in FIG. 1, a seed crystal 150 may be bonded to an inner side surface of the growth chamber cover 111 and a source material 160 may be placed in the growth chamber body 112. A dotted line a shown in FIG. 1 indicates a lower surface of the seed crystal 150 and a dotted line b shown in FIG. 1 indicates an upper surface of the source material 160. In some embodiments, a radial temperature difference may indicate a difference between a highest temperature and a lowest temperature on a horizontal section of the growth chamber 110 at a same height. Since the growth chamber 110 has a height, for horizontal cross-sections at different heights, differences between a highest temperature and a lowest temperature may be different. In some embodiments, for convenience, the radial temperature difference may refer to a difference between a highest temperature and a lowest temperature on a plane (a horizontal plane where the dashed line a in FIG. 1 is located) where the lower surface of the seed crystal is located. In some embodiments, the radial temperature difference may refer to a difference between a highest temperature and a lowest temperature on a plane (a horizontal plane where the dashed line b in FIG. 1 is located) where the upper surface of the source material is located. In some embodiments, the radial temperature difference may refer to a difference between a highest temperature and a lowest temperature on any horizontal plane between the plane where the upper surface of the source material 160 is located and the plane where the lower surface of the seed crystal 150 is located.

As shown in FIG. 1, the heating component 120 may include the electromagnetic induction heating device disposed around the outside of the growth chamber 110. The electromagnetic induction heating device may include an induction coil. When the induction coil is energized to heat the growth chamber 110, the heat energy may be conducted from a wall of the growth chamber 110 to the inside of the growth chamber 110. The heat energy may be conducted from a peripheral region of the growth chamber 110 to a central region of the growth chamber 110 inside growth chamber 110. Since there may be heat dissipation during heat conduction, the peripheral region inside the growth chamber 110 may be a relatively high-temperature region and the central region may be a relatively low-temperature region. In some embodiments, the peripheral region may be a region close to the wall of the growth chamber 110. The central region may be a region close to a central axis of the growth chamber 110. In some embodiments, a temperature field with a temperature decreasing from the peripheral region to the central region may be formed inside of the growth chamber 110. The temperature field may reflect a temperature distribution inside the growth chamber 110 in time and space. The temperature field with the temperature decreasing may form the radial temperature difference.

The radial temperature difference may cause a thermal stress on a growth surface of the seed crystal, resulting in that the growth surface of the seed crystal is convex in a direction of the source material and a defect (e.g., a microtubule, an inclusion) is generated. In some embodiments, the radial temperature difference may also cause a molar ratio of the vapor components of the sublimated source material to be un-uniformly distributed along a radial direction, thereby affecting the crystal quality. Therefore, to prepare high-quality crystals, it is necessary to reduce the radial temperature difference. In the present disclosure, unless otherwise specified, the temperature field, a thermal field, and a temperature distribution can be used interchangeably.

In some embodiments, a temperature control system may be configured to cause that the radial temperature difference in the growth chamber does not exceed a first preset range of a crystal growth temperature during the crystal growth. In some embodiments, the crystal growth temperature and/or the first preset range may be preset. In some embodiments, the crystal growth temperature and/or the first preset range may be dynamically determined based on a preset condition according to a certain algorithm. In some embodiments, the preset condition may include a size of the growth chamber 110, a shape of the growth chamber 110, a material of the growth chamber 110, a size of the seed crystal, a type of the crystal to be grown, a size of the crystal to be grown, etc. More descriptions regarding the temperature control system may be found elsewhere in the present disclosure (e.g., FIG. 2 and the descriptions thereof).

The radial temperature difference may cause the defect (e.g., the microtubule, the inclusion) during the crystal growth. Therefore, it is necessary to control the radial temperature difference during the crystal growth to obtain high-quality crystals. More descriptions regarding the control process may be found elsewhere in the present disclosure (e.g., FIG. 2 and the descriptions thereof). In some embodiments, the crystal growth temperature may refer to a Celsius temperature required for the crystal growth. Different types of crystals may correspond to different crystal growth temperatures. In some embodiments, the crystal growth temperature of a silicon carbide crystal may be within a range of 2200° C. to 2400° C. In some embodiments, the temperature control system may cause that the radial temperature difference in the growth chamber does not exceed 1% of the crystal growth temperature during the crystal growth. In some embodiments, the temperature control system may cause that the radial temperature difference in the growth chamber does not exceed 0.8% of the crystal growth temperature during the crystal growth. In some embodiments, the temperature control system may cause that the radial temperature difference in the growth chamber does not exceed 0.6% of the crystal growth temperature during the crystal growth. In some embodiments, the temperature control system may cause that the radial temperature difference in the growth chamber does not exceed 0.5% of the crystal growth temperature during the crystal growth. In some embodiments, the temperature control system may cause that the radial temperature difference in the growth chamber does not exceed 0.4% of the crystal growth temperature during the crystal growth. In some embodiments, the temperature control system may cause that the radial temperature difference in the growth chamber does not exceed 0.3% of the crystal growth temperature during the crystal growth. In some embodiments, the temperature control system may cause that the radial temperature difference in the growth chamber does not exceed 0.25% of the crystal growth temperature during the crystal growth. In some embodiments, the temperature control system may cause that the radial temperature difference in the growth chamber does not exceed 0.2% of the crystal growth temperature during the crystal growth. In some embodiments, the temperature control system may cause that the radial temperature difference in the growth chamber does not exceed 0.15% of the crystal growth temperature during the crystal growth. In some embodiments, the temperature control system may cause that the radial temperature difference in the growth chamber does not exceed 0.1% of the crystal growth temperature during the crystal growth. In some embodiments, the temperature control system may cause that the radial temperature difference in the growth chamber does not exceed 0.08% of the crystal growth temperature during the crystal growth. In some embodiments, the temperature control system may cause that the radial temperature difference in the growth chamber does not exceed 0.06% of the crystal growth temperature during the crystal growth. In some embodiments, the temperature control system may cause that the radial temperature difference in the growth chamber does not exceed 0.05% of the crystal growth temperature during the crystal growth. In some embodiments, the temperature control system may cause that the radial temperature difference in the growth chamber does not exceed 0.02% of the crystal growth temperature during the crystal growth.

In some embodiments, the temperature control system may cause that the radial temperature difference in the growth chamber does not exceed a preset radial temperature difference threshold during the crystal growth. In some embodiments, the preset radial temperature difference threshold may be within a range of 0.5° C. to 6° C. In some embodiments, the preset radial temperature difference threshold may be within a range of 0.6° C. to 5.7° C. In some embodiments, the preset radial temperature difference threshold may be within a range of 0.7° C. to 5.4° C. In some embodiments, the preset radial temperature difference threshold may be within a range of 0.8° C. to 5° C. In some embodiments, the preset radial temperature difference threshold may be within a range of 0.9° C. to 4.7° C. In some embodiments, the preset radial temperature difference threshold may be within a range of 1° C. to 4.4° C. In some embodiments, the preset radial temperature difference threshold may be within a range of 1.1° C. to 4° C. In some embodiments, the preset radial temperature difference threshold may be within a range of 1.2° C. to 3.5° C. In some embodiments, the preset radial temperature difference threshold may be within a range of 1.3° C. to 3° C. In some embodiments, the preset radial temperature difference threshold may be within a range of 1.4° C. to 2.5° C. In some embodiments, the preset radial temperature difference threshold may be within a range of 1.5° C. to 2° C. In some embodiments, the preset radial temperature difference threshold may be within a range of 1.6° C. to 1.9° C. In some embodiments, the preset radial temperature difference threshold may be within a range of 1.7° C. to 1.8° C.

It takes a preset time for the crystal to grow to a preset size. Therefore, during the crystal growth, it is necessary to control that the radial temperature difference in the growth chamber does not exceed the first preset range of crystal growth temperature or the preset radial temperature difference threshold within a certain time domain. Since the crystal grows along a specific crystal plane during the crystal growth, once the crystal grown in a certain period has a defect, the defect may continue to accumulate and expand in subsequent stages of the crystal growth, and eventually resulting in a low-quality crystal or even an unusable crystal. Therefore, it is necessary to control that the radial temperature difference in the growth chamber during the crystal growth is within the first preset range of crystal growth temperature or the preset radial temperature difference threshold during an early stage of the crystal growth.

In some embodiments, the temperature control system may cause that the radial temperature difference in the growth chamber does not exceed the first preset range of crystal growth temperature or the preset radial temperature difference threshold at least during a crystal growth sub-interval of the crystal growth. In some embodiments, the crystal growth sub-interval may include a time period in an early period of a crystal growth interval. In some embodiments, if the crystal growth interval is from 4:00 am to 24:00 pm, the crystal growth sub-interval may be a first 90% time period of the crystal growth interval, which can be expressed as a sub-interval from 4:00 am to 10:00 μm. In some embodiments, the crystal growth interval may refer to a minimum time required for the crystal to grow to the preset size. In some embodiments, the crystal growth interval may be determined according to a preset condition. In some embodiments, the preset condition may include the size of the growth chamber 110, the shape of the growth chamber 110, the material of the growth chamber 110, the size of the seed crystal, the type of the crystal to be grown, the size of the crystal to be grown, etc.

In some embodiments, the crystal growth sub-interval may be a first 80% time period of the crystal growth interval. In some embodiments, the crystal growth sub-interval may be a first 85% time period of the crystal growth interval. In some embodiments, the crystal growth sub-interval may be a first 90% time period of the crystal growth interval. In some embodiments, the crystal growth sub-interval may be a first 95% time period of the crystal growth interval. In some embodiments, the temperature control system may cause that the radial temperature difference in the growth chamber does not exceed the first preset range of the crystal growth temperature or the preset radial temperature difference threshold during the whole crystal growth interval.

In some embodiments, the radial temperature difference may be related to a radius of the growth chamber. As shown in FIG. 1, the larger the radius of the growth chamber 110 is, the more dissipated heat energy may be during the heat conduction from the wall of the growth chamber 110 to the inside of the growth chamber 110, which may lead to a larger radial temperature difference. In some embodiments, the radial temperature difference may not exceed the first preset range of the crystal growth temperature or the preset radial temperature difference threshold when crystals are grown in growth chambers 110 with different radii.

In some embodiments, when the radius of the growth chamber is not more than 5 centimeters, the temperature control system may cause that the radial temperature difference in the growth chamber does not exceed 0.075% of the crystal growth temperature or the preset radial temperature difference threshold during the crystal growth. In some embodiments, the preset radial temperature difference threshold may be within a range of 0.5° C. to 1.5° C. In some embodiments, the preset radial temperature difference threshold may be within a range of 0.6° C. to 1.4° C. In some embodiments, the preset radial temperature difference threshold may be within a range of 0.7° C. to 1.3° C. In some embodiments, the preset radial temperature difference threshold may be within a range of 0.8° C. to 1.2° C. In some embodiments, the preset radial temperature difference threshold may be within a range of 0.9° C. to 1.1° C.

In some embodiments, when the radius of the growth chamber exceeds 5 centimeters and does not exceed 8 centimeters, the temperature control system may cause that the radial temperature difference does not exceed 0.15% of the crystal growth temperature or the preset radial temperature difference threshold during the crystal growth. In some embodiments, the preset radial temperature difference threshold may be within a range of 0.8° C. to 2.8° C. In some embodiments, the preset radial temperature difference threshold may be within a range of 0.9° C. to 2.7° C. In some embodiments, the preset radial temperature difference threshold may be within a range of 1° C. to 2.6° C. In some embodiments, the preset radial temperature difference threshold may be within a range of 1.1° C. to 2.5° C. In some embodiments, the preset radial temperature difference threshold may be within a range of 1.2° C. to 2.4° C. In some embodiments, the preset radial temperature difference threshold may be within a range of 1.3° C. to 2.3° C. In some embodiments, the preset radial temperature difference threshold may be within a range of 1.4° C. to 2.2° C. In some embodiments, the preset radial temperature difference threshold may be within a range of 1.5° C. to 2.1° C. In some embodiments, the preset radial temperature difference threshold may be within a range of 1.6° C. to 2° C. In some embodiments, the preset radial temperature difference threshold may be within a range of 1.7° C. to 1.9° C.

In some embodiments, when the radius of the growth chamber exceeds 8 centimeters and does not exceed 10 centimeters, the temperature control system may cause that the radial temperature difference does not exceed 0.2% of the crystal growth temperature or the preset radial temperature difference threshold during the crystal growth. In some embodiments, the preset radial temperature difference threshold may be within a range of 1.5° C. to 4.5° C. In some embodiments, the preset radial temperature difference threshold may be within a range of 1.7° C. to 4.3° C. In some embodiments, the preset radial temperature difference threshold may be within a range of 1.9° C. to 4.1° C. In some embodiments, the preset radial temperature difference threshold may be within a range of 2.1° C. to 3.9° C. In some embodiments, the preset radial temperature difference threshold may be within a range of 2.3° C. to 3.7° C. In some embodiments, the preset radial temperature difference threshold may be within a range of 2.5° C. to 3.5° C. In some embodiments, the preset radial temperature difference threshold may be within a range of 2.7° C. to 3.3° C. In some embodiments, the preset radial temperature difference threshold may be within a range of 2.9° C. to 3.1° C. In some embodiments, the preset radial temperature difference threshold may be 3° C.

In some embodiments, when the radius of the growth chamber exceeds 10 centimeters, the temperature control system may cause that the radial temperature difference does not exceed 0.3% of the crystal growth temperature or the preset radial temperature difference threshold during the crystal growth. In some embodiments, the preset radial temperature difference threshold may be within a range of 1.5° C. to 6° C. In some embodiments, the preset radial temperature difference threshold may be within a range of 1.7° C. to 5.8° C. In some embodiments, the preset radial temperature difference threshold may be within a range of 1.9° C. to 5.6° C. In some embodiments, the preset radial temperature difference threshold may be within a range of 2.1° C. to 5.4° C. In some embodiments, the preset radial temperature difference threshold may be within a range of 2.3° C. to 5.2° C. In some embodiments, the preset radial temperature difference threshold may be within a range of 2.5° C. to 5° C. In some embodiments, the preset radial temperature difference threshold may be within a range of 2.7° C. to 4.8° C. In some embodiments, the preset radial temperature difference threshold may be within a range of 2.9° C. to 4.6° C. In some embodiments, the preset radial temperature difference threshold may be within a range of 3.1° C. to 4.4° C. In some embodiments, the preset radial temperature difference threshold may be within a range of 3.3° C. to 4.2° C. In some embodiments, the preset radial temperature difference threshold may be within a range of 3.5° C. to 4° C. In some embodiments, the preset radial temperature difference threshold may be within a range of 3.7° C. to 3.8° C.

In some embodiments, a radial temperature gradient may include a temperature difference per unit distance along a direction from an inner wall of the growth chamber to the central axis of the growth chamber on a horizontal section at a same height of the growth chamber 110. In some embodiments, the radial temperature gradient may be formed based on the temperature decreasing along the direction from the inner wall of the growth chamber to the central axis of the growth chamber. The radial temperature gradient may cause a thermal stress on the growth surface of the seed crystal, which causes that the growth surface of the seed crystal is convex in the direction of the source material and the defect (e.g., the microtubule, the inclusion) is generated. In some embodiments, the radial temperature gradient may also cause a non-uniform distribution of the molar ratio of the sublimated vapor components of the source material along the radial direction, thereby affecting the crystal quality. Therefore, to prepare high-quality crystals, it is necessary to reduce the radial temperature gradient.

In some embodiments, the temperature control system may cause that the radial temperature gradient in the growth chamber does not exceed a preset radial temperature gradient threshold during the crystal growth. In some embodiments, the preset radial temperature gradient threshold may be preset. In some embodiments, the preset radial temperature gradient threshold may be determined according to a preset condition. In some embodiments, the preset condition may include the size of the growth chamber 110, the shape of the growth chamber 110, the material of the growth chamber 110, the size of the seed crystal, the type of the crystal to be grown, the size of the crystal to be grown, etc.

In some embodiments, the preset radial temperature gradient threshold may be within a range of 0.1° C./cm to 0.5° C./cm. In some embodiments, the preset radial temperature gradient threshold may be within a range of 0.11° C./cm to 0.49° C./cm. In some embodiments, the preset radial temperature gradient threshold may be within a range of 0.12° C./cm to 0.48° C./cm. In some embodiments, the preset radial temperature gradient threshold may be within a range of 0.13° C./cm to 0.47° C./cm. In some embodiments, the preset radial temperature gradient threshold may be within a range of 0.14° C./cm to 0.46° C./cm. In some embodiments, the preset radial temperature gradient threshold may be within a range of 0.15° C./cm to 0.45° C./cm. In some embodiments, the preset radial temperature gradient threshold may be within a range of 0.16° C./cm to 0.44° C./cm. In some embodiments, the preset radial temperature gradient threshold may be within a range of 0.17° C./cm to 0.43° C./cm. In some embodiments, the preset radial temperature gradient threshold may be within a range of 0.18° C./cm to 0.42° C./cm. In some embodiments, the preset radial temperature gradient threshold may be within a range of 0.19°

C./cm to 0.41° C./cm. In some embodiments, the preset radial temperature gradient threshold may be within a range of 0.2° C./cm to 0.4° C./cm. In some embodiments, the preset radial temperature gradient threshold may be within a range of 0.21° C./cm to 0.39° C./cm. In some embodiments, the preset radial temperature gradient threshold may be within a range of 0.22° C./cm to 0.38° C./cm. In some embodiments, the preset radial temperature gradient threshold may be within a range of 0.23° C./cm to 0.37° C./cm. In some embodiments, the preset radial temperature gradient threshold may be within a range of 0.24° C./cm to 0.36° C./cm. In some embodiments, the preset radial temperature gradient threshold may be within a range of 0.25° C./cm to 0.35° C./cm. In some embodiments, the preset radial temperature gradient threshold may be within a range of 0.26° C./cm to 0.34° C./cm. In some embodiments, the preset radial temperature gradient threshold may be within a range of 0.27° C./cm to 0.33° C./cm. In some embodiments, the preset radial temperature gradient threshold may be within a range of 0.28° C./cm to 0.32° C./cm. In some embodiments, the preset radial temperature gradient threshold may be within a range of 0.29° C./cm to 0.31° C./cm. In some embodiments, the preset radial temperature gradient threshold may be 0.3° C./cm.

In some embodiments, the radial temperature gradient may be related to the radius of the growth chamber. As shown in FIG. 1, the larger the radius of the growth chamber 110 is, the more dissipated the heat energy may be during the heat conduction from the wall of the growth chamber 110 to the inside of the growth chamber 110. The less heat is conducted to the central region of the growth chamber 110, the lower the temperature in the central region of the growth chamber 110 may be. In some embodiments, the temperature in the central region of the growth chamber 110 may be relatively low, which may cause a large thermal stress on the growth surface of the seed crystal. Therefore, the growth surface of the seed crystal may be severely convex in the direction of the source material, and the defect (e.g., the microtubule, the inclusion, etc.) may be generated. In some embodiments, the radial temperature gradient may also cause the non-uniform distribution of the molar ratio of the sublimated vapor components of the source material along the radial direction, thereby affecting the crystal quality. In some embodiments, the radial temperature difference may not exceed the first preset range of the crystal growth temperature or the preset radial temperature difference threshold when crystals are grown in growth chambers 110 with different radii.

In some embodiments, when the radius of the growth chamber does not exceed 5 centimeters, the temperature control system may cause that the radial temperature gradient in the growth chamber does not exceed the preset radial temperature gradient threshold during the crystal growth. In some embodiments, the preset radial temperature gradient threshold may be within a range of 0.1° C./cm to 0.3° C./cm. In some embodiments, the preset radial temperature gradient threshold may be within a range of 0.11° C./cm to 0.29° C./cm. In some embodiments, the preset radial temperature gradient threshold may be within a range of 0.12° C./cm to 0.28° C./cm. In some embodiments, the preset radial temperature gradient threshold may be within a range of 0.13° C./cm to 0.27° C./cm. In some embodiments, the preset radial temperature gradient threshold may be within a range of 0.14° C./cm to 0.26° C./cm. In some embodiments, the preset radial temperature gradient threshold may be within a range of 0.15° C./cm to 0.25° C./cm. In some embodiments, the preset radial temperature gradient threshold may be within a range of 0.16° C./cm to 0.24° C./cm. In some embodiments, the preset radial temperature gradient threshold may be within a range of 0.17° C./cm to 0.23° C./cm. In some embodiments, the preset radial temperature gradient threshold may be within a range of 0.18° C./cm to 0.22° C./cm. In some embodiments, the preset radial temperature gradient threshold may be within a range of 0.19° C./cm to 0.21° C./cm. In some embodiments, the preset radial temperature gradient threshold may be 0.2° C./cm.

In some embodiments, when the radius of the growth chamber exceeds 5 centimeters and does not exceed 8 centimeters, the temperature control system may cause that the radial temperature gradient in the growth chamber does not exceed the preset radial temperature gradient threshold during the crystal growth. In some embodiments, the preset radial temperature gradient threshold may be within a range of 0.1° C./cm to 0.37° C./cm. In some embodiments, the preset radial temperature gradient threshold may be within a range of 0.11° C./cm to 0.36° C./cm. In some embodiments, the preset radial temperature gradient threshold may be within a range of 0.12° C./cm to 0.35° C./cm. In some embodiments, the preset radial temperature gradient threshold may be within a range of 0.13° C./cm to 0.34° C./cm. In some embodiments, the preset radial temperature gradient threshold may be within a range of 0.14° C./cm to 0.33° C./cm. In some embodiments, the preset radial temperature gradient threshold may be within a range of 0.15° C./cm to 0.32° C./cm. In some embodiments, the preset radial temperature gradient threshold may be within a range of 0.16° C./cm to 0.31° C./cm. In some embodiments, the preset radial temperature gradient threshold may be within a range of 0.17° C./cm to 0.3° C./cm. In some embodiments, the preset radial temperature gradient threshold may be within a range of 0.18° C./cm to 0.29° C./cm. In some embodiments, the preset radial temperature gradient threshold may be within a range of 0.19° C./cm to 0.28° C./cm. In some embodiments, the preset radial temperature gradient threshold may be within a range of 0.2° C./cm to 0.27° C./cm. In some embodiments, the preset radial temperature gradient threshold may be within a range of 0.21° C./cm to 0.26° C./cm. In some embodiments, the preset radial temperature gradient threshold may be within a range of 0.22° C./cm to 0.25° C./cm. In some embodiments, the preset radial temperature gradient threshold may be within a range of 0.23° C./cm to 0.24° C./cm.

In some embodiments, when the radius of the growth chamber exceeds 8 centimeters and does not exceed 10 centimeters, the temperature control system may cause that the radial temperature gradient in the growth chamber does not exceed the preset radial temperature gradient threshold during the crystal growth. In some embodiments, the preset radial temperature gradient threshold may be within a range of 0.15° C./cm to 0.45° C./cm. In some embodiments, the preset radial temperature gradient threshold may be within a range of 0.16° C./cm to 0.44° C./cm. In some embodiments, the preset radial temperature gradient threshold may be within a range of 0.17° C./cm to 0.43° C./cm. In some embodiments, the preset radial temperature gradient threshold may be within a range of 0.18° C./cm to 0.42° C./cm. In some embodiments, the preset radial temperature gradient threshold may be within a range of 0.19° C./cm to 0.41° C./cm. In some embodiments, the preset radial temperature gradient threshold may be within a range of 0.2° C./cm to 0.4° C./cm. In some embodiments, the preset radial temperature gradient threshold may be within a range of 0.21° C./cm to 0.39° C./cm. In some embodiments, the preset radial temperature gradient threshold may be v range of 0.22° C./cm to 0.38° C./cm. In some embodiments, the preset radial temperature gradient threshold may be within a range of 0.23° C./cm to 0.37° C./cm. In some embodiments, the preset radial temperature gradient threshold may be within a range of 0.24° C./cm to 0.36° C./cm. In some embodiments, the preset radial temperature gradient threshold may be within a range of 0.25° C./cm to 0.35° C./cm. In some embodiments, the preset radial temperature gradient threshold may be within a range of 0.26° C./cm to 0.34° C./cm. In some embodiments, the preset radial temperature gradient threshold may be within a range of 0.27° C./cm to 0.33° C./cm. In some embodiments, the preset radial temperature gradient threshold may be within a range of 0.28° C./cm to 0.32° C./cm. In some embodiments, the preset radial temperature gradient threshold may be within a range of 0.29° C./cm to 0.31° C./cm. In some embodiments, the preset radial temperature gradient threshold may be 0.3° C./cm.

In some embodiments, when the radius of the growth chamber exceeds 10 centimeters, the temperature control system may cause that the radial temperature gradient in the growth chamber does not exceed the preset radial temperature gradient threshold during the crystal growth. In some embodiments, the preset radial temperature gradient threshold may be within a range of 0.15° C./cm to 0.6° C./cm. In some embodiments, the preset radial temperature gradient threshold may be within a range of 0.17° C./cm to 0.58° C./cm. In some embodiments, the preset radial temperature gradient threshold may be within a range of 0.19° C./cm to 0.56° C./cm. In some embodiments, the preset radial temperature gradient threshold may be within a range of 0.21° C./cm to 0.54° C./cm. In some embodiments, the preset radial temperature gradient threshold may be within a range of 0.23° C./cm to 0.52° C./cm. In some embodiments, the preset radial temperature gradient threshold may be within a range of 0.25° C./cm to 0.5° C./cm. In some embodiments, the preset radial temperature gradient threshold may be within a range of 0.27° C./cm to 0.48° C./cm. In some embodiments, the preset radial temperature gradient threshold may be within a range of 0.29° C./cm to 0.46° C./cm. In some embodiments, the preset radial temperature gradient threshold may be within a range of 0.31° C./cm to 0.44° C./cm. In some embodiments, the preset radial temperature gradient threshold may be within a range of 0.33° C./cm to 0.42° C./cm. In some embodiments, the preset radial temperature gradient threshold may be within a range of 0.35° C./cm to 0.4° C./cm. In some embodiments, the preset radial temperature gradient threshold may be within a range of 0.37° C./cm to 0.38° C./cm.

As shown in FIG. 1, a distance between the lower surface of the seed crystal 150 and the upper surface of the source material 160 may be represented as H centimeters. In some embodiments, the axial temperature gradient may refer to a temperature difference per unit distance along a direction of the central axis of the growth chamber 110. If there is no radial temperature difference in the plane where the upper surface of the source material 160 is located or the radial temperature difference is small and negligible, a temperature of the plane where the upper surface of the source material 160 is located may be represented as a ° C. If there is no radial temperature difference in the plane where the lower surface of the seed crystal 150 is located or the radial temperature difference is small and negligible, a temperature of the plane where the lower surface of the seed crystal 150 is located may be represented as b ° C. a may be larger than b. The axial temperature gradient may be represented as (a−b)/H, and a unit of the axial temperature gradient may be represented as ° C./cm.

The axial temperature gradient is a driving force for transmitting the vapor components generated by decomposing and sublimating the source material to the surface of the seed crystal for the crystal growth. If the axial temperature gradient is unstable, the vapor components may be un-uniformly distributed along the axial direction, which may result in poor quality of the grown crystal. Therefore, it is necessary to maintain a stable axial temperature gradient to grow high-quality crystals. In some embodiments, the heating element may also be configured to maintain the axial temperature gradient stable during the crystal growth.

In some embodiments, the axial temperature gradient may be controlled in a preset axial temperature gradient range to ensure the crystal quality. If the axial temperature gradient is too small, the driving force may be insufficient and a deposition rate of the vapor components on the lower surface of the seed crystal may be slow, which can't meet requirements of physical vapor transport (PVT) for mass transmission. If the axial temperature gradient is too large and the mass transmission is too fast, the deposition rate of the vapor components on the lower surface of the seed crystal may be too fast, which may result in a large stress on the growth surface of the crystal, defects (e.g., the inclusion), and other dislocation defects, and further affect crystal quality. Therefore, it is necessary to maintain the axial temperature gradient in a suitable preset axial temperature gradient range.

In some embodiments, the temperature control system may cause that the axial temperature gradient in the growth chamber is maintained in the preset axial temperature gradient range during the crystal growth. In some embodiments, the preset axial temperature gradient range may be within a range of 0.2° C./cm to 2.5° C./cm. In some embodiments, the preset axial temperature gradient range may be within a range of 0.3° C./cm to 2.4° C./cm. In some embodiments, the preset axial temperature gradient range may be within a range of 0.4° C./cm to 2.3° C./cm. In some embodiments, the preset axial temperature gradient range may be within a range of 0.5° C./cm to 2.2° C./cm. In some embodiments, the preset axial temperature gradient range may be within a range of 0.6° C./cm to 2.1° C./cm. In some embodiments, the preset axial temperature gradient range may be within a range of 0.7° C./cm to 2.0° C./cm. In some embodiments, the preset axial temperature gradient range may be within a range of 0.8° C./cm to 1.9° C./cm. In some embodiments, the preset axial temperature gradient range may be within a range of 0.9° C./cm to 1.8° C./cm. In some embodiments, the preset axial temperature gradient range may be within a range of 1.0° C./cm to 1.7° C./cm. In some embodiments, the preset axial temperature gradient range may be within a range of 1.1° C./cm to 1.6° C./cm. In some embodiments, the preset axial temperature gradient range may be within a range of 1.2° C./cm to 1.5° C./cm. In some embodiments, the preset axial temperature gradient range may be within a range of 1.3° C./cm to 1.4° C./cm.

In some embodiments, the heating component may include at least one heating unit. In some embodiments, a count of the at least one heating unit may include 1, 2, 3, etc. In some embodiments, the at least one heating unit may be located outside the growth chamber. In some embodiments, the at least one heating unit may be partially disposed around the periphery of the growth chamber. In some embodiments, at least one heating unit of at least two heating units may be disposed around the periphery of the growth chamber, and at least one heating unit of the at least two heating units may be located on an upper surface and/or a lower surface of the outside of the growth chamber. In some embodiments, the at least one heating unit may be located inside the growth chamber. In some embodiments, at least one heating unit of at least two heating units may be located inside the growth chamber, and at least one heating unit of the at least two heating units may be disposed around the periphery of the growth chamber. In some embodiments, at least one heating unit of the at least two heating units may be located inside the growth chamber, and at least one heating unit of the at least two heating units may be located on the upper surface and/or the lower surface of the outside of the growth chamber. In some embodiments, the at least one heating unit located outside the growth chamber may include at least three first heating units. The at least three first heating units may correspond to positions of a crystallization region in the growth chamber, a source material region in the growth chamber, and a vapor transport region between the crystallization region and the source material region, respectively.

In some embodiments, the at least one heating unit may include a resistance heating device, an electromagnetic induction heating device, etc. In some embodiments, the at least one heating unit may include a resistance heating element and/or an electromagnetic induction coil. In some embodiments, a material of the at least one heating unit may include graphite, tungsten, platinum, molybdenum, tantalum, iridium, or the like, or any combination thereof. In some embodiments, the at least one heating unit may include a resistance heating element. The resistance heating element may include a graphite heating element, a tungsten heating element, a platinum heating element, a molybdenum heating element, a tantalum heating element, an iridium heating element, a zirconium diboride composite ceramic heating element, or the like, or any combination thereof.

It should be noted that the above description of the crystal preparation device 100 is merely provided for illustration, and not intended to limit the scope of the present disclosure. For persons having ordinary skills in the art, multiple variations and modifications may be made to the crystal preparation device 100 under the teachings of the present disclosure. However, those variations and modifications do not depart from the scope of the present disclosure.

Figure 2:
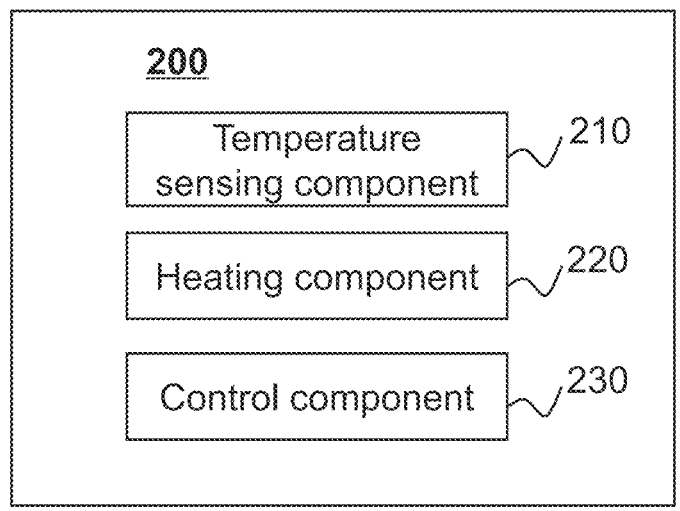
FIG. 2 is a schematic diagram illustrating an exemplary temperature feedback adjustment system according to some embodiments of the present disclosure.

FIG. 2 is a schematic diagram illustrating an exemplary temperature feedback adjustment system according to some embodiments of the present disclosure.

In some embodiments, a crystal preparation device may include a temperature feedback adjustment system 200. As shown in FIG. 2, the temperature feedback adjustment system 200 may include a temperature sensing component 210, a heating component 220, and a control component 230. In the present disclosure, the temperature feedback adjustment system and the temperature control system can be used interchangeably unless otherwise specified. In the present disclosure, the heating component 120 and the heating component 220 may represent a same component.

In some embodiments, the temperature sensing component 210 may include at least one temperature sensing unit. In some embodiments, the at least one temperature sensing unit may be located at a periphery of a growth chamber (e.g., the growth chamber 110). In some embodiments, the at least one temperature sensing unit may be configured to measure a temperature of the growth chamber to obtain a temperature distribution during the crystal growth, and transmit the measured temperature to the control component 230. In some embodiments, the temperature distribution may include a radial temperature distribution, an axial temperature distribution, etc. In some embodiments, the radial temperature distribution may include a temperature distribution of at least one horizontal cross section of the growth chamber 110. In some embodiments, the axial temperature distribution may include a temperature distribution of a central axis of the growth chamber 110, a temperature distribution in a direction parallel to the central axis, etc. In some embodiments, the radial temperature distribution may include a radial temperature difference distribution and/or a radial temperature gradient distribution. In some embodiments, the axial temperature distribution may include an axial temperature gradient distribution.

In some embodiments, a count of the at least one temperature sensing unit may include 1, 2, 3, etc. In some embodiments, the at least one temperature sensing unit may include at least one temperature sensor. In some embodiments, the at least one temperature sensing unit may include at least one infrared thermometer.

In some embodiments, the at least one temperature sensing unit may be located on an upper surface of an outside of the growth chamber for measuring a temperature of a lower surface of a seed crystal or a crystal growth surface. In some embodiments, the at least one temperature sensing unit may be located on a lower surface of the outside of the growth chamber for measuring a temperature of an upper surface of a source material. In some embodiments, the at least one temperature sensing unit may also be located on an outer wall of the growth chamber for measuring a temperature of a peripheral region in the growth chamber.

In some embodiments, the at least one temperature sensing unit may be disposed in a circle with a center of a growth chamber cover (e.g., the growth chamber cover 111) or a growth chamber bottom cover as a center, accordingly, temperature at iso-diameter positions of the growth chamber can be measured. In some embodiments, the at least one temperature sensing unit may be disposed on the outer wall of the growth chamber in parallel with the central axis of the growth chamber, accordingly, an axial temperature of the growth chamber can be measured. In some embodiments, the at least one temperature sensing unit may also be disposed in other shapes such as a square, a rectangle, etc.

In some embodiments, information of the temperature sensing component 210 may include an arrangement of the at least one temperature sensing unit, the count of the at least one temperature sensing unit, the position(s) of the at least one temperature sensing unit, the temperature(s) measured by the at least one temperature sensing, or the like, or any combination thereof.

In some embodiments, the control component 230 may include at least one control unit. In some embodiments, each of the at least one control unit may be connected to each of the at least one heating unit to separately control at least one parameter of the each heating unit, to make a temperature distribution satisfy a preset temperature distribution during the crystal growth. In some embodiments, the at least one parameter may include a current, a heating power, or the like, or any combination thereof. In some embodiments, the preset temperature distribution may include a preset radial temperature difference distribution, a preset radial temperature gradient distribution, a preset axial temperature gradient distribution, or the like, or any combination thereof.

In some embodiments, the control component 230 may generate the radial temperature difference distribution and/or the radial temperature gradient distribution based on the radial temperature(s) measured by the temperature sensing component 210. In some embodiments, the control component 230 may generate the axial temperature gradient distribution based on the axial temperature(s) measured by the temperature sensing component 210.

In some embodiments, the control component 230 may control the at least one parameter of the at least one heating unit based on the temperature distribution during the crystal growth, so that the radial temperature difference in the growth chamber does not exceed a first preset range of an average temperature in the growth chamber or the preset radial temperature difference threshold during the crystal growth. In some embodiments, the control component 230 may be configured to control the at least one parameter of the at least one heating unit based on the temperature distribution during the crystal growth, so that the radial temperature gradient in the growth chamber does not exceed the preset radial temperature gradient during the crystal growth. In some embodiments, the temperature sensing component 210 may measure the radial temperatures of the growth chamber and transmit the measured radial temperatures to the control component 230. The control component 230 may generate the radial temperature difference distribution and/or the radial temperature gradient distribution based on the radial temperatures measured by the temperature sensing component 210. The control component 230 may also be configured to determine the preset radial temperature difference threshold and/or the preset radial temperature gradient threshold based on a size of the growth chamber 110, a shape of the growth chamber 110, a material of the growth chamber 110, a size of the seed crystal, a type of a crystal to be grown, a size of the crystal to be grown, etc. The control component 230 may further compare the radial temperature difference in the radial temperature difference distribution with the preset radial temperature difference threshold, or compare the radial temperature gradient in the radial temperature gradient distribution with the preset radial temperature gradient. If the radial temperature difference is larger than the preset radial temperature difference threshold, or the radial temperature gradient is larger than the preset radial temperature gradient threshold, the control component 230 may improve the heating power of the at least one heating unit disposed in the central region of the growth chamber to reduce the radial temperature difference and/or the radial temperature gradient until the radial temperature difference does not exceed the preset radial temperature difference threshold and/or the radial temperature gradient does not exceed the preset radial temperature gradient threshold.

In some embodiments, the control component 230 may also control the at least one parameter of the at least one heating unit based on the temperature distribution during the crystal growth, so that the axial temperature gradient in the growth chamber is stable during the crystal growth. In some embodiments, the control component 230 may also control the at least one parameter of the at least one heating unit based on the temperature distribution during the crystal growth, so that the axial temperature gradient in the growth chamber is maintained in a preset axial temperature gradient range during the crystal growth. In some embodiments, the temperature sensing component 210 may measure the axial temperatures of the growth chamber and transmit the measured axial temperatures to the control component 230. The control component 230 may generate the axial temperature gradient distribution based on the axial temperatures measured by the temperature sensing component 210. The control component 230 may also be configured to determine the preset axial temperature gradient range based on the size of the growth chamber 110, the shape of the growth chamber 110, the material of the growth chamber 110, the size of the seed crystal, the type of the crystal to be grown, the size of the crystal to be grown, etc. The control component 230 may further compare the axial temperature gradient in the axial temperature gradient distribution with the preset axial temperature gradient range. If the axial temperature gradient is less than the preset axial temperature gradient range, the control component 230 may decrease the heating power of the at least one heating unit disposed at the periphery of the growth chamber close to the growth chamber cover, or increase the heating power of the at least one heating unit disposed at the periphery of the growth chamber close to the growth chamber bottom cover, so as to improve the axial temperature gradient until the axial temperature gradient is in the preset axial temperature gradient range. If the axial temperature gradient is greater than the preset axial temperature gradient range, the control component 230 may increase the heating power of the at least one heating unit disposed at the periphery of the growth chamber close to the growth chamber cover, or decrease the heating power of the at least one heating unit disposed at the periphery of the growth chamber close to the growth chamber bottom cover, so as to reduce the axial temperature gradient until the axial temperature gradient is in the preset axial temperature gradient range.

In some embodiments, the preset radial temperature difference threshold, the preset radial temperature gradient threshold, and/or the preset axial temperature gradient range may be determined based on the size of the growth chamber 110, the shape of the growth chamber 110, the material of the growth chamber 110, the size of the seed crystal, the type of the crystal to be grown, the size of the crystal to be grown, etc. More descriptions regarding the preset radial temperature difference threshold, the preset radial temperature gradient threshold, and/or the preset axial temperature gradient range may be found elsewhere in the present disclosure (e.g., FIG. 1 and the descriptions thereof).

In some embodiments, the temperature feedback adjustment system 200 may also include a storage component (not shown). The storage component may store data, instructions, and/or any other information. In some embodiments, the storage component may store data and/or information involved in the crystal growth. In some embodiments, the storage component may store the crystal growth temperature, the crystal growth time period, the crystal growth interval, the preset temperature distribution, the preset radial temperature difference threshold, the preset radial temperature gradient threshold, the preset axial temperature gradient threshold, etc. In some embodiments, the storage component may store the type of the crystal, the size of the seed crystal, a size of a crystal to be grown, etc. In some embodiments, the storage component may store data and/or instructions used by the crystal preparation device 100 to execute or use to perform the exemplary method for crystal growth described in the embodiments of the present disclosure. For example, the storage component may store at least one parameter of the at least one heating unit which can be adjusted during crystal growth.

In some embodiments, the storage component may be connected to a network to communicate with one or more components (e.g., the temperature sensing component 210, the control component 230) of the temperature feedback adjustment system 200. The one or more components (e.g., the control component 230) of the feedback and adjustment system 200 may read the data or instructions in the storage component over the network.

In some embodiments, the storage component may include a large capacity memory, a removable memory, a volatile read/write memory, a read only memory (ROM), or the like, or any combination thereof. Exemplary large capacity storages may include a disk, a compact disc, a solid state drive, a mobile storage, or the like. Exemplary removable memories may include a flash drive, a floppy disk, an optical disc, a memory card, a ZIP disk, a tape, or the like. Exemplary volatile read-write memories may include a random access memory (RAM). The RAM may include a dynamic random memory (DRAM), a dual data rate synchronous dynamic random access memory (DDR-SDRAM), a static random access memory (SRAM), a thyristor random access memory (T-RAM), a zero capacitance random access memory (Z-RAM), or the like. The ROM may include a mask ROM (MROM), a programmable ROM (PROM), an erased programmable ROM (EPROM), an electrically erasable programmable ROM (EEPROM), a CD-ROM, a digital versatile disc, or the like. In some embodiments, the storage component may be implemented by a cloud platform described in the present disclosure. In some embodiments, the cloud platform may include a private cloud, a public cloud, a mixed cloud, a community cloud, a distributed cloud, an inter-cloud, a multi-cloud, or the like, or any combination thereof.

In some embodiments, the temperature feedback adjustment system 200 may also include a display component (not shown). In some embodiments, the display component may display a time of the crystal growth, a crystal size, the temperature distribution during the crystal growth, the at least one parameter of the at least one heating unit, or the like, or any combination thereof. In some embodiments, the at least one parameter may include the current, the heating power, etc.

It should be noted that the above description of the temperature feedback adjustment system 200 is merely provided for illustration, and not intended to limit the scope of the present disclosure. For those skilled in the art, after understanding the principle of the system, the components may be combined or a subsystem may be connected to other components without departing from the principle. For example, the control component 230 disclosed in FIG. 2 may be a component that implements two or more components. As another example, the control component 230 may include at least one control unit and at least one processing unit. Those variations and modifications do not depart from the scope of the present disclosure.

Figure 3:
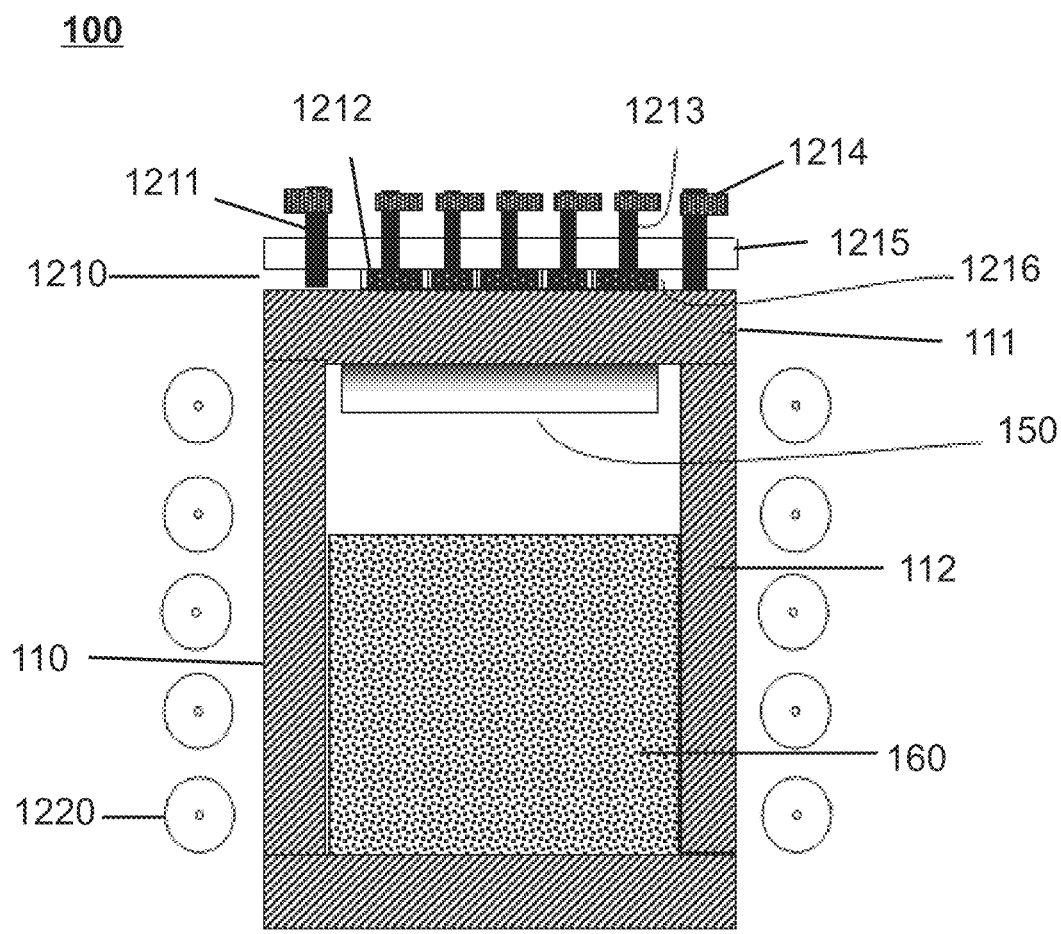
FIG. 3 is a schematic diagram illustrating an exemplary crystal preparation device according to some embodiments of the present disclosure.

FIG. 3 is a schematic diagram illustrating an exemplary crystal preparation device according to some embodiments of the present disclosure. In some embodiments, the crystal preparation device 100 may prepare a semiconductor crystal (e.g., a silicon carbide crystal, an aluminum nitride crystal, a zinc oxide crystal, a zinc antimony crystal) based on physical vapor transport (PVT). As shown in FIG. 3, the crystal preparation device 100 may include the growth chamber 110 and a heating component.

The growth chamber 110 may be configured to place the seed crystal 150 and the source material 160. In some embodiments, the growth chamber 110 may include the growth chamber cover 111 and the growth chamber body 112. The growth chamber cover 111 may be located at a top portion of the growth chamber 110 and may be used to seal a top opening of the growth chamber body 112. In some embodiments, the growth chamber 110 may include a crucible which includes a crucible cover and a crucible body. In some embodiments, a shape of the growth chamber body 112 may include a cylinder, a cuboid, a cube, etc. In some embodiments, the shape of the growth chamber body 112 may be a cylindrical tank which includes a tank bottom and a tank sidewall. In some embodiments, corresponding to the shape of the growth chamber body 112, a shape of the growth chamber cover 111 may include a circular disc, a rectangular disc, a square disk, etc. In some embodiments, a material of the growth chamber 110 may include graphite. In some embodiments, the material of the growth chamber 110 may be graphite in whole or in part.

In some embodiments, the seed crystal 150 may be fixedly bonded to an inner side surface (also referred to as a lower surface) (e.g., a center position of the inner side surface) of the growth chamber cover 111. The source material 160 may be placed in the growth chamber body 112 (e.g., a bottom portion of the growth chamber 110). In some embodiments, the seed crystal 150 may be fixed to the growth chamber cover 111 through an adhesion agent. The adhesion agent may include epoxy resin, a two-component mixed hardened glue (AB glue), phenolic resin, a sugar glue, etc. In some embodiments, the source material 160 may be in a powder form, a granular form, a block form, etc. During the crystal growth, an axial temperature gradient may be formed between the source material 160 and the seed crystal 150 by controlling a heating environment of the growth chamber 110. The source material 160 may be decomposed and sublimated into vapor components when heated. For example, if a silicon carbide crystal is to be prepared, the vapor components may include $Si_2C$, $SiC_2$, Si, etc. Under a driving action of the axial temperature gradient, the vapor components may be transmitted from a surface of the source material 160 to a surface of the seed crystal 150. Since a temperature at the seed crystal 150 is relatively low, the vapor components may be crystallized on the surface of the seed crystal 150 to generate the crystal.

The heating component may be configured to heat the growth chamber 110. In some embodiments, the heating component may include an electric heating device, an electromagnetic induction heating device, etc. In some embodiments, the heating component may include an induction coil. In some embodiments, the heating component may be located outside the growth chamber 110 for providing at least a portion of heat required for the crystal growth. Taking the induction coil as an example, the induction coil may generate eddy currents on a surface of the growth chamber 110 under the action of alternating currents of different frequencies. Under the action of the eddy currents, electrical energy generated on the surface of the growth chamber 110 may be converted into heat energy to heat the growth chamber 110. The heat energy may heat the surface of the growth chamber 110 and be conducted to an inside of the growth chamber 110. As described in connection with above, under an action of a temperature field of the growth chamber 110, the source material 160 may be sublimated and decomposed into the vapor components. The vapor components may be transported to the surface of the seed crystal 150 under the driving action of the axial temperature gradient and may be crystallized on the surface of the seed crystal 150 to generate the crystal.

In some embodiments, the heating component may be located outside the growth chamber 110. In some embodiments, the heating component may include at least two heating units. In some embodiments, at least one heating unit of the at least two heating units may be partially surrounded and arranged around a periphery of the growth chamber 110. In some embodiments, at least one heating unit of the at least two heating units may be located on an upper surface and/or a lower surface of the growth chamber 110. In some embodiments, the at least one heating unit located on the upper surface and/or the lower surface of the growth chamber 110 may be referred to as a temperature compensation component 1210. In some embodiments, a count of at least one heating unit in the temperature compensation component 1210 may include 1, 2, 3, 4, etc. In some embodiments, a shape of at least one heating unit in the temperature compensation component 1210 may include a regular column (e.g., a cylinder, a triangular prism, a quadrangular prism, a pentagonal prism, a hexagonal prism) or an irregular column. In some embodiments, the temperature compensation component 1210 may be arranged as a regular shape (e.g., a square, a rectangle, a circle, a ring) or an irregular shape. In some embodiments, the temperature compensation component 1210 may be arranged as a circle or a ring with a center of the upper surface and/or the lower surface of the growth chamber 110 as a center. In some embodiments, an arrangement of the temperature compensation component 1210 may be uniformly arranged or un-uniformly arranged. In some embodiments, when the temperature compensation component 1210 is arranged in a ring with the center of the upper surface and/or the lower surface of the growth chamber 110 as the center of the ring, radii of two adjacent rings may be equal or different.

In some embodiments, the at least one heating unit disposed around the periphery of the growth chamber 110 may be referred to as a first heating component 1220. In some embodiments, a count of the at least one heating unit in the first heating component 1220 may include 1, 2, 3, 4, etc. In some embodiments, the first heating component 1220 may be arranged around the periphery of the growth chamber 110 with a central axis of the growth chamber 110 as a center. In some embodiments, an arrangement of the first heating component 1220 may be uniformly arranged or un-uniformly arranged. In some embodiments, spacing distances between two adjacent heating units that are arranged around the periphery of the growth chamber 110 may be equal or different. In some embodiments, a heating mode of the first heating component 1220 and a heating mode of the temperature compensation component 1210 may be the same or different. In some embodiments, the heating mode of the temperature compensation component 1210 may include a resistance heating. In some embodiments, the heating mode of the first heating component 1220 may include a resistance heating or an induction heating.

In some embodiments, the temperature field in the growth chamber 110 may be changed by adjusting (e.g., adjusting up and down along an outer surface of the growth chamber 110) a position of the heating component and/or heating parameters (e.g., a current, a heating power) applied to the heating component to generate a suitable temperature gradient distribution and promote the crystal growth. Taking the induction coil as an example, the induction coil may be spirally wound the outside of the growth chamber 110, and a spacing between adjacent coils may gradually increase from a lower portion of the growth chamber 110 to an upper portion of the growth chamber 110 to control the temperature field in the growth chamber 110, thereby generating the suitable temperature gradient distribution. In some embodiments, the lower portion of the growth chamber 110 may refer to a portion of the growth chamber 110 away from the growth chamber cover 111. In some embodiments, the upper portion of the growth chamber 110 may refer to a portion of the growth chamber 110 close to the growth chamber cover 111. In some embodiments, the induction coil may include a plurality of connected sub-induction coils. Heating parameters of each sub-induction coil may be respectively controlled to control the temperature field in the growth chamber 110, thereby generating the suitable temperature gradient distribution. A count of the sub-induction coils and/or positions of the sub-induction coils may be determined based on a system default setting or adjusted based on different situations. In some embodiments, the count of the sub-induction coils and/or the positions of the sub-induction coils may be adjusted according to a size of the growth chamber 110, a shape of the growth chamber 110, a material of the growth chamber 110, a size of the seed crystal, a type of the crystal to be grown, a size of the crystal to be grown, etc.

The temperature compensation component 1210 may be configured to provide temperature compensation during the crystal growth. In some embodiments, the temperature compensation component 1210 may be located on the upper surface and/or the lower surface of the growth chamber 110. In some embodiments, the temperature compensation component 1210 may be located close to a center of the upper surface and/or a center of the lower surface of the growth chamber 110. In a conventional crystal preparation device, an induction coil may be placed outside the growth chamber for heating the growth chamber. Accordingly, the heat may be conducted from a peripheral region of the growth chamber to a central region of the growth chamber, resulting in that the peripheral region is a relatively high temperature region and the central region is relatively low temperature region. That is, the closer to the center is, the lower the temperature may be. For an upper region (e.g., the inner side surface of the growth chamber where the seed crystal is located) of the growth chamber, the radial temperature gradient may cause a large thermal stress on a growth surface of the seed crystal, the growth surface of the seed crystal may be severely convex in a direction of the source material, and a defect (e.g., a microtubule, an inclusion) may be generated. For a lower region (e.g., a source material coverage region) of the growth chamber, the radial temperature gradient may cause a molar ratio of the vapor components of the sublimated source material to be un-uniformly distributed in the radial distribution, affecting the crystal quality. Therefore, it is necessary to reduce the radial temperature gradient. Accordingly, the temperature compensation component 1210 may provide the temperature compensation to reduce the radial temperature gradient. When the temperature compensation component 1210 is located on the upper surface of the growth chamber 110, the radial temperature gradient of the inner side surface (also referred to as the "lower surface") of the growth chamber cover 111 can be reduced, the defects caused by the thermal stress on the crystal growth surface can be accordingly reduced, and corrosion defects on a rear surface of the crystal can be reduced or avoided. When the temperature compensation component 1210 is located on the lower surface of the growth chamber 110, the radial temperature gradient of the source material 160 can be reduced, and the uniformity of the radial temperature distribution can be improved, so that the molar ratio of the sublimated vapor components along the radial distribution can be more uniform, and the quality of the prepared crystal can be improved. It should be noted that FIG. 3 only illustrates a situation that the temperature compensation component 1210 is located on the upper surface of the growth chamber 110.

In some embodiments, the temperature compensation component 1210 may include at least one heating unit 1212. In some embodiments, the at least one heating unit 1212 may include at least one high resistance graphite unit. In some embodiments, the at least one heating unit 1212 may be uniformly or un-uniformly distributed on the upper surface or the lower surface of the growth chamber 110 along the radial direction. In some embodiments, one or more parameters (e.g., a count, a shape, a size, an arrangement, a current, a heating power) of the at least one heating unit 1212 may be adjusted according to a size of the upper surface or the lower surface of the growth chamber 110, a type of the crystal to be grown, a shape or a size of the seed crystal 150, a temperature distribution of the upper surface or the lower surface of the chamber 110, etc. In some embodiments, the count, the shape, and/or the size of the at least one heating unit 1212 may cause that a contact area between the at least one heating unit 1212 and the upper surface and/or the lower surface of the growth chamber 110 accounts for more than 50% of an area of the upper surface and/or the lower surface of the growth chamber 110. In some embodiments, the count and the arrangement of the at least one heating unit 1212 may cause that an arrangement shape and an arrangement area of the at least one heating unit 1212 are the same as a shape and an area of a horizontal cross section of the seed crystal 150. In some embodiments, an arrangement position of the at least one heating unit 1212 on the upper surface of the growth chamber cover 111 may correspond to a position of the seed crystal 150 on the lower surface of the growth chamber cover 111. In some embodiments, the temperature distribution inside the growth chamber 110 may satisfy a preset temperature distribution through the current of the at least one heating unit 1212 and/or the heating power of the at least one heating unit 1212.

In some embodiments, each parameter (e.g., the heating power, the current) of the at least one heating unit 1212 may be individually controlled to facilitate adjustment of the radial temperature gradient distribution.

In some embodiments, the temperature compensation component 1210 may further include a fixing frame 1216. The fixing frame 1216 may include at least one fixing unit for placing the at least one heating unit 1212. In some embodiments, the fixing frame 1216 may be coaxial with the growth chamber 110. In some embodiments, the fixing frame 1216 may be made of an insulation material or a heat insulation material. In some embodiments, the fixing frame 1216 may include a zirconia ceramic plate, a boron tinkled ceramic plate, etc. In some embodiments, the at least one fixing unit may be detachably connected to each other. In some embodiments, a shape of the at least one fixing unit may include a regular shape (e.g., a hexagon, a square, a circle, a triangle) or an irregular shape. Accordingly, a shape of the at least one heating unit 1212 may also include a regular shape (e.g., a hexagon, a square, a circle, a triangle) or an irregular shape. More descriptions regarding the fixing unit and the at least one heating unit may be found elsewhere in the present disclosure (e.g., FIG. 4, FIG. 5, and the descriptions thereof).

In some embodiments, the temperature compensation component 1210 may further include at least one first electrode 1213, at least one second electrode 1211, and an electrode fixing plate 1215. The electrode fixing plate 1215 may be configured to fix the first electrode 1213 and the second electrode 1211. In some embodiments, a material of the first electrode 1213 and a material of the second electrode 1211 may be the same or different. In some embodiments, each of the first electrode 1213 and the second electrode 1211 may include a low-resistance graphite electrode. In some embodiments, a shape of the first electrode 1213 and a shape of the second electrode 1211 may be the same or different. In some embodiments, both the first electrode 1213 and the second electrode 1211 may include a cylindrical electrode. In some embodiments, since the peripheral region of the growth chamber is a relatively high temperature region and the central region is a relatively low temperature region, the radial temperature gradient may cause crystal defects. Therefore, a diameter of the first electrode 1213 may be less than a diameter of the second electrode 1211. In some embodiments, the first electrode 1213 and the second electrode 1211 may be connected to a power source (e.g., a direct-current (DC) power source) by a wire (e.g., a copper wire 1214). In some embodiments, the electrode fixing plate 1215 may be made of an insulation material or a heat insulation material. In some embodiments, the electrode fixing plate 1215 may include a zirconia ceramic plate. In some embodiments, the electrode fixing plate 1215 may include at least one first hole 1215-1 and at least one second hole 1215-2 (shown in FIG. 7). The at least one first electrode 1213 may be fixed on the at least one heating unit 1212 through the at least one first hole 1215-1. The at least one second electrode 1211 may be fixed on the upper surface or the lower surface of the growth chamber 110 through the at least one second hole 1215-2. Accordingly, the first electrode 1213, the at least one heating unit 1212, the upper surface or the lower surface of the growth chamber 110, and the power source may form a current path for heating the at least one heating unit 1212. In some embodiments, the electrode fixing plate 1215 may also include at least two thermometer holes 1215-3. The at least two thermometer holes 1215-3 may be located between adjacent first holes 1215-1 along the radial direction or within a setting range of the at least one second hole 1215-2. In some embodiments, a temperature of the at least one heating unit 1212 or a temperature at the periphery of the upper surface or the lower surface of the growth chamber 110 may be measured through the at least two thermometer holes 1215-3. More descriptions regarding the at least two thermometer holes 1215-3 may be found elsewhere in the present disclosure (e.g., FIG. 7 and the descriptions thereof).

In some embodiments, the crystal preparation device 100 may further include a control component for adjusting at least one parameter (e.g., the count, the shape, the size, the arrangement, the current, the heating power) of the at least one heating unit 1212 based on at least one reference parameter, thereby causing that the radial temperature gradient on the upper surface or the lower surface of the growth chamber 110 does not exceed a preset radial temperature gradient threshold (e.g., 0.5° C./cm). In some embodiments, the preset radial temperature gradient threshold may be determined based on a system default value or adjusted based on different situations. In some embodiments, when different crystals are to be prepared, corresponding preset radial temperature gradient thresholds may be different. In some embodiments, the at least one reference parameter may include a type of the crystal to be prepared, a size or a shape of the seed crystal, temperature information related to the growth chamber 110 during the crystal growth, etc. Taking the silicon carbide crystal as an example, the silicon carbide crystal may include three crystal types including a hexagonal structure, a cubic structure, and a rhombohedral structure. The silicon carbide crystal may include 3C—SiC, 4H—SiC, 6H—SiC, 15R—SiC, etc., wherein 3C—SiC is a cubic structure, 4H—SiC is a hexagonal structure, 6H—SiC is a hexagonal structure, and 15R—SiC is a rhombohedral structure. For different types of silicon carbide crystals, the radial temperature gradient distribution of the inner side surface of the growth chamber cover 111 can be adjusted as suitable for a growth of a specific type of silicon carbide crystal by adjusting the parameter(s) of the at least one heating unit 1212. In some embodiments, for different crystal growth requirements, the sizes or the shapes of the seed crystals may be correspondingly different. Accordingly, for seed crystals with different sizes or shapes, the radial temperature gradient distribution of the inner side surface of the growth chamber 111 can be adjusted as suitable for a specific seed crystal with a specific size or a specific shape to grow a high-quality crystal by adjusting the parameter(s) of the at least one heating unit 1212.

In some embodiments, the temperature information related to the growth chamber 110 during the crystal growth may include a first temperature of the at least one the heating unit 1212 and a second temperature at the periphery of the upper surface or the lower surface of the growth chamber 110. Taking the temperature compensation component 1210 located on the upper surface of the growth chamber 110 as an example, the at least one heating unit 1212 may be arranged on an outer side surface (i.e., the upper surface of the growth chamber 110) of the growth chamber cover 111 along the radial direction with a center of the growth chamber cover 111 as a center. Accordingly, the first temperature may include at least one temperature (also referred to as "at least one first temperature") distributed on the upper surface of the growth chamber 110 along the radial direction. When the first heating component 1220 heats the growth chamber 110, the heat may be gradually reduced along a direction from the periphery of the growth chamber 110 to the central axis during a transmission process on a specific horizontal plane. When no heat is compensated, a temperature of the periphery of the growth chamber 110 may be inevitably larger than a temperature inside the growth chamber 110. That is, the second temperature may be larger than the first temperature. When a difference between the first temperature and the second temperature is too large, the radial temperature distribution may not be conducive to the crystal growth. In some embodiments, the control component may compare at least one difference between the first temperature and the second temperature and adjust the parameter(s) of the at least one heating unit 1212, so that the radial temperature difference on the growth chamber cover 111 does not exceed the preset radial temperature difference threshold. In some embodiments, heating power(s) of at least one heating unit located at the central region of the growth chamber 110 may be increased to increase compensation heat of the central region of the growth chamber 110, which can improve the first temperature and reduce the difference between the first temperature and the second temperature, thereby causing that the radial temperature difference on the growth chamber cover 111 does not exceed the preset radial temperature difference threshold.

Figure 4:
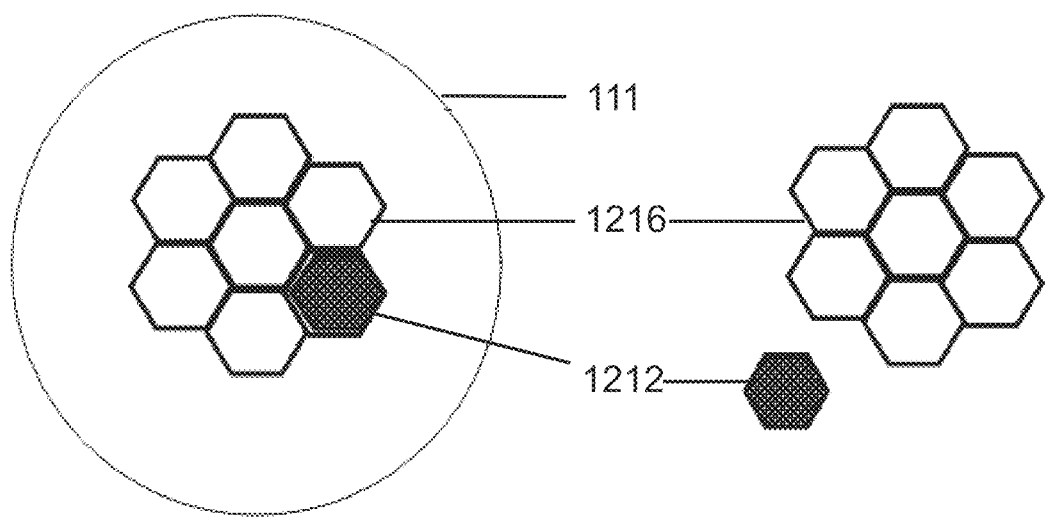
FIG. 4 is a top view illustrating an exemplary arrangement of heating units according to some embodiments of the present disclosure.
Figure 5:
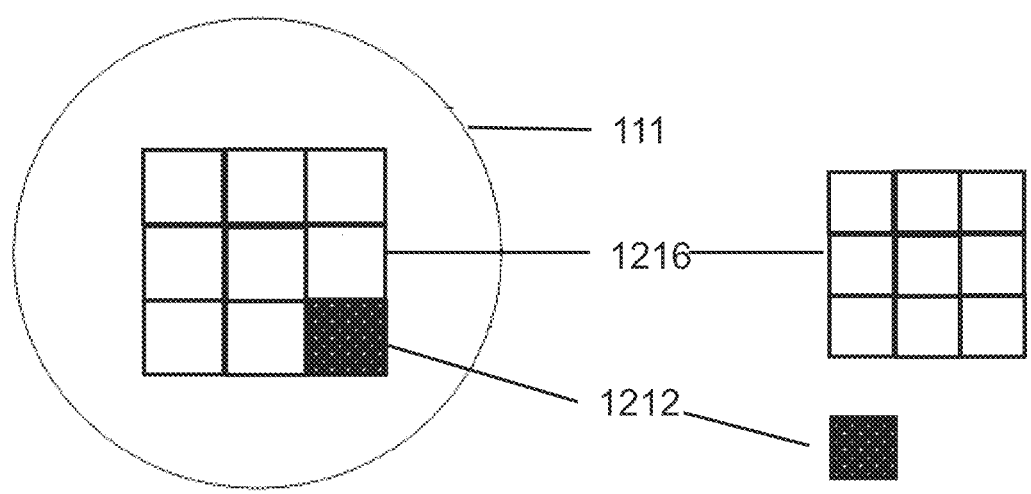
FIG. 5 is a top view illustrating an exemplary arrangement of heating units according to some embodiments of the present disclosure.

In some embodiments, the control component may include at least one temperature sensing unit (not shown) for measuring the first temperature and the second temperature. In some embodiments, the at least one temperature sensing unit may include a thermometer (e.g., an infrared thermometer). In some embodiments, the at least one temperature sensing unit may measure the first temperature and the second temperature through the at least two thermometer holes 1215-3 on the temperature compensation component 1210. As described above, the at least two thermometer holes 1215-3 may be located between adjacent first holes 1215-1 along the radial direction, and the at least one first hole 1215-1 corresponds to the at least one heating unit 1212, so that the temperature sensing unit(s) can measure the first temperature(s) at the at least one heating unit 1212 through the thermometer hole(s). Similarly, the at least two thermometer holes may also be located within the setting range (e.g., 2 centimeters) of the at least one second hole 1215-2. Accordingly, the temperature sensing unit can measure the second temperature at the periphery of the upper surface of the growth chamber through the thermometer hole. In some embodiments, the setting range may refer to a distance between a center of the at least two thermometer holes and a center of the at least one second hole. In some embodiments, the setting range may be within a range of 1 centimeter to 5 centimeters. In some embodiments, the setting range may be within a range of 1.5 centimeters to 4.5 centimeters. In some embodiments, the setting range may be within a range of 2 centimeters to 4 centimeters. In some embodiments, the setting range may be within a range of 2.5 centimeters to 3.5 centimeters. In some embodiments, the setting range may be within a range of 2.8 centimeters to 3.2 centimeters. FIG. 4 is a top view illustrating an exemplary arrangement of heating units according to some embodiments of the present disclosure. FIG. 5 is a top view illustrating an exemplary arrangement of heating units according to some embodiments of the present disclosure.

The fixing frame 1216 may include at least one fixing unit for placing the at least one heating unit 1212. As shown in FIG. 4, the fixing frame 1216 may be formed by connecting seven hollow regular hexagon fixing units. Accordingly, a shape of the heating unit 1212 may also be a regular hexagon. As shown in FIG. 5, the fixing frame 1216 may be formed by connecting nine hollow square fixing units. Accordingly, the shape of the heating unit 1212 may also be a square. In some embodiments, a count of the at least one fixing unit arranged on the upper surface or the lower surface of the growth chamber 110 may be appropriately increased or decreased according to an area of the upper surface or the lower surface of the growth chamber 110.

Figure 6:
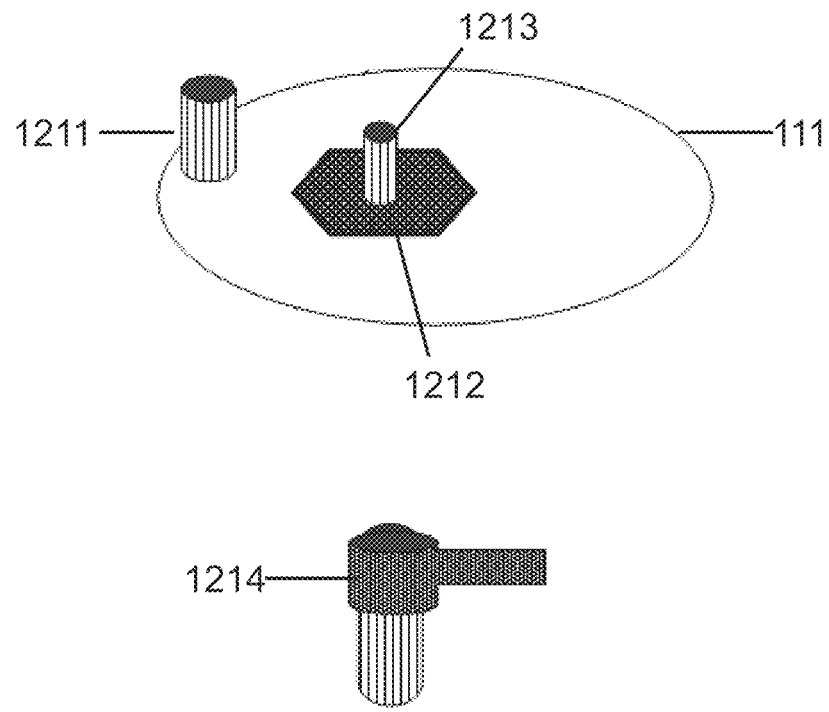
FIG. 6 is a schematic diagram illustrating an exemplary first electrode and an exemplary second electrode according to some embodiments of the present disclosure.
Figure 7:
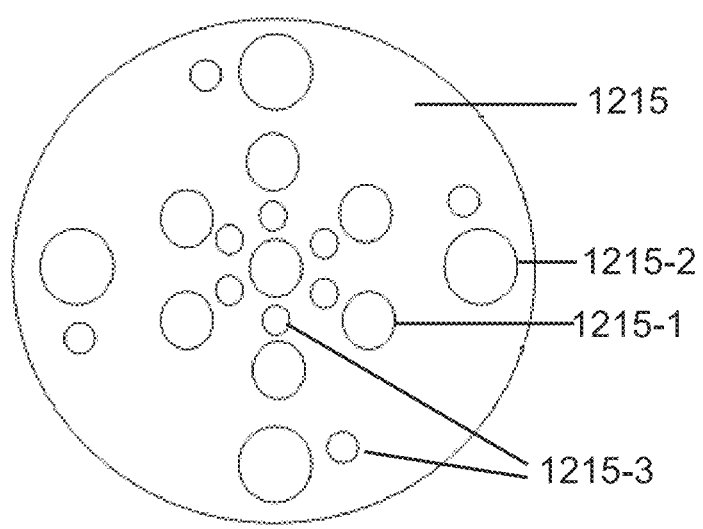
FIG. 7 is a top view illustrating an exemplary electrode fixing plate according to some embodiments of the present disclosure.

FIG. 6 is a schematic diagram illustrating an exemplary first electrode and an exemplary second electrode according to some embodiments of the present disclosure. FIG. 7 is a top view illustrating an exemplary electrode fixing plate according to some embodiments of the present disclosure.

As shown in FIG. 6 and FIG. 7, the at least one first electrode 1213 may be fixed to the at least one heating unit 1212 through the at least one first hole 1215-1. The at least one second electrode 1211 may be fixed to an upper surface or a lower surface of the growth chamber 110 through the at least one second hole 1215-2. In some embodiments, a shape of the first electrode 1213 and a shape of the second electrode 1211 may be the same or different. In some embodiments, both the first electrode 1213 and the second electrode 1211 may include a cylindrical electrode, and a diameter of the first electrode 1213 may be less than a diameter of the second electrode 1211. In some embodiments, the first electrode 1213 and the second electrode 1211 may be connected to a power source (e.g., a direct-current (DC) power source) by a wire (e.g., the copper wire 1214). When the copper wire 1214 is connected to the power source, the first electrode 1213, the at least one heating unit 1212, the upper surface or the lower surface of the growth chamber 110, and the power source may form a current path for heating the at least one heating unit 1212.

The electrode fixing plate 1215 may also include at least two thermometer holes 1215-3. At least one temperature sensing unit may measure a first temperature at the at least one heating unit 1212 and a second temperature at a periphery of the upper surface or the lower surface of the growth chamber 110 through the at least two thermometer holes 1215-3. As shown in FIG. 7, the at least two thermometer holes 1215-3 may be located between adjacent first holes 1215-1 along the radial direction or within a setting range of the at least one second hole 1215-2. A shape of the thermometer hole may include a regular shape (e.g., a hexagon, a square, a circle, a triangle) or an irregular shape. In some embodiments, the at least one temperature sensing unit may measure the first temperature at the at least one heating unit 1212 and the second temperature at the periphery of the upper surface or the lower surface of the growth chamber 110 through the at least two thermometer holes 1215-3 to obtain a temperature distribution on the upper surface or the lower surface of the growth chamber 110. Further, a control component may adjust a parameter (e.g., a count, a shape, a size, an arrangement, a current, a heating power) of the at least one heating unit 1212 based on the first temperature and the second temperature, thereby causing that the radial temperature gradient on the upper surface or the lower surface of the growth chamber 110 does not exceed a preset radial temperature gradient threshold.

In some embodiments, if a count of the at least one heating unit 1212 is 7 and the arrangement is as shown in FIG. 4, seven first electrodes 1213 may be fixed to the at least one heating unit 1212 through the seven first holes 1215-1. Further, four second electrodes 1211 may be placed on the periphery of the upper surface or the lower surface of the growth chamber 110, and the four second electrodes 1211 may be fixed on the upper surface or the lower surface of the growth chamber 110 through the four second holes 1215-2. According to a clockwise direction, six first temperatures T1, T2, T3, T4, T5, and T6 of the at least one heating unit 1212 may be sequentially detected by an infrared thermometer through the thermometer holes 1215-3. In addition, four second temperatures P1, P2, P3, and P4 on the periphery of the upper surface or the lower surface of the growth chamber 110 may be sequentially detected by the infrared thermometer through the thermometer holes 1215-3. If at least one of the four second temperatures is less than or greater than a preset temperature P, and/or if at least one of the six first temperatures is less than or greater than a preset temperature T, the parameter(s) of the at least one heating unit 1212 may be adjusted (e.g., increasing the heating power of the at least one heating unit 1212 or decreasing the heating power of the at least one heating unit 1212) until the four second temperatures are equal to the preset temperature P and/or the six first temperatures are equal to the preset temperature T. The preset temperature T may be less than the preset temperature P, and a temperature difference between the preset temperature T and the preset temperature P may be less than a preset threshold (e.g., 10 K). In some embodiments, an average temperature $\overline{P}$ of the four second temperatures may be calculated and then the average temperature $\overline{P}$ may be compared with the six first temperatures. If at least one of the six first temperatures is larger than the average temperature $\overline{P}$, or if at least one of the six first temperatures is less than the average temperature $\overline{P}$ and a temperature difference is larger than the preset temperature P, the parameter(s) of the at least one heating unit 1212 may be adjusted (e.g., increasing the heating power of the at least one heating unit 1212 or decreasing the heating power of the at least one heating unit 1212) based on the average temperature $\overline{P}$ until the six first temperatures are less than the average temperature $\overline{P}$ and the temperature difference is less than the preset temperature P (e.g., 10 K).

It should be noted that the above description of the crystal preparation device 100 is merely provided for illustration, and not intended to limit the scope of the present disclosure. For persons having ordinary skills in the art, multiple variations and modifications may be made to the crystal preparation device 100 under the teachings of the present disclosure. However, those variations and modifications do not depart from the scope of the present disclosure.

The beneficial effects of the embodiments may include but not limited to the followings. (1) By mounting a temperature compensation component on an upper surface of a growth chamber, a radial temperature gradient on an inner side surface of a growth chamber cover caused by an induction coil can be reduced, defects caused by a thermal stress on a crystal growth surface can be reduced, corrosion defects on a rear surface of the crystal can be reduced or avoided, and a crystal quality and productivity can be improved. (2) By mounting a temperature compensation component on a lower surface of the growth chamber, a radial temperature gradient of a source material coverage region caused by the induction coil can be reduced, a uniformity of a radial temperature distribution can be improved, a uniformity of a molar ratio of sublimated vapor components along the radial distribution can be improved, and a stable crystal growth can be promoted. (3) Parameter(s) of heating unit(s) of the temperature compensation component can be flexibly adjusted according to a size of the upper surface or the lower surface of the growth chamber, a type of the crystal to be grown, a size or a shape of a seed crystal, a temperature distribution inside the growth chamber, etc., and the parameter(s) of the heating unit(s) can be individually controlled. (4) The parameter(s) of the temperature compensation component can be adjusted by monitoring the temperature distribution of the upper surface or the lower surface of the growth chamber during the crystal growth, thereby ensuring a stable crystal growth with high quality.

Figure 8:
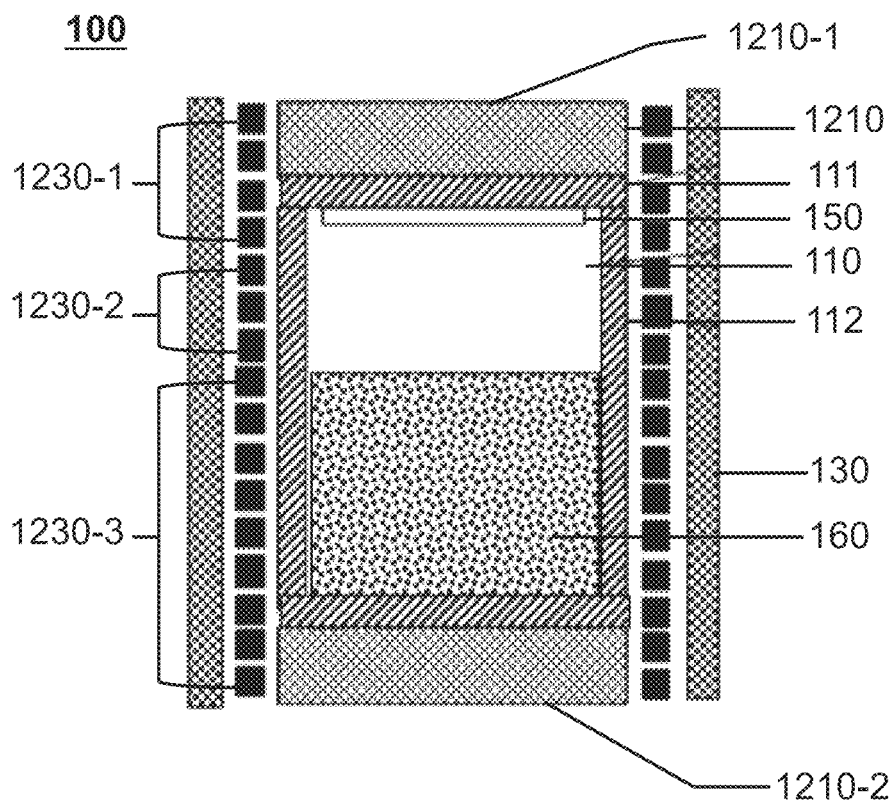
FIG. 8 is a schematic diagram illustrating an exemplary crystal preparation device according to some embodiments of the present disclosure.

FIG. 8 is a schematic diagram illustrating an exemplary crystal preparation device according to some embodiments of the present disclosure. In some embodiments, the crystal preparation device 100 may prepare a semiconductor crystal (e.g., a silicon carbide crystal, an aluminum nitride crystal, a zinc oxide crystal, a zinc antimony crystal) based on physical vapor transport (PVT). As shown in FIG. 8, the crystal preparation device 100 may include the growth chamber 110 and a heating component.

The growth chamber 110 may be configured to place the seed crystal 150 and the source material 160. In some embodiments, the growth chamber 110 may include the growth chamber cover 111 and the growth chamber body 112. The growth chamber cover 111 may be located at a top portion of the growth chamber 110 and may be used to seal a top opening of the growth chamber body 112. Merely by way of example, the growth chamber 110 may include a crucible which includes a crucible cover and a crucible body. In some embodiments, a shape of the growth chamber body 112 may include a cylinder, a cuboid, a cube, etc. In some embodiments, a shape of the growth chamber body 112 may be a cylindrical tank which include a tank bottom and a tank sidewall. In some embodiments, corresponding to the shape of the growth chamber body 112, a shape of the growth chamber cover 111 may include a circular disc, a rectangular disc, a square disk, etc. In some embodiments, a material of the growth chamber 110 may include graphite. In some embodiments, the material of the growth chamber 110 may be graphite in whole or in part.

In some embodiments, the seed crystal 150 may be fixedly bonded to an inner side surface (also referred to as a lower surface) (e.g., a center position of the inner side surface) of the growth chamber cover 111. The source material 160 may be placed in the growth chamber body 112 (e.g., a bottom portion of the growth chamber 110). In some embodiments, the seed crystal 150 may be fixed to the growth chamber cover 111 through an adhesion agent. The adhesion agent may include epoxy resin, a two-component mixed hardened glue (AB glue), phenolic resin, a sugar glue, etc. In some embodiments, the source material 160 may be placed on a bottom portion of the growth chamber 110. In some embodiments, the source material 160 may be placed inside the growth chamber 110 (e.g., the bottom portion of the growth chamber 110). In some embodiments, the source material 160 may be in a powder form, a granular form, a block form, etc. During the crystal growth, an axial temperature gradient may be formed between the source material 160 and the seed crystal 150 by controlling a heating environment of the growth chamber 110. The source material 160 may be decomposed and sublimated into vapor components when heated. For example, if a silicon carbide crystal is to be prepared, the vapor components may include $Si_2C$, $SiC_2$, Si, etc. Under a driving action of the axial temperature gradient, the vapor components may be transmitted from a surface of the source material 160 to a surface of the seed crystal 150. Since a temperature at the seed crystal 150 is relatively low, the vapor components may be crystallized on the surface of the seed crystal 150 to generate the crystal.

The heating component may be configured to heat the growth chamber 110. In some embodiments, the heating component may be located outside the growth chamber 110. In some embodiments, the heating component may be disposed around a periphery of the growth chamber 110. In some embodiments, the heating component may be configured to provide at least a portion of heat required for the crystal growth. In some embodiments, the heating component may generate heat under a current, and transmit the heat to the growth chamber 110 by heat radiation, so that the heat may be conducted from a peripheral region of the growth chamber 110 to a central region of the growth chamber 110 to form a temperature field. Under the temperature field in the growth chamber 110, the source material 160 may be sublimated and decomposed into vapor components. The vapor components may be transported to the surface of the seed crystal 150 under the driving action of the axial temperature gradient and may be crystallized on the surface of the seed crystal 150 to generate the crystal.

In some embodiments, the heating component may include a resistance heating element. In some embodiments, the resistance heating element may include a high resistance graphite heating element, a tungsten heating element, a molybdenum heating element, a zirconium diboride composite ceramic heating element, or the like, or any combination thereof. In some embodiments, a shape of the resistance heating element may include a ring, a square ring, a rectangular ring, etc. In a conventional crystal preparation device, an induction coil may be placed outside the growth chamber for heating the growth chamber. Accordingly, the heat may be conducted from the peripheral region of the growth chamber to the central region of the growth chamber, resulting in that the peripheral region is a relatively high temperature region and the central region is relatively low temperature region. That is, the closer to the center is, the lower the temperature may be, resulting in a large radial temperature difference or a large radial temperature gradient. In some embodiments, differences (e.g., differences in a surface roughness, a density, a thickness, etc.) in various positions of the growth chamber 110 along a peripheral direction may result in that thermal conductivities at various positions of the growth chamber 110 along the circumferential direction are different, which may further result in that a temperature distribution inside the growth chamber 110 is non-uniform. For a crystallization region (e.g., an inner side surface of the growth chamber cover where the seed crystal is located) of the growth chamber 110, the large radial temperature difference and/or the large radial temperature gradient may cause a large thermal stress on a growth surface of the seed crystal, the growth surface of the seed crystal may be severely convex in a direction of the source material, and a defect (e.g., a microtubule, an inclusion) may be generated. For a source material region (e.g., a source material coverage region) of the growth chamber, the large radial temperature gradient may cause a molar ratio of the vapor components of the sublimated source material to be un-uniformly distributed in the radial distribution, affecting the crystal quality. Therefore, it is necessary to reduce the radial temperature gradient. Compared with heating using the induction coil, heating the growth chamber 110 using the resistance heating element can effectively reduce the radial temperature difference and/or the radial temperature gradient inside the growth chamber 110 and improve the stability of the temperature field of the crystal growth.

In some embodiments, the resistance heating element may include at least three heating modules for heating the crystallization region of the growth chamber 110, the source material region of the growth chamber 110, and a vapor transmission region between the crystallization region and the source material region, respectively. The crystallization region may be located in an upper region of the growth chamber 110. In some embodiments, the crystallization region may refer to a region within a setting range of the seed crystal 150. The source material region may be located in a lower region of the growth chamber 110. In some embodiments, the source material region may refer to a region within a setting range of the source material 160. The vapor transmission region may be located in a middle region of the growth chamber 110. In some embodiments, the vapor transmission region may refer to a region between the crystallization region and the source material region. During the crystal growth, the source material 160 located in the source material region may be heated and may be sublimated and decomposed into vapor components. Under the driving action of the axial temperature gradient, the vapor components may be transported to the seed crystal 150 in the crystallization region and may be crystallized on the surface of the seed crystal 150 to generate the crystal.

In some embodiments, the at least three heating modules may include a first heating module 1230-1, a second heating module 1230-2, and a third heating module 1230-3, for heating the crystallization region of the growth chamber 110, the source material region of the growth chamber 110, and a vapor transmission region between the crystallization region and the source material region, respectively. In some embodiments, a count of the heating modules may be flexibly increased or decreased according to actual requirements. In some embodiments, at least one parameter (e.g., a current, a heating power) of each of the three heating modules may be individually controlled. In some embodiments, in order to maintain a suitable axial temperature gradient during the crystal growth, a heating power of the first heating module 1230-1 may be less than a heating power of the second heating module 1230-2, and the heating power of the second heating module 1230-2 may be less than a heating power of the third heating module 1230-3. In some embodiments, an axial temperature gradient distribution during the crystal growth may be adjusted by individually controlling the heating power of each of the at least three heating modules at different positions along an axial direction. More descriptions regarding the resistance heating element may be found elsewhere in the present disclosure (e.g., FIGS. 9-12 and the descriptions thereof), which may not be described herein.

In some embodiments, the crystal preparation device 100 may also include an insulation layer. The insulation layer may be configured to insulate the growth chamber 110 and/or the heating component. In some embodiments, the insulation layer may be made of any insulation material. In some embodiments, the insulation layer may include graphite felt, zirconia ceramics, etc. In some embodiments, the insulation layer may be located outside the heating component. In some embodiments, the insulation layer may be disposed around an outside of the heating element. In some embodiments, a count of layers of the insulation layer, a thickness, and/or a spacing distance between the insulation layer and the heating component may be set according to actual requirements. In some embodiments, the thickness of the graphite felt may be within a range of 10 millimeters to 40 millimeters. In some embodiments, a spacing distance between the insulation layer and the heating element may be adjusted adaptively according to a size of the growth chamber 110, a type of a crystal to be grown, a heating power of the resistance heating element, temperature information related to the growth chamber 110 during the crystal growth, etc. In some embodiments, when the heating power of the resistance heating element causes that the radial temperature difference of the growth chamber 110 is larger than a preset radial temperature difference threshold, the spacing distance between the insulation layer and the heating component may be shortened. In some embodiments, by disposing the insulation layer outside of the heating component and flexibly adjusting parameters (e.g., the count of layers, the thickness, a spacing distance between the insulation layer and the growth chamber 110) of the insulation layer, the temperature of the growth chamber 110 and/or the temperature of the heating element are not easy to lose and a stable crystal growth can be promoted. If the count of layers of the insulation layer is too small or the thickness of the insulation layer is too small, the heat would be easy to lose, causing the temperature field to be unstable, which is not conducive to the crystal growth. If the count of layers of the insulation layer is too large or the thickness of the insulation layer is too great, a cost of the crystal preparation device may be too high. Therefore, it is necessary to control the count of layers and the thicknesses of the insulation layer within a setting range to stabilize the temperature field. In some embodiments, the count of layers of the insulation layer 130 may be within a range of 2 layers to 10 layers. In some embodiments, the count of layers of the insulation layer 130 may be within a range of 3 layers to 9 layers. In some embodiments, the count of layers of the insulation layer 130 may be within a range of 4 layers to 8 layers. In some embodiments, the count of layers of the insulation layer 130 may be within a range of 5 layers to 7 layers. In some embodiments, the count of layers of the insulation layer 130 may include 6 layers. In some embodiments, the thickness of the insulation layer 130 may be within a range of 1 millimeter to 50 millimeters. In some embodiments, the thickness of the insulation layer 130 may be within a range of 3 millimeters to 48 millimeters. In some embodiments, the thickness of the insulation layer 130 may be within a range of 5 millimeters to 45 millimeters. In some embodiments, the thickness of the insulation layer 130 may be within a range of 8 millimeters to 42 millimeters. In some embodiments, the thickness of the insulation layer 130 may be within a range of 10 millimeters to 40 millimeters. In some embodiments, the thickness of the insulation layer 130 may be within a range of 15 millimeters to 35 millimeters. In some embodiments, the thickness of the insulation layer 130 may be within a range of 20 millimeters to 30 millimeters. In some embodiments, the thickness of the insulation layer 130 may be within a range of 23 millimeters to 28 millimeters. In some embodiments, the spacing distance between the insulation layer 130 and the heating component may be within a range of 1 millimeter to 20 millimeters. In some embodiments, the spacing distance between the insulation layer 130 and the heating component may be within a range of 2 millimeters to 18 millimeters. In some embodiments, the spacing distance between the insulation layer 130 and the heating component may be within a range of 3 millimeters to 16 millimeters. In some embodiments, the spacing distance between the insulation layer 130 and the heating component may be within a range of 4 millimeters to 14 millimeters. In some embodiments, the spacing distance between the insulation layer 130 and the heating component may be within a range of 5 millimeters to 12 millimeters. In some embodiments, the spacing distance between the insulation layer 130 and the heating component may be within a range of 6 millimeters to 11 millimeters. In some embodiments, the spacing distance between the insulation layer 130 and the heating component may be within a range of 7 millimeters to 10 millimeters. In some embodiments, the spacing distance between the insulation layer 130 and the heating component may be within a range of 8 millimeters to 9 millimeters.

In some embodiments, the heating component may further include a temperature compensation component 1210. The temperature compensation component 1210 may be configured to provide temperature compensation during the crystal growth. The growth chamber 110 may be heated by the resistance heating element, which may effectively reduce the radial temperature difference and/or the radial temperature gradient of the growth chamber 110. In order to promote the stable growth of the crystal, the temperature compensation may be provided by the temperature compensation component 1210 to further reduce the radial temperature difference and/or the radial temperature gradient.

In some embodiments, the temperature compensation component 1210 may include a first temperature compensation component 1210-1 and/or a second temperature compensation component 1210-2. In some embodiments, the temperature compensation component 1210 may be located on the upper surface of the growth chamber 110 and/or the lower surface of the growth chamber 110. In some embodiments, the first temperature compensation component 1210-1 may be located adjacent to a center of the upper surface of the growth chamber 110. The second temperature compensation component 1210-2 may be located adjacent to a center of the lower surface of the growth chamber 110. In some embodiments, a material of the temperature compensation component 1210 may include a high thermal conductivity material. In some embodiments, the temperature compensation component 1210 may include a high thermal conductivity graphite element. In some embodiments, a shape of the temperature compensation component 1210 may include a circular disk, a cubic disc, a cuboid disc, etc. In some embodiments, taking the high thermal conductivity graphite element as an example, the high thermal conductivity graphite element (e.g., the first temperature compensation component 1210-1) may be located at a center position of the upper surface of the growth chamber 110, and a peripheral region of a lower surface of the high thermal conductivity graphite element may be in contact with the peripheral region of the upper surface of the growth chamber 110, so that the heat at the peripheral region of the upper surface of the growth chamber 110 may be conducted to the central region of the upper surface of the growth chamber 110, and the temperature difference and/or the radial temperature gradient of the crystallization area (e.g., the inner side surface of the growth chamber cover where the seed crystal is located) of the growth chamber 110 can be reduced. The high thermal conductivity graphite element (e.g., the second temperature compensation component 1210-2) may be located at a center position of the lower surface of the growth chamber 110, and a peripheral region of an upper surface of the high thermal conductivity graphite element may be in contact with the peripheral region of the lower surface of the growth chamber 110, so that the heat at the peripheral region of the lower surface of the growth chamber 110 may be conducted to the central region of the lower surface of the growth chamber 110, the temperature difference and/or the radial temperature gradient of the source material region (e.g., the source material coverage region) of the growth chamber 110 can be reduced and the heating uniformity of the source material region can be improved. More descriptions regarding the temperature compensation component 1210 (or the first temperature compensation component 1210-1, or the second temperature compensation component 1210-2) may be found elsewhere in the present disclosure (e.g., FIGS. 3-6 and the descriptions thereof), which may not be described herein.

In some embodiments, the crystal preparation device 100 may further include a control component (not shown) for adjusting heating powers of the heating component and/or the temperature compensation component 1210 based on at least one crystal growth parameter, so that a temperature field between a crystal growth interface and the source material can be maintained stable. In some embodiments, the at least one crystal growth parameter may include an amount of the source material, a crystal growth size, a height difference between the crystal growth interface and the source material, etc. In some embodiments, in different stages of the crystal growth, for different amounts of source material in the growth chamber 110, the heating powers of the heating component and/or the temperature compensation component 1210 may be adjusted to cause that the axial temperature gradient distribution in the growth chamber 110 and the radial temperature gradient distributions in the crystallization region and/or the source material region in the growth chamber 110 may be suitable for crystal growth in different stages. In different stages of the crystal growth, for different sizes of crystals in the growth chamber 110, the heating powers of the heating component and/or the temperature compensation component 1210 may be adjusted to cause that the axial temperature gradient distribution in the growth chamber 110 and the radial temperature gradient distributions in the crystallization region and/or the source material region in the growth chamber 110 may be suitable for crystal growth corresponding to different sizes. During the crystal growth, as the source material is constantly consumed and vapor components may be continuously deposited on the seed crystal to grow a crystal, a height difference between the crystal growth interface and the source material may be continuously increased. Accordingly, the heating powers of the heating component and/or the temperature compensation component 1210 may be adjusted to cause that the temperature gradient distribution between the crystal growth interface and the source material may be effectively controlled to be substantially stable. More descriptions regarding the heating powers of the heating component and/or the temperature compensation component 1210 may be found elsewhere in the present disclosure (e.g., FIG. 9 and the descriptions thereof), which may not be described herein.

In some embodiments, each of the at least three heating units may include at least one sub-heating unit. In some embodiments, the at least one sub-heating unit may be divided by at least two electrodes. In some embodiments, each of the at least two electrodes may be connected to a power source by a wire, allowing each sub-heating unit, the electrode, the wire, and the power source to form a current loop, further allowing at least one parameter (e.g., a current, a heating power) of each sub-heating unit may be controlled individually. In some embodiments, the resistance heating element may include a plurality of heating segments which may be connected to each other through a plurality of electrodes and disposed around the periphery of the growth chamber 110.

Figure 9:
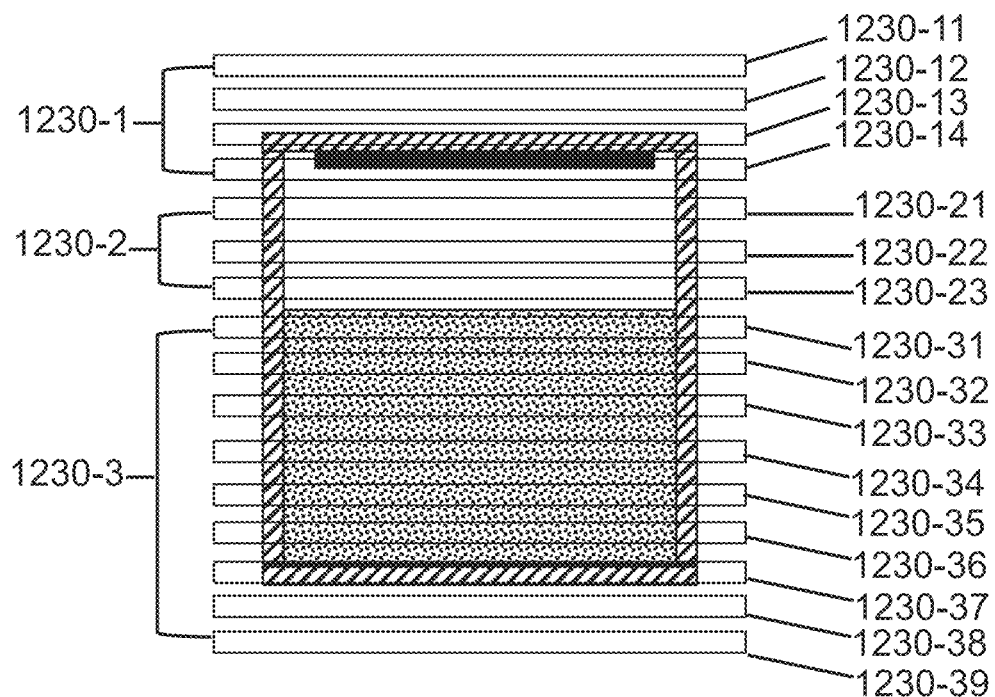
FIG. 9 is a schematic diagram illustrating an exemplary resistance heating element according to some embodiments of the present disclosure.

FIG. 9 is a schematic diagram illustrating an exemplary resistance heating element according to some embodiments of the present disclosure.

As shown in FIG. 9, the resistance heating element may at least include the first heating module 1230-1, the second heating module 1230-2, and the third heating module 1230-3 for heating the crystallization region of the growth chamber 110, the source material region of the growth chamber 110, and the vapor transmission region between the crystallization region and the source material region, respectively. In some embodiments, each heating module may include a plurality of sub-resistance heating elements. In some embodiments, the first heating module 1230-1 may include a first sub-resistance heating element 1230-11, a second sub-resistance heating element 1230-12, a third sub-resistance heating element 1230-13, and a fourth sub-resistance heating element 1230-14. The second heating module 1230-2 may include a fifth sub-resistance heating element 1230-21, a sixth sub-resistance heating element 1230-22, and a seventh sub-resistance heating element 1230-23. The third heating module 1230-3 may include an eighth sub-resistance heating element 1230-31, a ninth sub-resistance heating element 1230-32, a tenth sub-resistance heating element 1230-33, an eleventh sub-resistance heating element 1230-34, a twelfth sub-resistance heating element 1230-35, a thirteenth sub-resistance heating element 1230-36, a fourteenth sub-resistance heating element 1230-37, a fifteenth sub-resistance heating element 1230-38, and a sixteenth sub-resistance heating element 1230-39.

In some embodiments, heating powers of the first heating module 1230-1, the second heating module 1230-2, and the third heating module 1230-3 may be controlled individually. In some embodiments, for each heating module, heating powers of the plurality of sub-resistance heating elements may be controlled individually. During a crystal growth, as the source material 160 is constantly consumed, a height difference between a crystal growth interface and the source material 160 may be increased. In order to maintain a substantially stable temperature field between the crystal growth interface and the source material 160, it is necessary to adjust the heating power of the first heating module 1230-1, the heating power of the second heating module 1230-2, and the heating power of the third heating module 1230-3. In addition, in order to maintain a stable axial temperature gradient, it is also necessary to adjust a heating power of the first temperature compensation component 1210-1 and/or a heating power of the second temperature compensation component 1210-2. In some embodiments, before the crystal growth, a temperature at a position of the first sub-resistance heating element 1230-11 may be 2010° C., a temperature at a position of the second sub-resistance heating element 1230-12 may be 2020° C., a temperature at a position of the third sub-resistance heating element 1230-

13 may be 2030° C., a temperature at a position of the fourth sub-resistance heating element 1230-14 may be 2040° C., a temperature at a position of the fifth sub-resistance heating element 1230-21 may be 2050° C., a temperature at a position of the sixth sub-resistance heating element 1230-22 may be 2060° C., a temperature at a position of the seventh sub-resistance heating element 1230-23 may be 2070° C., a temperature at a position of each of the eighth sub-resistance heating element 1230-31 to the sixteenth sub-resistance heating element 1230-39 may be 2080° C. When the crystal growth interface reaches a horizontal surface of the fifth sub-resistance heating element 1230-21 and an upper surface of the source material is consumed to a horizontal surface of the ninth sub-resistance heating element 1230-32, heating powers of the first sub-resistance heating element 1230-11 to the eighth sub-resistance heating element 1230-31 may be adjusted to lower the temperature at the position of the first sub-resistance heating element 1230-11 to 2000° C., lower the temperature at the position of the second sub-resistance heating element 1230-12 to 2010° C., lower the temperature at the position of the third sub-resistance heating element 1230-13 to 2020° C., lower the temperature at the position of the fourth sub-resistance heating element 1230-14 to 2030° C., lower the temperature at the position of the fifth sub-resistance heating element 1230-21 to 2040° C., lower the temperature at the position of the sixth sub-resistance heating element 1230-22 to 2050° C., lower the temperature at the position of the seventh sub-resistance heating element 1230-23 to 2060° C., and lower the temperature at the position of the eighth sub-resistance heating element 1230-31 to 2070° C. The temperature at the position of each of the ninth sub-resistance heating element 1230-31 to the sixteenth sub-resistance heating element 1230-39 may be maintained still at 2080° C. By adjusting the heating powers, the axial temperature gradient distribution between the crystal growth interface and the source material 160 can be maintained substantially stable. In addition, as the crystal grows, the heating power of the first temperature compensation component 1210-1 located on the upper surface of the growth chamber 110 may be correspondingly reduced and the heating power of the second temperature compensation component 1210-2 located on the lower surface of the growth chamber 110 may be maintained still.

Figure 10:
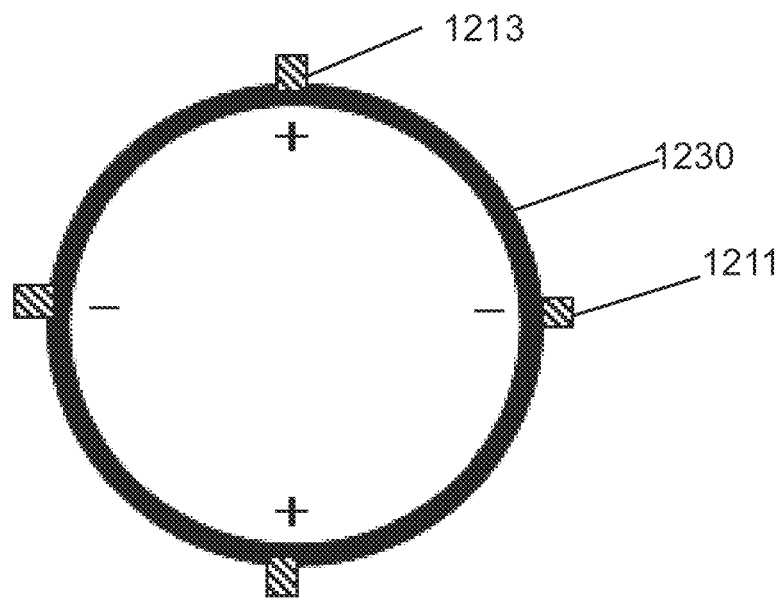
FIG. 10 and FIG. 11 are top views illustrating an arrangement of an exemplary first electrode and an exemplary second electrode according to some embodiments of the present disclosure.
Figure 11:
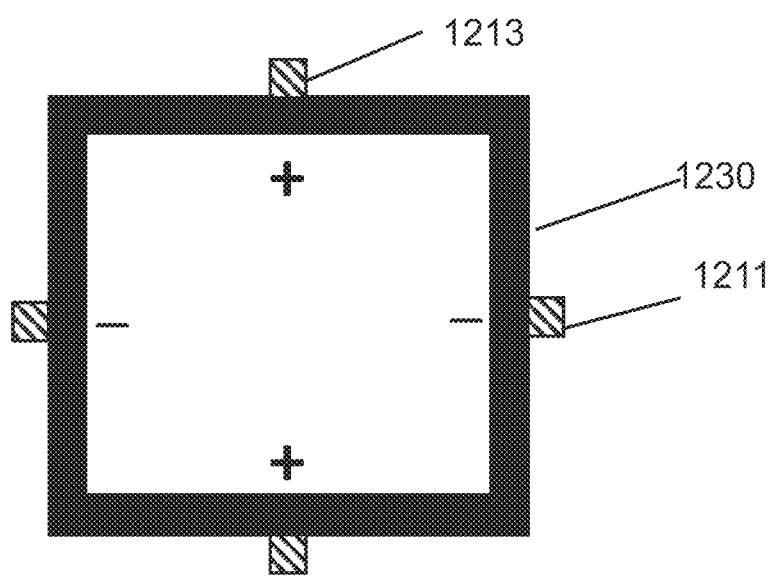

FIG. 10 is a top view illustrating an arrangement of an exemplary first electrode and an exemplary second electrode according to some embodiments of the present disclosure. FIG. 11 is a top view illustrating an arrangement of an exemplary first electrode and an exemplary second electrode according to some embodiments of the present disclosure.

In some embodiments, the heating component may further include at least one first electrode 1213 (e.g., a positive electrode) and at least one second electrode 1211 (e.g., a negative electrode). The at least one first electrode 1213 and the at least one second electrode 1211 may be distributed along a peripheral direction of the resistance heating element 1230. In some embodiments, the at least one first electrode 1213 and the at least one second electrode 1211 may be connected to a power source (e.g., a DC power source) by a wire (e.g., a water-cooled copper wire). Accordingly, the at least one first electrode 1213, the at least one second electrode 1211, the resistance heating element 1230, the wire, and the power source may form a current path for heating the resistance heating element 1230.

In some embodiments, as described in connection with FIG. 8, the resistance heating element 1230 may include a circular ring, a square ring, a rectangular ring, etc. Accordingly, the at least one first electrode 1213 and the at least one second electrode 1211 may be distributed along a circumference direction of the ring. In some embodiments, a material of the at least one first electrode 1213 and a material of the at least one second electrode 1211 may be the same or different. For example, both the at least one first electrode 1213 and the at least one second electrode 1211 may be a low-resistance graphite electrode. In some embodiments, the at least one first electrode 1213 and the at least one second electrode 1211 may be uniformly or un-uniformly distributed around the periphery of the resistance heating element 1230. In some embodiments, the at least one first electrode 1213 and the at least one second electrode 1211 may be configured to divide the resistance heating element 1230 into a plurality of heating segments. Heating powers of the plurality of heating segments may be individually controlled. In some embodiments, a total count of the at least one first electrode 1213 and the at least one second electrode 1211 may be an even number. In some embodiments, the count of at least one first electrode 1213 and the count of at least one second electrode 1211 may be adjusted according to actual requirements. The larger the count of electrodes arranged on the resistance heating element 1230 is, the higher a control accuracy of the heating power of the resistance heating element 1230 may be. In some embodiments, the resistance heating element 1230 may include M first electrodes 1213 and N second electrodes 1211, wherein M and N may be integers larger than 0. In some embodiments, M may be equal to N. In some embodiments, the total count of the first electrode 1213 and the second electrode 1211 may be an even number.

As shown in FIG. 10, a shape of the resistance heating element 1230 may be a ring and two first electrodes 1213 (positive electrodes) and two second electrodes 1211 (negative electrodes) may be distributed along the periphery of the resistance heating element 1230. The first electrodes 1213 and the second electrodes 1211 may be arranged at equal intervals and the resistance heating element 1230 may be uniformly divided into four heating segments. Heating powers of the four heating segments may be individually controlled. As shown in FIG. 11, a shape of the resistance heating element 1230 may be a square ring and two first electrodes 1213 (positive electrodes) and two second electrodes 1211 (negative electrodes) may be distributed along the periphery of the resistance heating element 1230. The first electrodes 1213 and the second electrodes 1211 may be arranged at equal intervals and the resistance heating element 1230 may be uniformly divided into four heating segments. Heating powers of the four heating segments may be individually controlled.

In some embodiments, as described in connection with FIG. 9, the resistance heating element 1230 may include at least three heating modules. Each of the at least three heating modules may include a plurality of sub-resistance heating elements. Accordingly, the plurality of sub-resistance heating elements may be disposed with at least one first electrode and at least one second electrode. For the plurality of sub-resistance heating elements, a count of first electrodes arranged on the plurality of sub-resistance heating elements and a count of second electrodes arranged on the plurality of sub-resistance heating elements may be the same or different.

Figure 12:
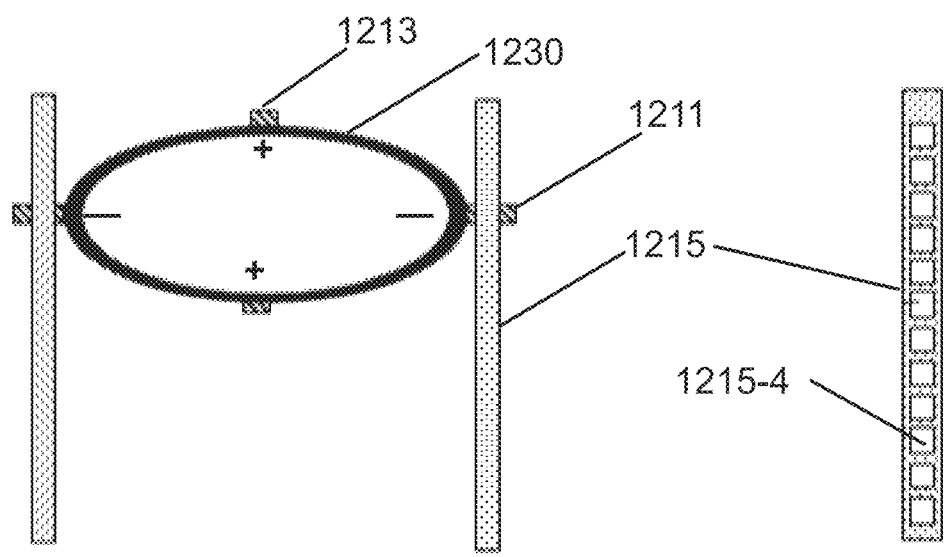
FIG. 12 is a top view illustrating an exemplary first electrode and/or an exemplary second electrode fixed to a resistance heating element according to some embodiments of the present disclosure.

FIG. 12 is a top view illustrating an exemplary first electrode and/or an exemplary second electrode fixed to a resistance heating element according to some embodiments of the present disclosure.

As shown in FIG. 12, a heating component may also include an electrode fixing plate 1215 for fixing at least one first electrode 1213 and/or at least one second electrode 1211. In some embodiments, the electrode fixing plate 1215 may include at least two holes 1215-4. In some embodiments, the at least one first electrode 1213 may be fixed to an outside of the resistance heating element 1230 through a hole of the at least two holes 1215-4. The at least one second electrode 1211 may be fixed to the outside of the resistance heating element 1230 through another hole of the at least two holes 1215-4. In some embodiments, the electrode fixing plate 1215 may be made of an insulation material or a heat insulation material. In some embodiments, the electrode fixing plate 1215 may include a zirconia ceramic plate.

It should be noted that the above description of the crystal preparation device 100 is merely provided for illustration, and not intended to limit the scope of the present disclosure. For persons having ordinary skills in the art, multiple variations and modifications may be made to the crystal preparation device 100 under the teachings of the present disclosure. However, those variations and modifications do not depart from the scope of the present disclosure.

The beneficial effects of the embodiments may include but not limited to the followings. (1) By heating a growth chamber by a resistance heating element, a radial temperature gradient inside the growth chamber can be effectively reduced and a temperature field stability of the crystal growth can be improved. (2) By mounting a temperature compensation component on an upper surface of a growth chamber, the radial temperature gradient on an inner side surface of the growth chamber can be reduced, defects caused by a thermal stress on a crystal growth surface can be reduced, corrosion defects on a rear surface of the crystal can be reduced or avoided, and a quality and productivity can be improved. (3) By mounting a temperature compensation component on a lower surface of the growth chamber, a radial temperature gradient of a source material coverage region can be reduced, a uniformity of a radial temperature distribution can be improved, a uniformity of distribution of a Si/C molar ratio of sublimated vapor components along the radial direction can be improved, and a stable crystal growth of the crystal can be promoted. (4) The count of the heating modules can be flexibly increased or decreased and the heating powers of the heating modules can be individually controlled, which can adjust the axial temperature gradient during the crystal growth to satisfy crystal growth requirements. (5) The heating powers of the sub-resistance heating elements included in each heating module can be individually controlled and the heating powers of the plurality of heating segments can be individually controlled, which can accurately control the axial temperature gradient.

Figure 13:
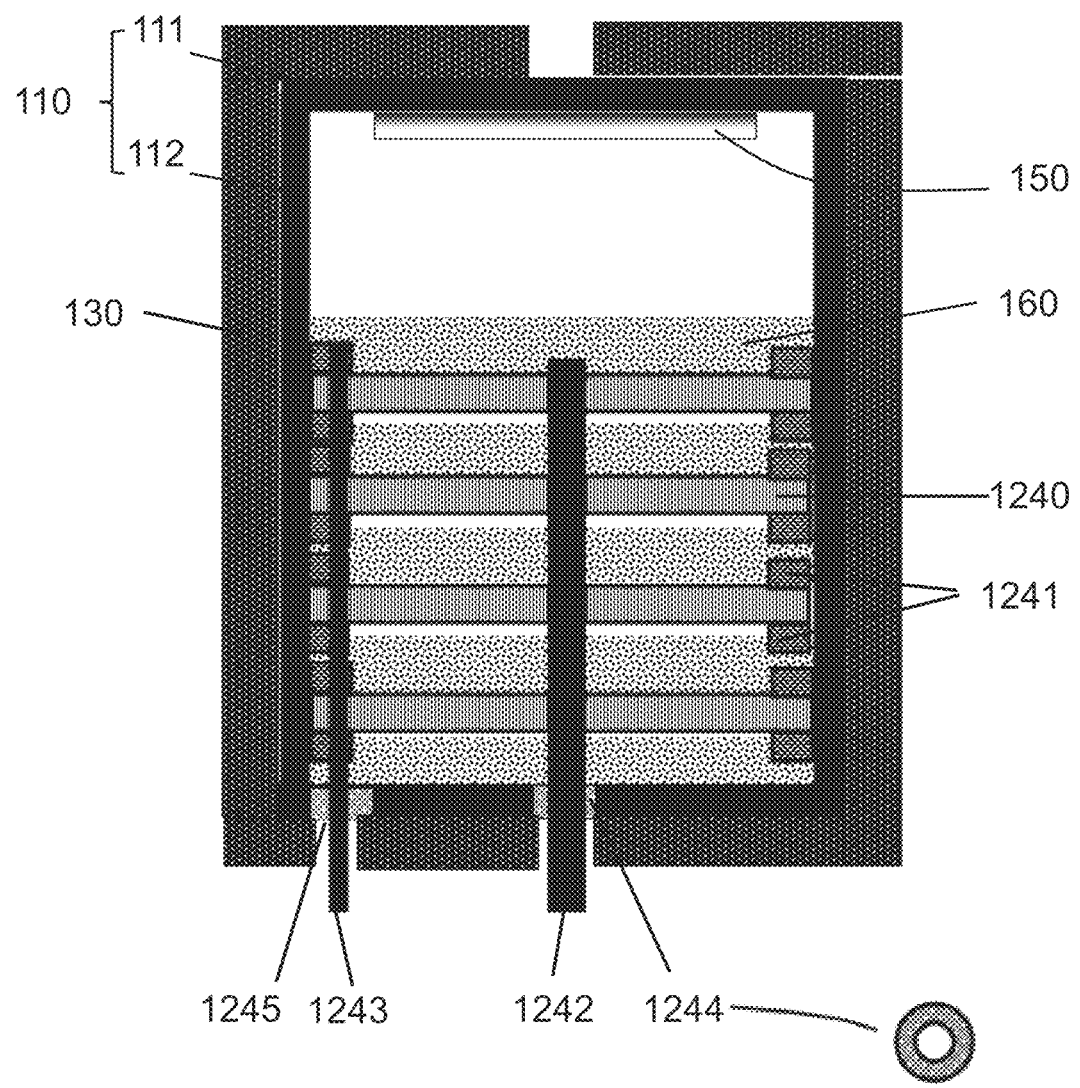
FIG. 13 is a schematic diagram illustrating an exemplary crystal preparation device according to some embodiments of the present disclosure.

FIG. 13 is a schematic diagram illustrating an exemplary crystal preparation device according to some embodiments of the present disclosure.

As shown in FIG. 13, the crystal preparation device 100 may include the growth chamber 110 and the heating component 120. More descriptions regarding the growth chamber 110 may be found elsewhere in the present disclosure (e.g., FIG. 1 and the descriptions thereof), which may not be described herein.

In some embodiments, the heating component 120 may include at least one heating unit. The at least one heating unit may be configured to heat the growth chamber 110 to provide a temperature field required for the crystal growth to prepare a crystal. In some embodiments, the heating component 120 may be located inside the growth chamber 110. The at least one heating unit located inside the growth chamber 110 may be referred to as a second heating component 1240. In some embodiments, a count of the at least one heating unit in the second heating component 1240 may include 1, 2, 3, 4, 5, 6, etc. In some embodiments, a shape of the at least one heating unit in the second heating component 1240 may be the same as a shape of a horizontal cross-section of the growth chamber 110. In some embodiments, the growth chamber 110 may be a cylinder, accordingly, the shape of the at least one heating unit in the second heating component 1240 may be a circle. In some embodiments, the growth chamber 110 may be a cuboid or a cube, accordingly, the shape of the at least one heating unit in the second heating component 1240 may be a rectangle or a square.

In some embodiments, the at least one heating unit in the second heating component 1240 may be distributed inside the growth chamber 110 at intervals along an axial direction of the growth chamber 110. In some embodiments, spacing distances between two adjacent heating units may be the same or different. In some embodiments, the spacing distance may refer to a distance along the axial direction. In some embodiments, a material of the at least one heating unit may include a high resistance heating material. In some embodiments, the at least one heating unit may include at least one high resistance graphite plate. After the at least one high resistance graphite plate is energized, heat energy generated by the Joule effect of the current flowing through the high resistance graphite plate can be used to heat the growth chamber 110.

In some embodiments, each heating unit of the at least one heating unit may be detachably connected to the growth chamber 110. In some embodiments, the growth chamber 110 may be disposed with at least one first connection element and each heating unit of the at least one heating unit may be disposed with at least one second connection element. The at least one first connection element and the at least one second connection element may be detachably connected, so that the at least one heating unit may be fixed inside the growth chamber 110 and/or the at least one heating unit may be detached from the inside of the growth chamber 110. In some embodiments, the at least one first connection element may include a bolt hole and the at least one second connection element may include a bolt that matches the bolt hole. In some embodiments, the at least one first connection element may include a hook and the at least one second connection element may include a hook hole that matches the hook.

In some embodiments, the heating unit located inside the growth chamber needs to satisfy a setting strength to ensure that when the source material is distributed on an upper surface of the heating unit, the heating unit does not deform, thereby ensuring the uniform stability of the temperature field. A thickness of the heating unit may be adjusted according to a material of the heating unit. In some embodiments, a thickness of a heating unit of graphite may not be smaller than a thickness of a heating unit of metal (e.g., tungsten, platinum, molybdenum, tantalum, ruthenium).

If the thickness of the heating unit is too small, the heat generated by the heating unit may be little, which may cause that the temperature field formed by the heating component does not satisfy the crystal growth. Due to a fixed space of the growth chamber, if the thickness of the heating unit is too large, a mass of the source material placed on the upper surface of the heating unit may be decreased, and a height of a flow channel on the heating unit may be increased, which further lead to that a resistance of the vapor components of the sublimated source material to the lower surface of the seed crystal through the heating unit may be increased, thereby effecting a crystal growth rate and a crystal quality. Therefore, the thickness of the heating unit may be controlled within a preset range. In some embodiments, the thickness of the at least one heating unit in the second heating component 1240 may be within a range of 2 millimeters to 30 millimeters. In some embodiments, the thickness of the at least one heating unit in the second heating component 1240 may be within a range of 4 millimeters to 28 millimeters. In some embodiments, the thickness of the at least one heating unit in the second heating component 1240 may be within a range of 6 millimeters to 26 millimeters. In some embodiments, the thickness of the at least one heating unit in the second heating component 1240 may be within a range of 8 millimeters to 24 millimeters. In some embodiments, the thickness of the at least one heating unit in the second heating component 1240 may be within a range of 10 millimeters to 22 millimeters. In some embodiments, the thickness of the at least one heating unit in the second heating component 1240 may be within a range of 12 millimeters to 20 millimeters. In some embodiments, the thickness of the at least one heating unit in the second heating component 1240 may be within a range of 14 millimeters to 18 millimeters. In some embodiments, the thickness of the at least one heating unit in the second heating component 1240 may be within a range of 15 millimeters to 17 millimeters. In some embodiments, the thickness of the at least one heating unit in the second heating component 1240 may be within a range of 15.5 millimeters to 16.5 millimeters.

In some embodiments, the at least one heating unit in the second heating component 1240 may include at least one flow channel 1250. The at least one flow channel 1250 may be opened on the upper surface of the at least one heating unit. In some embodiments, the at least one flow channel 1250 may penetrate the heating unit, so that at least one component required for crystal growth may be transmitted from a lower surface of the heating unit to the upper surface of the heating unit, further be transmitted to a lower surface of the seed crystal to generate the crystal under the driving of the axial temperature gradient. In some embodiments, the at least one component required for the crystal growth may include at least one vapor component generated by a thermal decomposition of the source material. Taking growing a silicon carbide crystal as an example, a high-purity silicon carbide powder may be employed as a source material, and vapor components Si, $SiC_2$, and $Si_2C$ generated by a thermal decomposition of the high-purity silicon carbide powder may be at least one component required for the crystal growth.

In some embodiments, a count of the at least one flow channel 1250 may be 5, 10, 20, 30, etc. In some embodiments, a shape of the at least one flow channel 1250 may include a regular shape (e.g., a circle, a triangle, a quadrangle, a pentagon, a hexagon) or an irregular shape. In some embodiments, shapes of at least one flow channel 1250 on one heating unit may be the same or different. In some embodiments, the at least one flow channel 1250 may be arranged in a circle, a ring, a triangle, a quadrangle, a pentagon, a hexagon, etc.

In some embodiments, counts of at least one flow channel 1250 on different heating units may be the same or different. In some embodiments, for two adjacent heating units, a count of at least one flow channel 1250 on one heating unit may be 10, and a count of at least one flow channel 1250 on the other heating unit may be 20. In some embodiments, shapes of at least one flow channel 1250 on different heating units may be the same or different. In some embodiments, for two adjacent heating units, the shape of at least one flow channel 1250 on one heating unit may be a circle, and the shape of at least one flow channel 1250 on the other heating unit may be a hexagon. In some embodiments, arrangements of at least one flow channel 1250 on different heating units may be the same or different. In some embodiments, for two adjacent heating units, at least one flow channel 1250 on one heating unit may be uniformly arranged, and at least one flow channel 1250 on the other heating unit may be un-uniformly arranged. In some embodiments, at least one flow channel 1250 on the two adjacent two heating units may be arranged in a ring with a center of the heating unit as a center. In some embodiments, spacing distances of adjacent rings on one heating unit may be equal, and spacing distances of adjacent rings on another heating unit may not be equal. In some embodiments, the spacing distance of the adjacent rings may be represented as a difference of radii of the adjacent rings.

If an area of a flow channel is too large, the source material may leak from the flow channel to a bottom portion of the growth chamber 110, causing that the source material 160 can't be placed on the upper surface of at least one heating unit located in the growth chamber. If the area of the flow channel is too small, the source material 160 may block the flow channel, causing that the vapor components of the source material 160 can't reach the seed crystal 150 to grow the crystal. Therefore, an area of a cross-sectional of a flow channel may be controlled within a certain range. In some embodiments, the area of the cross-sectional of the flow channel may not be more than 1.5 times a particle size of the source material. In some embodiments, the area of the cross-sectional of the flow channel may not be more than 1.4 times the particle size of the source material. In some embodiments, the area of the cross-sectional of the flow channel may not be more than 1.3 times the particle size of the source material. In some embodiments, the area of the cross-sectional of the flow channel may not be more than 1.2 times the particle size of the source material. In some embodiments, the area of the cross-sectional of the flow channel may not be more than 1.1 times the particle size of the source material. In some embodiments, the area of the cross-sectional of the flow channel may not be more than 1.0 time the particle size of the source material. In some embodiments, the area of the cross-sectional of the flow channel may not be less than 1.0 time the particle size of the source material. In some embodiments, the area of the cross-sectional of the flow channel may not be less than 1.1 times the particle size of the source material. In some embodiments, the area of the cross-sectional of the flow channel may not be less than 1.2 times the particle size of the source material. In some embodiments, the area of the cross-sectional of the flow channel may not be less than 1.3 times the particle size of the source material. In some embodiments, the area of the cross-sectional of the flow channel may not be less than 1.4 times the particle size of the source material. In some embodiments, the area of the cross-sectional of the flow channel may not be less than 1.5 times the particle size of the source material. In some embodiments, the area of the cross-sectional of the flow channel may be within a range of 1.0 time to 1.5 times the particle size of the source material. In some embodiments, the area of the cross-sectional of the flow channel may be within a range of 1.05 times to 1.45 times the particle size of the source material. In some embodiments, the area of the cross-sectional of the flow channel may be within a range of 1.1 times to 1.4 times the particle size of the source material. In some embodiments, the area of the cross-sectional of the flow channel may be within a range of 1.15 times to 1.35 times the particle size of the source material. In some embodiments, the area of the cross-sectional of the flow channel may be within a range of 1.2 times to 1.3 times the particle size of the source material. In some embodiments, the area of the cross-sectional of the flow channel may be within a range of 1.22 times to 1.28 times the particle size of the source material. In some embodiments, the area of the cross-sectional of the flow channel may be within a range of 1.24 times to 1.26 times the particle size of the source material.

If a sum of an opening area of at least one flow channel on the upper surface of one heating unit is too large, a mass or an amount of the source material placed on the upper surface of the heating unit may be limited, further affecting the efficiency of the crystal growth. If the sum of the opening area of at least one flow channel on the upper surface of one heating unit is too small, the flow channel can't prevent graphitized carbon particles from moving to the seed crystal, further resulting in crystal defects. Therefore, the sum of the opening area of the at least one flow channel on the upper surface of one heating unit may be controlled within a certain range to prevent the graphitized carbon particles from moving to the seed crystal, further reducing the crystal defects and ensuring the efficiency of the crystal growth. In some embodiments, the sum of the opening area of the at least one flow channel on the upper surface of one heating unit may be within a range of 20% to 60% of an area of the heating unit. In some embodiments, the sum of the opening area of the at least one flow channel on the upper surface of one heating unit may be within a range of 25% to 55% of the area of the heating unit. In some embodiments, the sum of the opening area of the at least one flow channel on the upper surface of one heating unit may be within a range of 30% to 50% of the area of the heating unit. In some embodiments, the sum of the opening area of the at least one flow channel on the upper surface of one heating unit may be within a range of 35% to 45% of the area of the heating unit. In some embodiments, the sum of the opening area of the at least one flow channel on the upper surface of one heating unit may be within a range of 38% to 42% of the area of the heating unit. In some embodiments, the sum of the opening area of the at least one flow channel on the upper surface of one heating unit may be 40% of the area of the heating unit.

As shown in FIG. 13, the heating component 120 may be located inside the growth chamber 110. When the growth chamber 110 is heated, a portion of the heat energy may be conducted outside the growth chamber 110 through the growth chamber 110, causing that a temperature of a region on the heating unit close to a wall of the growth chamber 110 is low and a temperature of a region on the heating unit far away from the wall of the growth chamber 110 is high. Further, a radial temperature difference and/or a radial temperature gradient may be formed inside the growth chamber 110. In some embodiments, since the material of the at least one heating unit includes the high resistance heating material, a resistance of the at least one heating unit can be adjusted by adjusting a density of the at least one flow channel 1250 on the at least one heating unit, thereby adjusting a heating power of the at least one heating unit. In some embodiments, the density of the at least one flow channel 1250 may refer to a count of the at least one flow channel 1250 in a unit area. In some embodiments, when a resistivity of the air is larger than a resistivity of the material of the at least one heating unit, the larger the density of the at least one flow channel 1250 on the heating unit is, the higher the resistivity of the heating unit may be, and the greater the heating power of the heating unit may be under a same energizing current.

In order to reduce or eliminate the radial temperature difference and/or the radial temperature gradient, in some embodiments, a density of at least one flow channel 1250 opened on a central region of the upper surface of the at least one heating unit may be less than a density of at least one flow channel 1250 opened on an edge region of the at least one heating unit. In some embodiments, the edge region of the at least one heating unit may refer to a region on the heating unit close to an edge of the heating unit or a region away from a center of the heating unit. In some embodiments, the central region of the upper surface of the at least one heating unit may refer to a region close the center of the heating unit on the heating unit. In the present disclosure, unless otherwise specified, an opening density of the at least one flow channel and the density of the at least one flow channel can be used interchangeably.

As shown in FIG. 13, the source material 160 may be placed on the upper surface of the at least one heating unit located inside the growth chamber 110. The source material 160 may be used to provide at least one component required for the crystal growth. The source material 160 may be decomposed into vapor components under the heating of the at least one heating unit. The vapor components may be at least one component required for the crystal growth. The vapor components may be transported to the seed crystal 150 through the at least one flow channel of the at least one heating unit under the driving of the axial temperature gradient. In some embodiments, the source material 160 may be in a powder form, a granular form, a block form, etc.

Figure 14:
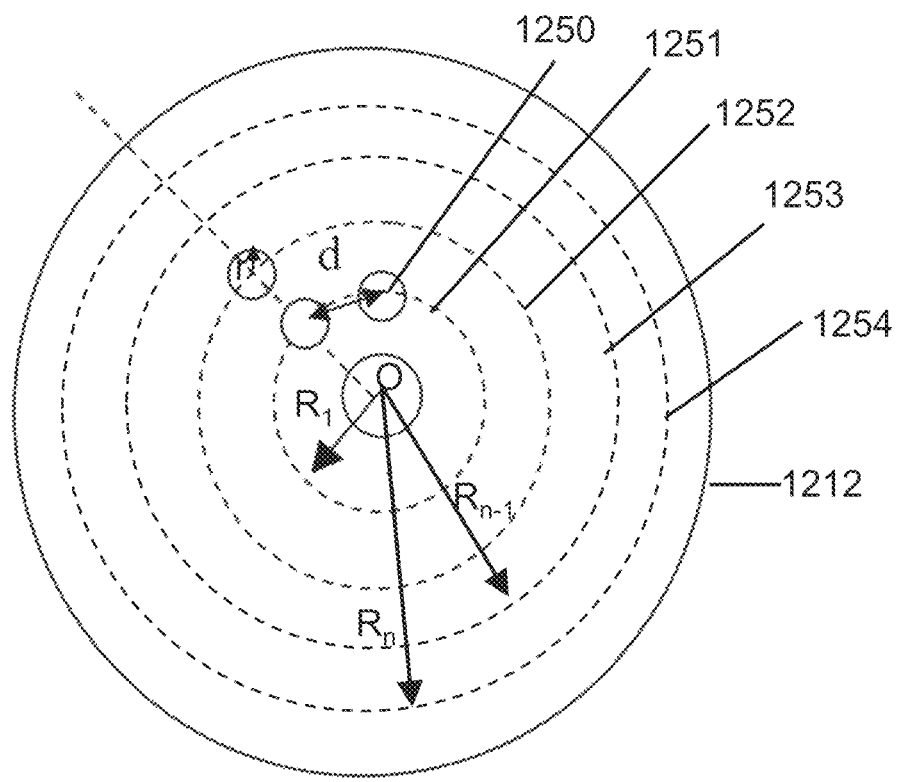
FIG. 14 is a schematic diagram illustrating exemplary at least one heating unit according to some embodiments of the present disclosure.

FIG. 14 is a schematic diagram illustrating exemplary at least one heating unit according to some embodiments of the present disclosure.

As shown in FIG. 14, a shape of at least one heating unit 1212 may be a circle. A shape of at least one flow channel 1250 may be a circle. The at least one flow channel 1250 is arranged in a circumference with a center O of the at least one heating unit 1212 as a center and with Rn as a radius. In some embodiments, the at least one flow channel 1250 may be arranged as at least one circumference. As shown in FIG. 14, the at least one flow channel 1250 may be arranged in four circles. At a radial direction from a central region of the at least one heating unit to an edge region of the at least one heating unit, the four circles may indicate a first flow channel circumference 1251, a second flow channel circumference 1252, a third flow channel circumference 1253, and a fourth flow channel circumference 1254. In the present disclosure, unless otherwise specified, the circumferential arrangement and an annular arrangement can be used interchangeably.

In some embodiments, a density of the at least one flow channel 1250 may also refer to a count of at least one flow channel 1250 per unit arc length. In some embodiments, densities of at least one flow channel 1250 on different flow channel circumferences may be the same or different. As shown in FIG. 13, the heating component 120 may be located inside the growth chamber 110. When the growth chamber 110 is heated, a portion of heat energy may be conducted to outside of the growth chamber 110 through a wall of the growth chamber 110, causing that a temperature of a region on the heating unit close to the wall of the growth chamber 110 is low and a temperature of a region on the heating unit far away from the wall of the growth chamber 110 is high. Further, a radial temperature difference and/or a radial temperature gradient may be formed inside the growth chamber 110. In some embodiments, the density of the at least one flow channel 1250 may be gradually increased from the central region of the at least one heating unit to the edge region of the at least one heating unit. In some embodiments, an opening density of at least one flow channel on the first flow channel circumference 1251 may be less than am opening density of at least one flow channel on the second flow channel circumference 1252. The opening density of the at least one flow channel on the second flow channel circumference 1252 may be less than an opening density of at least one flow channel on the third flow channel circumference 1253. The opening density of the at least one flow channel on the third flow channel circumference 1253 may be less than an opening density of at least one flow channel on the fourth flow channel circumference 1254. In some embodiments, the opening density of the at least one flow channel 1250 may be increased in step from the central region of the at least one heating unit to the edge region of the at least one heating unit. In some embodiments, the opening density of the at least one flow channel on the first flow channel circumference 1251 and the opening density of the at least one flow channel on the second flow channel circumference 1252 may be equal. The opening density of the at least one flow channel on the third flow channel circumference 1253 and the opening density of the at least one flow channel on the fourth flow channel circumference 1254 may be equal. The opening density of the at least one flow channel on the second flow channel circumference 1252 may be less than the opening density of the at least one flow channel on the third flow channel circumference 1253.

In some embodiments, a radius of the at least one flow channel 1250 may be represented as r. In some embodiments, the radius of the at least one flow channel 1250 may refer to a radius of an inscribed circle or a circumscribed circle of the at least one flow channel 1250. In some embodiments, when a shape of the at least one flow channel 1250 is a circle, the radius of the at least one flow channel 1250 may be a radius of the circle. In some embodiments, when the shape of the at least one flow channel 1250 is a regular shape such as a triangle, a quadrangle, a pentagon, a hexagon, etc., the radius of the at least one flow channel 1250 may be a radius of an inscribed circle or a circumscribed circle of the regular shape such as the triangle, the quadrangle, the pentagon, the hexagon, etc.

In some embodiments, the radius of the at least one flow channel 1250 may be determined in order to cause that the vapor components of the sublimated source material 160 can reach the seed crystal 150 through the flow channel to grow the crystal and the crystal growth efficiency can be ensured. In some embodiments, the radius r of the at least one flow channel 1250 may be within a range of 0.1 millimeters to 1 millimeter. In some embodiments, the radius r of the at least one flow channel 1250 may be within a range of 0.2 millimeters to 0.9 millimeters. In some embodiments, the radius r of the at least one flow channel 1250 may be within a range of 0.3 millimeters to 0.8 millimeters.

In some embodiments, the radius r of the at least one flow channel 1250 may be within a range of 0.4 millimeters to 0.7 millimeters. In some embodiments, the radius r of the at least one flow channel 1250 may be within a range of 0.5 millimeters to 0.6 millimeters. In some embodiments, the radius r of the at least one flow channel 1250 may be 0.1 millimeters. In some embodiments, the radius r of the at least one flow channel 1250 may be 0.2 millimeters. In some embodiments, the radius r of the at least one flow channel 1250 may be 0.3 millimeters. In some embodiments, the radius r of the at least one flow channel 1250 may be 0.4 millimeters. In some embodiments, the radius r of the at least one flow channel 1250 may be 0.5 millimeters. In some embodiments, the radius r of the at least one flow channel 1250 may be 0.6 millimeters. In some embodiments, the radius r of the at least one flow channel 1250 may be 0.7 millimeters. In some embodiments, the radius r of the at least one flow channel 1250 may be 0.8 millimeters. In some embodiments, the radius r of the at least one flow channel 1250 may be 0.9 millimeters. In some embodiments, the radius r of the at least one flow channel 1250 may be 1 millimeter.

As shown in FIG. 14, a central spacing distance between two adjacent flow channels on a flow channel circumference may be represented as d. In some embodiments, the central spacing distance may refer to a distance between geometric center points of two adjacent flow channels 1250 on a flow channel circumference. In some embodiments, when the shape of the flow channel is a circle, the geometric center point of the flow channel 1250 may refer to a center of the flow channel. In some embodiments, central spacing distances of two adjacent flow channels on a same flow channel circumference may be the same or different.

In some embodiments, the central spacing distance between two adjacent flow channels on the flow channel circumference may be represented as $3r<d<10r$. In some embodiments, the central spacing distance between two adjacent flow channels on the flow channel circumference may be represented as $4r<d<9r$. In some embodiments, the central spacing distance between two adjacent flow channels on the flow channel circumference may be represented as $5r<d<8r$. In some embodiments, the central spacing distance between two adjacent flow channels on the flow channel circumference may be represented as $6r<d<7r$. In some embodiments, the central spacing distance between two adjacent flow channels on the flow channel circumference may be represented as $6.4r<d<6.6r$.

In order to cause that an appropriate amount of source material can be placed on an upper surface of the heating unit to ensure the crystal growth efficiency, in some embodiments, the central spacing distance of two adjacent flow channels on a flow channel circumference may be within a range of 1.5 millimeters to 2.5 millimeters. In some embodiments, the central spacing distance of two adjacent flow channels on the flow channel circumference may be within a range of 1.6 millimeters to 2.4 millimeters. In some embodiments, the central spacing distance of two adjacent flow channels on the flow channel circumference may be within a range of 1.7 millimeters to 2.3 millimeters. In some embodiments, the central spacing distance of two adjacent flow channels on the flow channel circumference may be within a range of 1.8 millimeters to 2.2 millimeters. In some embodiments, the central spacing distance of two adjacent flow channels on the flow channel circumference may be within a range of 1.9 millimeters to 2.1 millimeters. In some embodiments, the central spacing distance of two adjacent flow channels on the flow channel circumference may be within a range of 1.95 millimeters to 2.05 millimeters. In some embodiments, the central spacing distance may be 1.5 millimeters. In some embodiments, the central spacing distance may be 1.6 millimeters. In some embodiments, the central spacing distance may be 1.7 millimeters. In some embodiments, the central spacing distance may be 1.8 millimeters. In some embodiments, the central spacing distance may be 1.9 millimeters. In some embodiments, the central spacing distance may be 2 millimeters. In some embodiments, the central spacing distance may be 2.1 millimeters. In some embodiments, the central spacing distance may be 2.2 millimeters. In some embodiments, the central spacing distance may be 2.3 millimeters. In some embodiments, the central spacing distance may be 2.4 millimeters. In some embodiments, the central spacing distance may be 2.5 millimeters.

In some embodiments, a count of flow channel circumferences on one heating unit may be represented as n, wherein n may be an integer that is not less than 2. In some embodiments, n may be 2, 3, 4, 5, etc. As shown in FIG. 14, a radius of an n-th flow channel circumference may be represented as $R_n$. Similarly, a radius of a (n-1)-th flow channel circumference may be represented as $R_{n-1}$. In some embodiments, the radius $R_n$ of the n-th flow channel circumference may be determined according to a size of the at least one heating unit and the radius of the at least one flow channel. In some embodiments, $R_n$ may be less than a radius of the at least one heating unit and larger than the radius of the at least one flow channel.

In some embodiments, when $4r < R_n - R_{n-1} < 10r$, $R_n - R_{n-1}$ may be equal to $(R_2 - R_1) \exp^{(-(n-1) \times 0.015)}$. In some embodiments, when $5r < R_n - R_{n-1} < 9r$, $R_n - R_{n-1}$ may be equal to $(R_2 - R_1) \exp^{(-(n-1) \times 0.015)}$. In some embodiments, when $6r < R_n - R_{n-1} < 8r$, $R_n - R_{n-1}$ may be equal to $(R_2 - R_1) \exp^{(-(n-1) \times 0.015)}$. In some embodiments, when $6.5r < R_n - R_{n-1} < 7.5r$, $R_n - R_{n-1}$ may be equal to $(R_2 - R_1) \exp^{(-(n-1) \times 0.015)}$.

In some embodiments, when $R_n - R_{n-1} < 4r$, $R_n - R_{n-1}$ may be 4r. In some embodiments, when $R_n - R_{n-1} < 3.5r$, $R_n - R_{n-1}$ may be 4r. In some embodiments, when $R_n - R_{n-1} < 3r$, $R_n - R_{n-1}$ may be 4r. In some embodiments, when $R_n - R_{n-1} < 2.5r$, $R_n - R_{n-1}$ may be 4r. In some embodiments, when $R_n - R_{n-1} < 2r$, $R_n - R_{n-1}$ may be 4r. In some embodiments, when $R_n - R_{n-1} < 1.5r$, $R_n - R_{n-1}$ may be 4r. In some embodiments, when $R_n - R_{n-1} < r$, $R_n - R_{n-1}$ may be 4r. In some embodiments, a radius $R_1$ of the first flow channel circumference 1251 close to the central region of the heating unit may be within a range of 1 millimeter to 20 millimeters. In some embodiments, $R_1$ may be within a range of 2 millimeters to 19 millimeters. In some embodiments, $R_1$ may be within a range of 3 millimeters to 18 millimeters. In some embodiments, $R_1$ may be within a range of 4 millimeters to 17 millimeters. In some embodiments, $R_1$ may be within a range of 5 millimeters to 16 millimeters. In some embodiments, $R_1$ may be within a range of 6 millimeters to 15 millimeters. In some embodiments, $R_1$ may be within a range of 7 millimeters to 14 millimeters. In some embodiments, $R_1$ may be within a range of 8 millimeters to 13 millimeters. In some embodiments, $R_1$ may be within a range of 9 millimeters to 12 millimeters. In some embodiments, $R_1$ may be within a range of 10 millimeters to 11 millimeters. In some embodiments, $R_1$ may be 10 millimeters. In some embodiments, a radius $R_2$ of the second flow channel circumference 1252 may be within a range of 2 millimeters to 30 millimeters. In some embodiments, $R_2$ may be within a range of 3 millimeters to 29 millimeters. In some embodiments, $R_2$ may be within a range of 4 millimeters to 28 millimeters. In some embodiments, $R_2$ may be within a range of 5 millimeters to 27 millimeters. In some embodiments, $R_2$ may be within a range of 6 millimeters to 26 millimeters. In some embodiments, $R_2$ may be within a range of 7 millimeters to 25 millimeters. In some embodiments, $R_2$ may be within a range of 8 millimeters to 24 millimeters. In some embodiments, $R_2$ may be within a range of 9 millimeters to 23 millimeters. In some embodiments, $R_2$ may be within a range of 10 millimeters to 22 millimeters. In some embodiments, $R_2$ may be within a range of 11 millimeters to 21 millimeters. In some embodiments, $R_2$ may be within a range of 12 millimeters to 20 millimeters. In some embodiments, $R_2$ may be within a range of 13 millimeters to 19 millimeters. In some embodiments, $R_2$ may be within a range of 14 millimeters to 18 millimeters. In some embodiments, $R_2$ may be within a range of 15 millimeters to 17 millimeters. In some embodiments, $R_2$ may be 16 millimeters.

Figure 15:
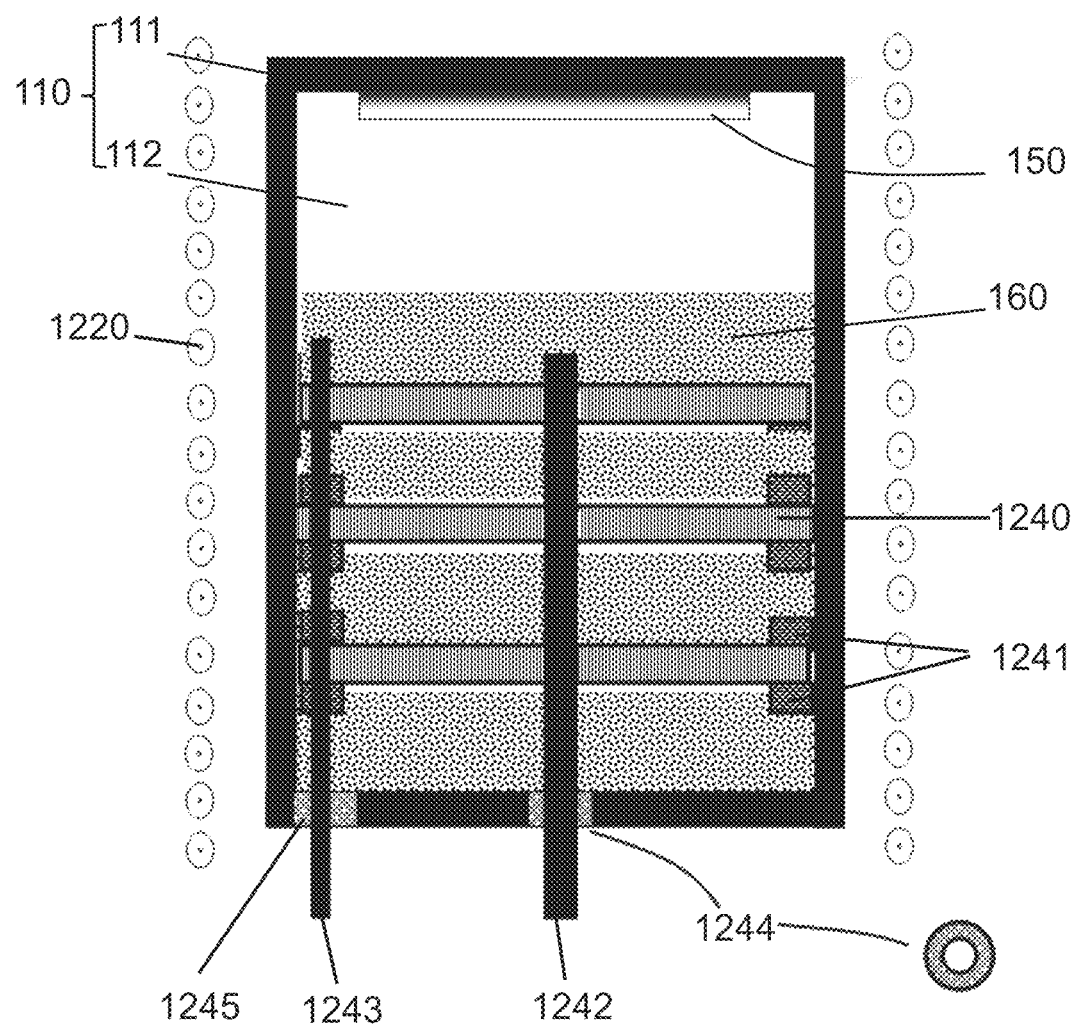
FIG. 15 is a schematic diagram illustrating exemplary crystal preparation device according to other embodiments of the present disclosure.

FIG. 15 is a schematic diagram illustrating an exemplary crystal preparation device according to other embodiments of the present disclosure.

As shown in FIG. 15, the crystal preparation device 100 may include the growth chamber 110 and the heating component 120. More descriptions regarding the growth chamber 110 may be found elsewhere in the present disclosure (e.g., FIG. 1 and the descriptions thereof), which may not be described herein.

In some embodiments, the heating component 120 may include at least two heating units. The at least two heating units may be configured to heat the growth chamber 110 to provide a temperature field required for the crystal growth to prepare the crystal, so that a radial temperature difference does not exceed a preset temperature difference threshold during the crystal growth. In some embodiments, at least one heating unit of the at least two heating units may be located outside the growth chamber 110. In some embodiments, the at least one heating unit located outside the growth chamber 110 may be referred to as the first heating component 1220. In some embodiments, the first heating component 1220 may be partially disposed around a periphery of the growth chamber 110. More descriptions regarding the first heating component 1220 disposed around the periphery of the growth chamber 110 may be found elsewhere in the present disclosure (e.g., FIG. 3 and the descriptions thereof), which may not be described herein. In some embodiments, the first heating component 1220 may include at least three first heating units. The at least three first heating units may correspond to positions of a crystallization region in the growth chamber, a source material region in the growth chamber, and a vapor transport region between the crystallization region and the source material region, respectively. More descriptions regarding the three first heating component disposed around the periphery of the growth chamber 110 may be found elsewhere in the present disclosure (e.g., FIG. 8, FIG. 9, and the descriptions thereof), which may not be described herein. In some embodiments, the first heating component 1220 may be located on an upper surface and/or a lower surface of the growth chamber 110. More descriptions regarding the first heating component 1220 located on the upper surface and/or the lower surface of the growth chamber 110 may be found elsewhere in the present disclosure (e.g., FIGS. 3-7 and the descriptions thereof), which may not be described herein.

In some embodiments, at least one heating unit of the at least two heating units may be located inside the growth chamber 110. In some embodiments, the at least one heating unit located inside the growth chamber 110 may be referred to as the second heating component 1240. The second heating component 1240 may include at least one second heating unit. More descriptions regarding the second heating component 1240 located inside the growth chamber 110 may be found elsewhere in the present disclosure (e.g., FIG. 13 and the descriptions thereof), which may not be described herein.

In some embodiments, the at least one heating unit of the second heating component 1240 may include at least one flow channel 1250. More descriptions regarding the at least one flow channel 1250 may be found elsewhere in the present disclosure (e.g., FIG. 14 and the descriptions thereof), which may not be described herein.

In some embodiments, when the growth chamber 110 is heated using the first heating component 1220, heat may be gradually decreased during a transmission process along a direction from the periphery of the growth chamber 110 to a central axis of the growth chamber 110 on a same horizontal plane. A temperature of the periphery of the growth chamber 110 may be larger than a temperature inside the growth chamber 110. Therefore, a radial temperature difference or a radial temperature gradient may be inside the growth chamber 110.

In order to reduce or eliminate the radial temperature difference and/or the radial temperature gradient, in some embodiments, the second heating component 1240 may include at least two flow channels. An opening density of at least one flow channel 1250 on a central region of the upper surface of the at least one heating unit may be larger than an opening density of at least one flow channel 1250 on an edge region of the at least one heating unit. In some embodiments, a density of at least one flow channel may be gradually decreased from the central region of the at least one heating unit to the edge region of the at least one heating unit. In some embodiments, an opening density of the at least one flow channel on the first flow channel circumference 1251 may be larger than an opening density of at least one flow channel on the second flow channel circumference 1252. The opening density of the at least one flow channel on the second flow channel circumference 1252 may be larger than an opening density of at least one flow channel on the third flow channel circumference 1253. The opening density of the at least one flow channel on the third flow channel circumference 1253 may be larger than an opening density of at least one flow channel on the fourth flow channel circumference 1254. In some embodiments, the opening density of the at least one flow channel 1250 may be decreased in step from the central region of the at least one heating unit to the edge region of the at least one heating unit. In some embodiments, the opening density of the at least one flow channel on the first flow channel circumference 1251 and the opening density of the at least one flow channel on the second flow channel circumference 1252 may be equal. The opening density of the at least one flow channel on the third flow channel circumference 1253 and the opening density of the at least one flow channel on the fourth flow channel circumference 1254 may be equal. The opening density of the at least one flow channel of the second flow channel circumference 1252 may be larger than the opening density of the at least one flow channel on the third flow channel circumference 1253.

In some embodiments, a radius r of the at least one flow channel 1250 may be determined in order to cause that the vapor components of the sublimated source material 160 can reach the seed crystal 150 through the flow channel to grow the crystal and the crystal growth efficiency can be ensured. In some embodiments, the radius r of the at least one flow channel 1250 may be within a range of 0.05 millimeters to 0.95 millimeters. In some embodiments, the radius r of the at least one flow channel 1250 may be within a range of 0.1 millimeters to 0.9 millimeters. In some embodiments, the radius r of the at least one flow channel 1250 within a range of 0.2 millimeters to 0.8 millimeters. In some embodiments, the radius r of the at least one flow channel 1250 may be within a range of 0.3 millimeters to 0.7 millimeters. In some embodiments, the radius r of the at least one flow channel 1250 may be within a range of 0.4 millimeters to 0.6 millimeters. In some embodiments, the radius r of the at least one flow channel 1250 may be within a range of 0.45 millimeters to 0.55 millimeters. In some embodiments, the radius r of the at least one flow channel 1250 may be 0.05 millimeters. In some embodiments, the radius r of the at least one flow channel 1250 may be 0.1 millimeters. In some embodiments, the radius r of the at least one flow channel 1250 may be 0.2 millimeters. In some embodiments, the radius r of the at least one flow channel 1250 may be 0.3 millimeters. In some embodiments, the radius r of the at least one flow channel 1250 may be 0.4 millimeters. In some embodiments, the radius r of the at least one flow channel 1250 may be 0.5 millimeters. In some embodiments, the radius r of the at least one flow channel 1250 may be 0.6 millimeters. In some embodiments, the radius r of the at least one flow channel 1250 may be 0.7 millimeters. In some embodiments, the radius r of the at least one flow channel 1250 may be 0.8 millimeters. In some embodiments, the radius r of the at least one flow channel 1250 may be 0.9 millimeters. In some embodiments, the radius r of the at least one flow channel 1250 may be 0.95 millimeters.

In some embodiments, a central spacing distance between two adjacent flow channels on the flow channel circumference may be represented as $4r<d<10r$. In some embodiments, the central spacing distance between two adjacent flow channels on the flow channel circumference may be represented as $5r<d<9r$. In some embodiments, the central spacing distance between two adjacent flow channels on the flow channel circumference may be represented as $6r<d<8r$. In some embodiments, the central spacing distance between two adjacent flow channels on the flow channel circumference may be represented as $6.5r<d<7.5r$. In some embodiments, the central spacing distance between two adjacent flow channels on the flow channel circumference may be represented as $6.8r<d<7r$.

In order to cause that an appropriate amount of source material can be placed on an upper surface of the heating unit to ensure the crystal growth efficiency, in some embodiments, the central spacing distance of two adjacent flow channels on a flow channel circumference may be within a range of 1 millimeter to 2 millimeters. In some embodiments, the central spacing distance of two adjacent flow channels on the flow channel circumference may be within a range of 1.1 millimeters to 1.9 millimeters. In some embodiments, the central spacing distance of two adjacent flow channels on the flow channel circumference may be within a range of 1.2 millimeters to 1.8 millimeters. In some embodiments, the central spacing distance of two adjacent flow channels on the flow channel circumference may be within a range of 1.3 millimeters to 1.7 millimeters. In some embodiments, the central spacing distance of two adjacent flow channels on the flow channel circumference may be within a range of 1.4 millimeters to 1.6 millimeters. In some embodiments, the central spacing distance of two adjacent flow channels on the flow channel circumference may be within a range of 1.45 millimeters to 1.55 millimeters. In some embodiments, the central spacing distance may be 1 millimeter. In some embodiments, the central spacing distance may be 1.1 millimeters. In some embodiments, the central spacing distance may be 1.2 millimeters. In some embodiments, the central spacing distance may be 1.3 millimeters. In some embodiments, the central spacing distance may be 1.4 millimeters. In some embodiments, the central spacing distance may be 1.5 millimeters. In some embodiments, the central spacing distance may be 1.6 millimeters. In some embodiments, the central spacing distance may be 1.7 millimeters. In some embodiments, the central spacing distance may be 1.8 millimeters. In some embodiments, the central spacing distance may be 1.9 millimeters. In some embodiments, the central spacing distance may be 2 millimeters. In some embodiments, the central spacing distance may be 2.1 millimeters. In some embodiments, the central spacing distance may be 2.2 millimeters.

In some embodiments, when $4r<R_n-R_{n-1}<12r$, $R_n-R_{n-1}$ may be equal to $(R_2-R_1)\exp^{((n-1)\times 0.02+0.009)}$. In some embodiments, when $5r<R_n-R_{n-1}<11r$, $R_n-R_{n-1}$ may be equal to $(R_2-R_1)\exp^{((n-1)\times 0.02+0.009)}$. In some embodiments, when $6r<R_n-R_{n-1}<10r$, $R_n-R_{n-1}$ may be equal to $(R_2-R_1)\exp^{((n-1)\times 0.02+0.009)}$. In some embodiments, when $7r<R_n-R_{n-1}<9r$, $R_n-R_{n-1}$ may be equal to $(R_2-R_1)\exp^{(n-1)\times 0.02+0.009)}$. In some embodiments, when $7.5r<R_n-R_{n-1}<8.5r$, $R_n-R_{n-1}$ may be equal to $(R_2-R_1)\exp^{(n-1)\times 0.02+0.009)}$.

In some embodiments, when $R_n-R_{n-1}>12r$, $R_n-R_{n-1}$ may be 12r. In some embodiments, when $R_n-R_{n-1}>13r$, $R_n-R_{n-1}$ may be 12r. In some embodiments, when $R_n-R_{n-1}>14r$, $R_n-R_{n-1}$ may be 12r. In some embodiments, when $R_n-R_{n-1}>15r$, $R_n-R_{n-1}$ may be 12r. In some embodiments, when $R_n-R_{n-1}>16r$, $R_n-R_{n-1}$ may be 12r. In some embodiments, a radius $R_1$ of the first flow channel circumference 1251 close to the central region of the heating unit may be within a range of 1 millimeter to 20 millimeters. In some embodiments, $R_1$ may be within a range of 2 millimeters to 19 millimeters. In some embodiments, $R_1$ may be within a range of 3 millimeters to 18 millimeters. In some embodiments, $R_1$ may be within a range of 4 millimeters to 17 millimeters. In some embodiments, $R_1$ may be within a range of 5 millimeters to 16 millimeters. In some embodiments, $R_1$ may be within a range of 6 millimeters to 15 millimeters. In some embodiments, $R_1$ may be within a range of 7 millimeters to 14 millimeters. In some embodiments, $R_1$ may be within a range of 8 millimeters to 13 millimeters. In some embodiments, $R_1$ may be within a range of 9 millimeters to 12 millimeters. In some embodiments, $R_1$ may be within a range of 10 millimeters to 11 millimeters. In some embodiments, $R_1$ may be 10 millimeters. In some embodiments, a radius $R_2$ of the second flow channel circumference 1252 may be within a range of 2 millimeters to 25 millimeters. In some embodiments, $R_2$ may be within a range of 3 millimeters to 24 millimeters. In some embodiments, $R_2$ may be within a range of 4 millimeters to 23 millimeters. In some embodiments, $R_2$ may be within a range of 5 millimeters to 22 millimeters. In some embodiments, $R_2$ may be within a range of 6 millimeters to 21 millimeters. In some embodiments, $R_2$ may be within a range of 7 millimeters to 20 millimeters. In some embodiments, $R_2$ may be within a range of 8 millimeters to 19 millimeters. In some embodiments, $R_2$ may be within a range of 9 millimeters to 18 millimeters. In some embodiments, $R_2$ may be within a range of 10 millimeters to 17 millimeters. In some embodiments, $R_2$ may be within a range of 11 millimeters to 16 millimeters. In some embodiments, $R_2$ may be within a range of 12 millimeters to 15 millimeters. In some embodiments, $R_2$ may be within a range of 13 millimeters to 14 millimeters. In some embodiments, $R_2$ may be 10.5 millimeters. In some embodiments, $R_2$ may be 11 millimeters. In some embodiments, $R_2$ may be 11.5 millimeters. In some embodiments, $R_2$ may be 12 millimeters. In some embodiments, $R_2$ may be 12.4 millimeters. In some embodiments, $R_2$ may be 12.5 millimeters. In some embodiments, $R_2$ may be 13 millimeters. In some embodiments, $R_2$ may be 13.5 millimeters. In some embodiments, $R_2$ may be 14 millimeters.

In some embodiments, the heating component 120 may also include at least one conduction electrode. In some embodiments, the at least one conduction electrode may include a low resistance graphite electrode. In some embodiments, a shape of the at least one conduction electrode may be a cylindrical shape. In some embodiments, a cross-sectional shape of the at least one conduction electrode may be a regular shape (e.g., a circle, a triangle, a quadrangle, a pentagon, a hexagon) or an irregular shape. In some embodiments, the cross-sectional shapes of the at least one conduction electrode may be the same or different. In some embodiments, a count of the at least one conduction electrode may be 2, 3, 4, 5, etc.

In some embodiments, the heating component 120 may include at least two conduction electrodes. In some embodiments, the at least two conduction electrodes may be arranged circumferentially on an edge region of the at least one heating unit. In some embodiments, one conduction electrodes of the at least two conduction electrodes may be fixed to a center of the at least one heating unit, and the remaining conduction electrodes of the at least two conduction electrodes may be arranged in a circle with the conduction electrode located at the center of the at least one heating unit as a center. In some embodiments, a count of the at least two conduction electrodes may be four. The four conduction electrodes may include a first conduction electrode 1242, a second conduction electrode 1243, a third conduction electrode (not shown in FIG. 15), and a fourth conduction electrode (not shown in FIG. 15). In some embodiments, the first conduction electrode 1242 may be located at the center of the at least one heating unit, and the second conduction electrode 1243, the third conduction electrode, and the fourth conduction electrode may be arranged uniformly in a circle with the first conduction electrode as a center In some embodiments, a diameter of the conduction electrode (e.g., the first conduction electrode 1242) located at the center of the at least one heating unit may be larger than a diameter of the conduction electrode arranged circumferentially at the edge region of the at least one heating unit. In some embodiments, the diameter of the conduction electrode located at the center of the at least one heating unit may be within a range of 13 millimeters to 20 millimeters. In some embodiments, the diameter of the conduction electrode located at the center of the at least one heating unit may be within a range of 14 millimeters to 19 millimeters. In some embodiments, the diameter of the conduction electrode located at the center of the at least one heating unit may be within a range of 15 millimeters to 18 millimeters. In some embodiments, the diameter of the conduction electrode located at the center of the at least one heating unit may be within a range of 16 millimeters to 17 millimeters.

In some embodiments, diameters of the conduction electrodes (e.g., the second conduction electrode 1243, the third conduction electrode, and the fourth conduction electrode) arranged circumferentially at the edge region of the at least one heating unit may be the same or different. In some embodiments, the diameter of the conduction electrode arranged circumferentially at the edge region of the at least one heating unit may be within a range of 5 millimeters to 13 millimeters. In some embodiments, the diameter of the conduction electrode arranged circumferentially at the edge region of the at least one heating unit may be within a range of 6 millimeters to 12 millimeters. In some embodiments, the diameter of the conduction electrode arranged circumferentially at the edge region of the at least one heating unit may be within a range of 7 millimeters to 11 millimeters. In some embodiments, the diameter of the conduction electrode arranged circumferentially at the edge region of the at least one heating unit may be within a range of 8 millimeters to 10 millimeters. In some embodiments, the diameter of the conduction electrode arranged circumferentially at the edge region of the at least one heating unit may be within a range of 8.5 millimeters to 9.5 millimeters.

The growth chamber 110 may be disposed with at least two electrode insertion pillars. In some embodiments, the at least two electrode insertion pillars may be disposed at a bottom portion of the growth chamber 110. In some embodiments, the at least two electrode insertion pillars may be hollow columns used for mounting the at least two conduction electrodes. In some embodiments, a material of the at least two electrode insertion pillars may be an insulation material for isolating the at least two conduction electrodes to prevent short circuits. In some embodiments, the material of the at least two electrode insertion pillars may include zirconia. In some embodiments, a shape, a size, and/or a count of the at least two electrode insertion pillars may be the same as a cross-sectional shape, a cross-sectional size, and/or a count of the at least two conduction electrodes. In some embodiments, the count of the at least two electrode insertion pillars may be four. The four electrode insertion pillars may include a first electrode insertion pillar 1244, a second electrode insertion pillar 1245, a third electrode insertion pillar (not shown in FIG. 15), and a fourth electrode insertion pillar (not shown in FIG. 15).

In some embodiments, the at least one heating unit may be disposed with at least two first electrode holes. In some embodiments, a shape of the at least two first electrode holes may include a regular shape (e.g., a circle, a triangle, a quadrangle, a pentagon, a hexagon) or an irregular shape. In some embodiments, a count of the at least two first electrode holes may be 2, 3, 4, 5, etc. In some embodiments, a shape, a size, and/or the count of the at least two of the first electrode holes may be the same as the cross-sectional shape, the cross-sectional size, and/or the count of the at least two conduction electrodes.

Figure 16A:
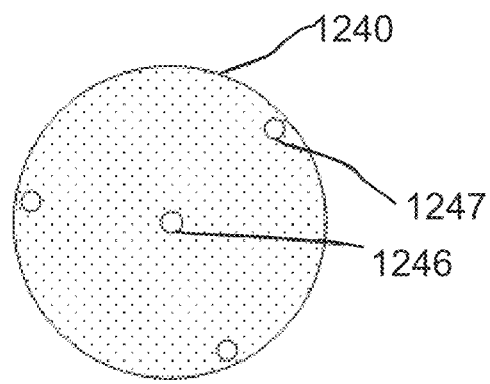
FIG. 16A is a top view illustrating exemplary at least one heating unit according to some embodiments of the present disclosure.
Figure 16B:
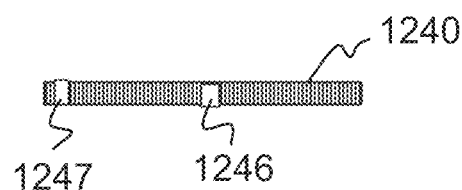
FIG. 16B is a lateral view illustrating exemplary at least one heating unit according to some embodiments of the present disclosure.

FIG. 16A is a top view illustrating exemplary at least one heating unit according to some embodiments of the present disclosure. FIG. 16B is a lateral view illustrating exemplary at least one heating unit according to some embodiments of the present disclosure.

As shown in FIGS. 16A-16B, a count of the at least two first electrode holes may be four. The four first electrode holes may include one first electrode hole A 1246 located at a center of the at least one heating unit and three first electrode holes B 1247 arranged circumferentially at an edge region of the at least one heating unit respectively.

In some embodiments, the heating component 120 may include a copper wire (not shown in FIGS. 16A-16B) and a power source (not shown in FIGS. 16A-16B). At least two conduction electrodes may be connected to the power source, respectively, to cause the at least two conduction electrodes, the at least one heating unit, and the power source to form a current path for heating the at least one heating unit.

In some embodiments, the heating component 120 may also include at least one conduction ring 1241. The at least one heating unit may be connected to the at least one conduction ring 1241 through the at least one conduction electrode. In some embodiments, the at least one conduction ring 1241 may be located on an upper surface and/or a lower surface of the at least one heating unit inside the growth chamber 110. A count of the at least one conduction ring 1241 and a count of the at least one heating unit may be the same or different. In some embodiments, the count of the at least one conduction ring 1241 may be twice the count of the at least one heating unit. In some embodiments, a material of the at least one conduction ring 1241 may include graphite, tungsten, molybdenum, tantalum, ruthenium, or the like, or any combination thereof. In some embodiments, except for a surface in contact with the at least one heating unit on the at least one conduction ring 1241, other surfaces on the at least one conduction ring 1241 may be coated with a high temperature resistant carbide coating. In some embodiments, the carbide coating may include tantalum carbide, tungsten carbide, niobium carbide, titanium carbide, etc. Similarly, except for a surface (e.g., an edge portion) in contact with the at least one conduction ring 1241 on the at least one heating unit, other surfaces on the at least one heating unit may be coated with a high temperature resistant carbide coating.

In some embodiments, the at least one conduction ring 1241 may be detachably connected to the growth chamber 110. A detachable connection between the at least one conduction ring 1241 and the growth chamber 110 may be the same as a detachable connection between the at least one heating unit and the growth chamber 110, which may not be described herein.

The at least one conduction ring 1241 may be disposed with at least one second electrode hole 1248. In some embodiments, a shape and a size of the at least one second electrode hole may be the same as a cross-sectional shape and a cross-sectional size of the at least one conduction electrode. In some embodiments, a count and/or an arrangement of the at least one second electrode hole and a count and/or an arrangement of the at least one conduction electrode may be the same or different. In some embodiments, a count of the at least one second electrode hole may be equal to the count of the at least one conduction electrode. In some embodiments, the count of the at least one second electrode hole may be one less than the count of the at least one conduction electrode.

Figure 17:
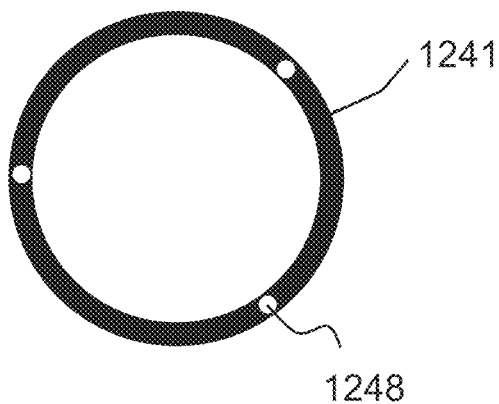
FIG. 17 is a schematic diagram illustrating an exemplary conduction ring according to some embodiments of the present disclosure.

FIG. 17 is a schematic diagram illustrating an exemplary conduction ring according to some embodiments of the present disclosure.

As shown in FIG. 17, a count of the at least one second electrode hole 1248 may be three. The three second electrode holes 1248 may be circumferentially arranged in an edge region of the at least one conduction ring 1241.

In some embodiments, at least a portion of the at least two conduction electrodes may pass through the at least two second electrode holes 1248 and be connected with the at least one conduction ring 1241. The at least two conduction electrodes may be connected with a power source through copper wires respectively to cause the at least two conduction electrodes, the at least one conduction ring 1241, the at least one heating unit, and the power source to form a current path for heating the at least one heating unit and the at least one conduction ring 1241. The at least one conduction ring 1241 may be used to uniformly distribute heat to reduce a radial temperature difference and/or a radial temperature gradient in the growth chamber 110.

Figure 18:
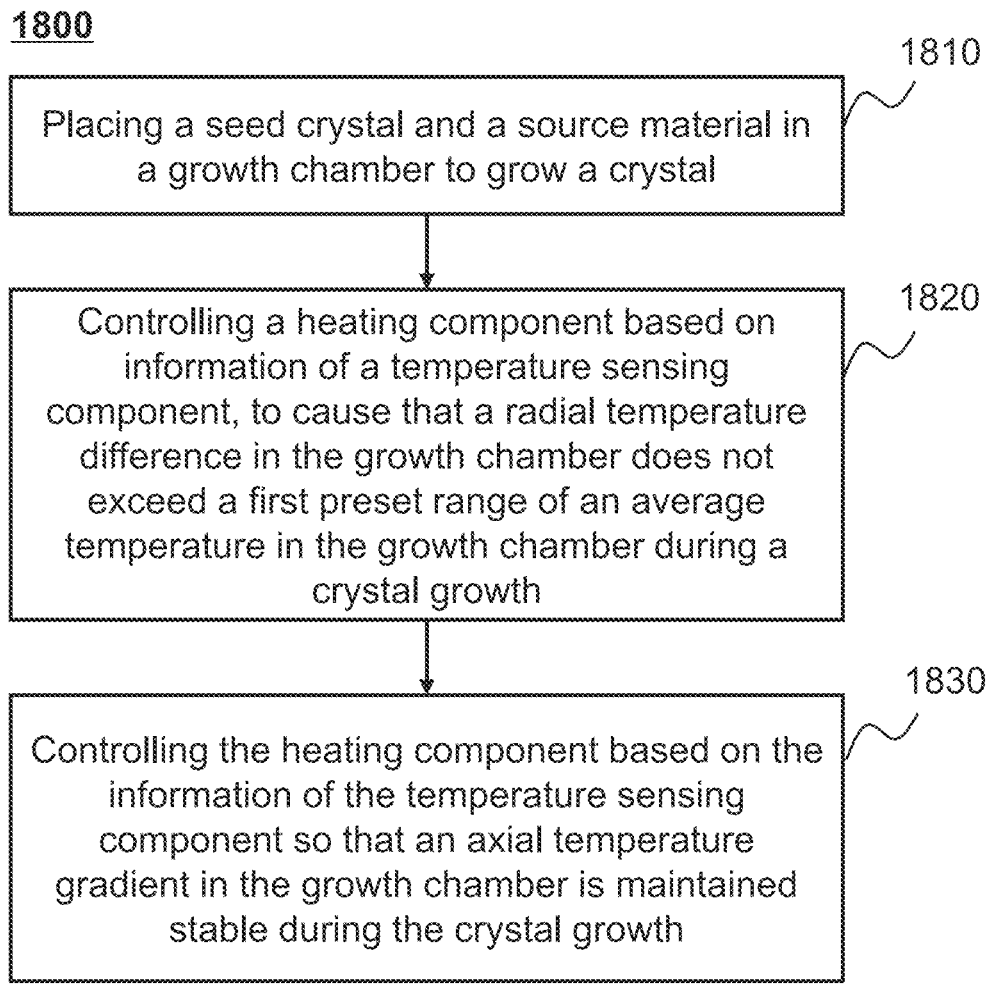
FIG. 18 is a flowchart illustrating an exemplary process for crystal growth according to some embodiments of the present disclosure.

FIG. 18 is a flowchart illustrating an exemplary process for crystal growth according to some embodiments of the present disclosure.

In 1810, a seed crystal and a source material may be placed in a growth chamber to grow a crystal.

The seed crystal may refer to a small crystal including a crystal orientation the same as that of a crystal to be grown. The seed crystal may be used as a seed of the crystal growth. In some embodiments, the seed crystal may be prepared based on physical vapor transport (PVT), chemical vapor deposition (CVD), a Czochralski technique, etc. In some embodiments, the seed crystal may be prepared at least by splicing processing and a gap growth. More descriptions regarding the preparation of the seed crystal may be found elsewhere in the present disclosure (e.g., FIG. 22, FIG. 23, and the descriptions thereof), which may not be described herein. In some embodiments, as shown in FIG. 1, the seed crystal may be fixed in an inner side surface of the growth chamber cover 111.

The source material may include a material supplied for the seed crystal to grow into a crystal. In some embodiments, a component of a source material of a silicon carbide crystal may include SiC. In some embodiments, a component of a source material of an aluminum nitride crystal may include AlN. In some embodiments, the source material may include a powder material, a particulate material, and/or a block material. In some embodiments, a shape of the block material may include a square, a rectangle, an irregular block, etc. In some embodiments, the source material may be placed within the growth chamber body 112. As shown in FIG. 1, FIG. 3, or FIG. 8, the source material may be placed at a lower portion of the growth chamber body 112. As shown in FIG. 13 or FIG. 15, the source material may be placed on an upper surface of the at least one heating unit inside the growth chamber 110.

More descriptions regarding the growth chamber may be found elsewhere in the present disclosure (e.g., FIG. 1, FIG. 3, and the descriptions thereof), which may not be described herein.

More descriptions regarding placing the seed crystal and the source material in the growth chamber may be found elsewhere in the present disclosure (e.g., FIG. 13, FIG. 15, FIG. 19, and the descriptions thereof), which may not be described herein.

More descriptions regarding the heating component and the heating sensing component may be found elsewhere in the present disclosure (e.g., FIGS. 1-16 and the descriptions thereof), which may not be described herein.

In some embodiments, a mounting position of the temperature sensing component may be determined based on a position of a temperature distribution of the growth chamber 110 to be measured. In some embodiments, the temperature sensing component may be located on the upper surface of the growth chamber 110 for measuring a temperature distribution of a lower surface or a crystal growth surface of the seed crystal. In some embodiments, the temperature sensing component may be located at a lower surface of the growth chamber 110 for measuring a temperature distribution of an upper surface of the source material. In some embodiments, the temperature sensing component may also be located on an outer wall of the growth chamber 110 for measuring a temperature distribution of a peripheral area of the growth chamber 110.

In 1820, the heating component may be controlled based on information of the temperature sensing component, to cause that a radial temperature difference in the growth chamber does not exceed a first preset range of an average temperature in the growth chamber during the crystal growth.

More descriptions regarding the control component, the heating sensing component, the information of the temperature sensing component, the radial temperature difference, and the radial temperature difference threshold may be found elsewhere in the present disclosure (e.g., FIG. 1, FIG. 2, and the descriptions thereof), which may not be described herein.

In some embodiments, the average temperature in the growth chamber may include an average temperature of the lower surface of the seed crystal or the crystal being grown in the growth chamber, an average temperature of the upper surface of the source material in the growth chamber, etc. In some embodiments, the average temperature in the growth chamber may also include a crystal growth temperature. In some embodiments, the control component may be configured to control at least one parameter of the at least one heating unit in the heating component based on the temperature distribution in the growth chamber during the crystal growth, to cause that the radial temperature difference in the growth chamber does not exceed the first preset range of the average temperature in the growth chamber or the radial temperature difference threshold during the crystal growth. In some embodiments, the temperature sensing component 210 may measure the temperature information in the chamber and transmit the measured temperature information to the control component 230. The control component 230 may generate a radial temperature difference distribution and/or a radial temperature gradient distribution based on the temperature information measured by the temperature sensing component 210. The control component 230 may also be configured to determine the first preset range, the preset radial temperature difference threshold, and/or the preset radial temperature gradient threshold based on a size of the growth chamber 110, a shape of the growth chamber 110, a material of the growth chamber 110, a size of the seed crystal, a type of the crystal to be grown, a size of the crystal to be grown, etc. The control component 230 may further compare the radial temperature difference in the radial temperature difference distribution with the preset radial temperature difference threshold, or compare the radial temperature gradient in the radial temperature gradient distribution with the preset radial temperature gradient. If the radial temperature difference is larger than the preset radial temperature difference threshold, or the radial temperature gradient is larger than the preset radial temperature gradient threshold, in some embodiments, as shown in FIG. 3 or FIG. 8, the control component 230 may increase a heating power of the at least one heating unit arranged in the central area of the growth chamber. In some embodiments, when a temperature in a central region of the growth chamber is higher than a temperature in a peripheral region of the growth chamber, as shown in FIG. 13, a current passing through at least one conduction electrode in a central region of the heating unit may be decreased or a current passing through at least one conduction electrode in an edge region of the heating unit may be increased. In some embodiments, when the temperature in the central region of the growth chamber is lower than the temperature in the peripheral region of the growth chamber, as shown in FIG. 15, the current passing through the at least one conduction electrode in the central region of the heating unit may be increased or the current passing through the at least one conduction electrode in the edge region of the heating unit may be decreased to reduce the radial temperature difference and/or the radial temperature gradient until the radial temperature difference does not exceed the first preset range of the average temperature in the growth chamber or the preset radial temperature difference threshold and the radial temperature gradient does not exceed the preset radial temperature gradient threshold. More descriptions regarding a control process of a temperature control system may be found elsewhere in the present disclosure (e.g., FIG. 2 and the descriptions thereof), which may not be described herein.

In 1830, during the crystal growth, the heating component may be controlled based on the information of the temperature sensing component so that an axial temperature gradient in the growth chamber is maintained stable.

More descriptions regarding the control component and the axial temperature gradient may be found elsewhere in the present disclosure (e.g., FIG. 1, FIG. 2, and the descriptions thereof), which may not be described herein.

In some embodiments, the control component 230 may also control the at least one parameter of the at least one heating unit in the heating component 220 based on the temperature distribution in the growth chamber during the crystal growth, so that the axial temperature gradient in the growth chamber is maintained stable during the crystal growth. In some embodiments, the control component 230 may also control the at least one parameter of the at least one heating unit in the heating component 220 based on the temperature distribution in the growth chamber during the crystal growth, so that the axial temperature gradient in the growth chamber is maintained in a preset axial temperature gradient range during the crystal growth. In some embodiments, the temperature sensing component 210 may measure an axial temperature of the growth chamber and transmit the measured axial temperature to the control component 230. The control component 230 may generate an axial temperature gradient distribution based on the axial temperature measured by the temperature sensing component 210. The control component 230 may also be configured to determine the preset axial temperature gradient range based on the size of the growth chamber 110, the shape of the growth chamber 110, the material of the growth chamber 110, the size of the seed crystal, the type of the crystal to be grown, the size of the crystal to be grown, etc. The control component 230 may further compare the axial temperature gradient in the axial temperature gradient distribution with the preset axial temperature gradient range. If the axial temperature gradient is less than the preset axial temperature gradient range, the control component 230 may decrease a heating power of the at least one heating unit arranged in a periphery of the growth chamber close to the growth chamber cover to increase the axial temperature gradient until the axial temperature gradient is in the preset axial temperature gradient range. If the axial temperature gradient is larger than the preset axial temperature gradient range, the control component 230 may increase the heating power of the at least one heating unit arranged in the periphery of the growth chamber close to the growth chamber cover to reduce the axial temperature gradient until the axial temperature gradient is in the preset axial temperature gradient range. More descriptions regarding a control process of the temperature control system on the axial temperature gradient may be found elsewhere in the present disclosure (e.g., FIG. 2 and the descriptions thereof), which may not be described herein.

It should be noted that the above description of the process 1800 is merely provided for illustration, and not intended to limit the scope of the present disclosure. For persons having ordinary skills in the art, multiple variations and modifications may be made to the process 1800 under the teachings of the present disclosure. However, those variations and modifications do not depart from the scope of the present disclosure. For example, operation 1820 and operation 1830 may be performed synchronously.

Some embodiments also disclose a process for crystal growth. A semiconductor crystal may be prepared based on the process using the crystal preparation device 100. For convenience, the following may be described by taking preparing a silicon carbide single crystal as an example. The process may include the following operations.

In operation 1, a seed crystal may be bonded to an inner side surface of the growth chamber cover 111, and a source material may be placed into the growth chamber body 112. The growth chamber cover 111 with the seed crystal bonded may be covered to the growth chamber body 112.

First, an adhesion agent may be uniformly covered on the inner side surface of the growth chamber cover 111, and then the growth chamber cover 111 coated with the adhesion agent may be placed in a heating furnace. The growth chamber cover 111 may be maintained for 5 hours in a temperature range of 150° C. to 180° C. The temperature may be increased to 200° C. and the temperature may be maintained for 7 hours to 10 hours. When the temperature is cooled to room temperature, the growth chamber cover 111 may be taken out. The seed crystal may be then placed at a center of the inner side surface of the growth chamber cover 111, a silicon carbide single wafer may be placed on the seed crystal, and a stainless steel block may be placed on the silicon carbide single wafer. The growth chamber cover 111 may be then placed in the heating furnace and maintained for 5 hours in a temperature range of 380° C. to 430° C. When the temperature is cooled to room temperature, the growth chamber cover 111 may be taken out.

A direction of a growth surface of the seed crystal may be <0001> deflecting 4 degrees to 6 degrees pointing to a direction of [11$\bar{2}$0]. The adhesion agent may include epoxy resin, an AB glue, phenolic resin, a sugar glue, etc. In some embodiments, the adhesion agent may include a sucrose with a purity of 99.9%. The stainless steel block may be used to apply a certain pressure to the silicon carbide single wafer, the seed crystal, and the growth chamber cover 111 to promote that the seed crystal is bonded to the inner side surface of the growth chamber cover 111. During the process for bonding and fixing the seed crystal, due to reasons such as the non-uniformity of the adhesion agent, a poor machining accuracy of the inner side surface of the growth chamber cover, etc., bubbles or voids may be caused between a rear surface of the seed crystal and the inner side surface of the growth chamber cover 111, further causing crystal defects. Therefore, when the seed crystal is placed at the center of the inner side surface of the growth chamber cover 111, it is necessary to avoid the occurrence of the bubbles or voids. In some embodiments, before the seed crystal is bonded to the inner side surface of the growth chamber cover 111, the seed crystal may be cleaned to remove contaminants on the surface of the seed crystal. In some embodiments, the seed crystal may be cleaned with deionized water, an organic solvent, etc.

Next, the source material (e.g., silicon carbide powder) may be placed in the growth chamber body 112 and a distance between the upper surface of the source material and the crystal growth surface may be within a range of 30 millimeters to 50 millimeters. In some embodiments, the source material may be in a powder form. A particle diameter of the source material may be within a range of 30 microns to 50 microns. A surface of the source material placed in the growth chamber body 112 may be maintained flat.

After the source material is placed into the growth chamber body 112, the growth chamber cover 111 with the seed crystal bonded may be bonded to a top portion of the growth chamber body 112 to form a closed space to facilitate the crystal growth.

In operation 2, the first heating component 1220 may be disposed outside the growth chamber 110.

As described in FIG. 3, the heating component may include the first heating component 1220 and the temperature compensation component 1210. The first heating component 1220 may include an induction coil. The first heating component 1220 may be located at the periphery of the growth chamber 110 for providing at least a portion of heat required for the crystal growth. When the induction coil is energized, the growth chamber 110 may be heated. The source material (e.g., the silicon carbide powder) may be heated and may be decomposed and sublimated to vapor components (e.g., Si2C, SiC2, Si) under a high temperature condition. The vapor components may be transported to the surface of the seed crystal with a relatively low temperature driven by the axial temperature gradient and may crystallize to form the crystal (e.g., the silicon carbide crystal). In some embodiments, the axial temperature gradient may be controlled by controlling heating powers of the induction coil at different positions in an axial direction.

If the growth chamber 110 is only heated by the induction coil disposed in the periphery of the growth chamber 110, a region close to an inner wall of the growth chamber 110 may be a high temperature region, and a region close to a center of the source material may be a low temperature region. Accordingly, the radial temperature gradient in the source material coverage region may be relatively large, which is not conducive to the sublimation of the source material and the stable growth of the crystal. In some embodiments, since the radial temperature gradient of the source material coverage region is large, a Si/C molar ratio of the vapor components of the sublimated source material may be relatively large in the high temperature region close to the inner wall of the growth chamber 110, and a Si/C molar ratio of the vapor components of the sublimated source material may be relatively small in the low temperature region close to the center of the source material coverage region, resulting in that a radial distribution of the Si/C molar ratio of the vapor component may be non-uniform, which is not conducive to the stable growth of the crystal. In addition, for the growth chamber cover 111, a region close to a periphery of the growth chamber cover 111 may be a high temperature region, and a region close to a center of the growth chamber cover 111 may be a low temperature region. Accordingly, the radial temperature gradient on the growth chamber cover 111 may be relatively large, which causes a large thermal stress on the crystal growth surface, a severe convex of the crystal growth surface toward a direction of the source material, and defects on a fixing surface of the seed crystal. Therefore, a temperature compensation device may be disposed on the upper surface and/or the lower surface of the growth chamber 110 to reduce the radial temperature gradient of the growth chamber cover 111 and the radial temperature gradient in the source material coverage region. More descriptions regarding the radial temperature gradient may be found elsewhere in the present disclosure (e.g., FIG. 1 and the descriptions thereof), which may not be described herein.

In operation 3, the temperature compensation component 1210 may be mounted to the upper surface and/or the lower surface of the growth chamber 110.

In some embodiments, the fixing frame 1216 including at least one fixing unit may be fixed to the upper surface or the lower surface of the growth chamber 110, and at least one heating unit 1212 of the temperature compensation component 1210 may be filled and fixed into the at least one fixing unit. An electrode fixing plate 1215 may be then covered, and at least one first electrode 1213 may be fixed to the at least one heating unit 1212 by causing the at least one first electrode 1213 to pass through at least one first holes 1215-1 on the electrode fixing plate 1215. At least one second electrode 1211 may be fixed to the upper surface or the lower surface of the growth chamber 110 by causing the at least one second electrode 1211 to pass through at least one second holes 1215-2 on the electrode fixing plate 1215 simultaneously. Further, upper ends of the at least one first electrode 1213 and the at least one second electrode 1211 may be connected to the copper wire 1214 respectively. The copper wire 1214 may be connected to a power source.

In some embodiments, a count, a size, a shape, an arrangement, etc. of the at least one heating unit 1212 may be determined based on a size of the upper surface or the lower surface of the growth chamber 110, a type of crystal to be grown, a size or the shape of the seed crystal, a temperature (the axial temperature gradient and/or the radial temperature gradient) distribution in the growth chamber 110, etc. In some embodiments, when a silicon carbide crystal with a size of 4 inches to 10 inches is to be grown, 10 to 20 heating units 1212 may be arranged on the upper surface of the growth chamber cover. In some embodiments, a thickness of the at least one heating unit 1212 may be within a range of 5 millimeters to 10 millimeters. In some embodiments, the thickness of the at least one heating unit 1212 may be within a range of 6 millimeters to 9 millimeters. In some embodiments, the thickness of the at least one heating unit 1212 may be within a range of 7 millimeters to 8 millimeters. Taking the shape of the heating unit 1212 being a hexagon as an example, a side length of the at least one heating unit 1212 may be within a range of 10 millimeters to 30 millimeters. In some embodiments, the side length of the at least one heating unit 1212 may be within a range of 12 millimeters to 28 millimeters. In some embodiments, the side length of the at least one heating unit 1212 may be within a range of 14 millimeters to 26 millimeters. In some embodiments, the side length of the at least one heating unit 1212 may be within a range of 16 millimeters to 24 millimeters. In some embodiments, the side length of the at least one heating unit 1212 may be within a range of 18 millimeters to 22 millimeters. In some embodiments, the side length of the at least one heating unit 1212 may be within a range of 20 millimeters to 21 millimeters.

In operation 4, at least one temperature sensing unit may be connected to the heating unit 132 and a periphery of the upper surface or the lower surface of the growth chamber 110 through at least two thermometer holes 1215-3. The at least two thermometer holes 1215-3 may be located between adjacent first holes 1215-1 along the radial direction or within a setting range of at least one second hole 1215-2.

In some embodiments, the at least one temperature sensing unit may measure a first temperature at the at least one heating unit 1212 and a second temperature at the periphery of the upper surface or the lower surface of the growth chamber 110 through the at least two thermometer holes 1215-3 to obtain a temperature distribution on the periphery of the upper surface or the lower surface of the growth chamber 110.

In operation 5, an inert gas (e.g., argon) may be introduced into the growth chamber 110, a pressure may be controlled in a range of 5 Torr to 30 Torr, and the growth chamber 110 may be heated by the first heating component 1220 and the temperature compensation component 1210.

In operation 6, the first temperature at the at least one heating unit 1212 and the second temperature at the periphery of the upper surface or the lower surface of the growth chamber 110 may be measured by the at least one temperature sensing unit, and a parameter (e.g., a count, a shape, a size, an arrangement, a current, a heating power) of the at least one heating unit 1212 may be adjusted based on the first temperature and the second temperature, thereby causing that the radial temperature gradient on the upper surface or the lower surface of the growth chamber 110 does not exceed a preset radial temperature gradient threshold and a uniform crystal growth is promoted. More descriptions regarding the adjusting the parameter of the at least one heating unit 1212 based on the first temperature and the second temperature may be found elsewhere in the present disclosure (e.g., FIG. 6, FIG. 7, and the descriptions thereof), which may not be described herein.

In some embodiments, during the crystal growth, a temperature of the growth chamber 110 may be maintained within a range of 2200° C. to 2400° C. when the source material is sublimated, and a duration of the sublimation of the source material may be within a range of 40 hours to 60 hours. In some embodiments, during the crystal growth, a temperature of the growth chamber cover 111 may be within a range of 2100° C. to 2350° C., and the first temperature at the at least one heating unit 1212 at the upper surface of the growth chamber 110 may be less than the second temperature at the periphery of the growth chamber cover 111. A temperature difference between the first temperature and the second temperature may be maintained less than 10 K.

The above preparation process is merely provided for illustration purposes, process parameters involved in different embodiments may be the same or different. A sequence of the above operations may not be unique, and the sequence between the operations may be adjusted in different embodiments. One or more operations may be omitted. The above examples should not be intended to limit the scope of the present disclosure.

FIG. 19 is a flowchart illustrating an exemplary process for growing a crystal according to some embodiments of the present disclosure.

Some embodiments also disclose a process for crystal growth. A semiconductor crystal may be prepared based on the process using the crystal preparation device 100. For convenience, the following may be described by taking preparing a silicon carbide single crystal as an example. The process may include the following operations.

In 1910, a seed crystal may be placed at a top portion of a growth chamber, and the source material may be placed at a bottom portion of the growth chamber.

The seed crystal may be bonded to an inner side surface of the growth chamber cover 111, and the source material may be placed into the growth chamber body 112. The growth chamber cover 111 with the seed crystal bonded may be covered to a top portion of the growth chamber body 112.

First, an adhesion agent may be uniformly covered on the inner side surface of the growth chamber cover 111, and then the growth chamber cover 111 coated with the adhesion agent may be placed in a heating furnace. The growth chamber cover 111 may be maintained for 5 hours in a temperature range of 150° C. to 180° C. The temperature may be increased to 200° C., and the temperature may be maintained for 7 hours to 10 hours. When the temperature is cooled to room temperature, the growth chamber cover 111 may be taken out. The seed crystal may be then placed at a center of the inner side surface of the growth chamber cover 111, a silicon carbide single wafer may be placed on the seed crystal, and a stainless steel block may be placed on the silicon carbide single wafer. The growth chamber cover 111 may be then placed in the heating furnace, and maintained for 5 hours in a temperature range of 380° C. to 430° C. When the temperature is cooled to room temperature, the growth chamber cover 111 may be taken out.

A size of the seed crystal may include 4 inches, 8 inches, etc. A type of the seed crystal may include 4H—SiC, 6H—SiC, etc. A direction of a growth surface of the seed crystal may be <0001> deflecting 4 degrees to 6 degrees pointing to a direction of [11$\bar{2}$0]. The adhesion agent may include epoxy resin, an AB glue, phenolic resin, a sugar glue, etc. In some embodiments, the adhesion agent may include a sucrose with a purity of 99.9%. The stainless steel block may be used to apply a certain pressure to the silicon carbide single wafer, the seed crystal, and the growth chamber cover 111 to promote that the seed crystal is bonded to the inner side surface of the growth chamber cover 111. During the process for bonding and fixing the seed crystal, due to reasons such as the non-uniformity of the adhesion agent, a poor machining accuracy of the inner side surface of the growth chamber cover, etc., bubbles or voids may be caused between a rear surface of the seed crystal and the inner side surface of the growth chamber cover 111, further causing crystal defects. Therefore, when the seed crystal is placed at the center of the inner side surface of the growth chamber cover 111, it is necessary to avoid an occurrence of the bubbles or voids. In some embodiments, before the seed crystal is bonded to the inner side surface of the growth chamber cover 111, the seed crystal may be cleaned to remove contaminants on the surface of the seed crystal. In some embodiments, the seed crystal may be cleaned with deionized water, an organic solvent, etc.

Next, the source material (e.g., silicon carbide powder) may be placed in the growth chamber body 112 and a distance between the upper surface of the source material and the crystal growth surface may be within a range of 30 millimeters to 100 millimeters. A particle diameter of the source material may be within a range of 30 microns to 50 microns. A surface of the source material placed in the growth chamber body 112 may be maintained flat.

After the source material is placed into the growth chamber body 112, the growth chamber cover 111 with the seed crystal bonded may be bonded to the top portion of the growth chamber body 112 to form a closed space to facilitate the crystal growth.

In 1920, the temperature compensation component 1210 may be mounted to an upper surface and/or a lower surface of the growth chamber 110. In some embodiments, the first temperature compensation component 1210-1 and the second temperature compensation component 1210-2 may be mounted to the upper surface and the lower surface of the growth chamber 110, respectively.

First, the first temperature compensation component 1210-1 may be fixed to the upper surface of the growth chamber 110, so that a peripheral region of a lower surface of the first temperature compensation component 1210-1 is in contact with a peripheral region of the upper surface of the growth chamber 110. Accordingly, heat at the peripheral region of the upper surface of the growth chamber 110 may be conducted to a central region of the upper surface of the growth chamber 110. Then, the second temperature compensation component 1210-2 may be fixed to the lower surface of the growth chamber 110, so that a peripheral region of an upper surface of the second temperature compensation component 1210-2 is in contact with a peripheral region of the lower surface of the growth chamber 110. Accordingly, heat at the peripheral region of the lower surface of the growth chamber 110 may be conducted to a central region of the lower surface of the growth chamber 110. The first temperature compensation component 1210-1 or the second temperature compensation component 1210-2 may include a high thermal conductivity graphite body. A shape of the first temperature compensation component 1210-1 or the second temperature compensation component 1210-2 may be a circular disk.

In 1930, the heating component may be disposed outside the growth chamber 110.

First, a resistance heating element may be placed outside the growth chamber 110 so that the growth chamber 110 is located at a central position of the resistance heating element. The resistance heating element may at least include the first heating module 1230-1, the second heating module 1230-2, and the third heating module 1230-3. The first heating module 1230-1 may be configured to heat a crystallization region of the growth chamber 110. The second heating module 1230-2 may be configured to heat a vapor transmission region between the crystallization region of the growth chamber 110 and a source material region of the growth chamber 110. The third heating module 1230-3 may be configured to heat the source material region of the growth chamber 110. Heating powers of the heating modules may be controlled separately. The resistance heating element may include a circular high resistance graphite heating element.

Then, the electrode fixing plate 1215 may be disposed in an outside of the resistance heating element, so that at least one first electrode 1213 is fixed to the outside of the resistant heating element by passing through one of at least two holes on the electrode fixing plates 1215, and at least one second electrode 1211 is fixed to the outside of the resistant heating element by passing through one of at least two holes on the electrode fixing plates 1215 simultaneously. Further, upper ends of the at least one first electrode 1213 and the at least one second electrode 1211 may be connected to a water-cooled copper wire, and the water-cooled copper wire may be connected to a power source. Each of the first electrode 1213 and the second electrode 1211 may include a low resistance graphite electrode. The electrode fixing plate 1215 may include a zirconia ceramic plate.

In some embodiments, the process may also include disposing an insulation layer around the outside of the heating component.

The insulation layer may be disposed around the outside of the heating component for insulating the growth chamber 110 and/or the heating component. The insulation layer may include graphite or zirconia ceramic. A thickness of the insulation layer and a spacing distance between the insulation layer and the heating component may be adjusted according to the size of the growth chamber, the type of the crystal to be grown, the heating power of the resistance heating element, temperature information related to the growth chamber 110 during the crystal growth, etc.

In 1940, the growth chamber may be heated by the heating component and the temperature compensation component. A pressure may be controlled in a range of 5 Torr to 30 Torr by introducing an inert gas into the growth chamber 110 and the growth chamber 110 may be heated by the first heating component 1220 and the temperature compensation component 1210.

Before the growth chamber 110 is heated, the inert gas (e.g., argon) may be introduced into the growth chamber 110 to exclude the air in the growth chamber 110. The growth chamber 110 may be then heated by the heating component and the temperature compensation component 1210.

In 1950, heating powers of the heating component and/or the temperature compensation component may be adjusted by a control component during the crystal growth based on at least one crystal growth parameter (e.g., an amount of the source material, a crystal growth size, a height difference between a crystal growth interface and the source material), so that a temperature field between the crystal growth interface and the source material 160 is maintained stable.

In some embodiments, during the crystal growth, a heating power (e.g., an average heating power) of the first temperature compensation component 1210-1 may be controlled to be less than a heating power (e.g., an average heating power) of the first heating module 1230-1. The heating power of the first heating module 1230-1 may be controlled to be less than a heating power (e.g., an average heating power) of the second heating module 1230-2. The heating power of the second heating module 1230-2 may be controlled to be less than a heating power (e.g., an average heating power) of the third heating module 1230-3. The heating power (e.g., an average heating power) of the third heating module 1230-3 may be controlled to be equal to a heating power (e.g., an average heating power) of the second temperature compensation component 1210-2. As the crystal grows, the source material 160 may be constantly consumed, the temperature field between the crystal growth interface and the source material 160 may be lowered. In order to maintain the temperature field between the crystal growth interface and the source material substantially stable, the heating powers of the first heating module 1230-1, the second heating module 1230-2, and the third heating module 1230-3 may be adjusted, thereby maintaining a downward speed of the temperature field close to a crystal growth rate (e.g., 0.8 mm/h to 2 mm/h). In addition, as the crystal grows, in order to maintain the temperature gradient stable, the heating power of the first temperature compensation component 1210-1 may be reduced. In some embodiments, the reduced heating power may be within a range of 0.1% to 0.5%. More descriptions regarding the adjusting the heating powers of the heating unit and the temperature compensation component 1210 by the control component may be found elsewhere in the present disclosure (e.g., FIG. 9 and the descriptions thereof).

In some embodiments, during the crystal growth, a temperature of the growth chamber 110 may be maintained within a range of 2200° C. to 2400° C. when the source material is sublimated, and a duration of the sublimation of the source material may be within a range of 40 hours to 60 hours. In some embodiments, during the crystal growth, the pressure of the growth chamber 110 may be controlled in the range of 5 Torr to 30 Torr.

It should be noted that the above description of the process 1900 is merely provided for illustration, and not intended to limit the scope of the present disclosure. For persons having ordinary skills in the art, multiple variations and modifications may be made to the process 1900 under the teachings of the present disclosure. However, those variations and modifications do not depart from the scope of the present disclosure. The above preparation process is merely provided for illustration purposes, process parameters involved in different embodiments may be the same or different. A sequence of the above operations may not be unique, and the sequence between the operations may be adjusted in different embodiments. One or more operations may be omitted. The above examples should not be intended to limit the scope of the present disclosure.

Figure 20:
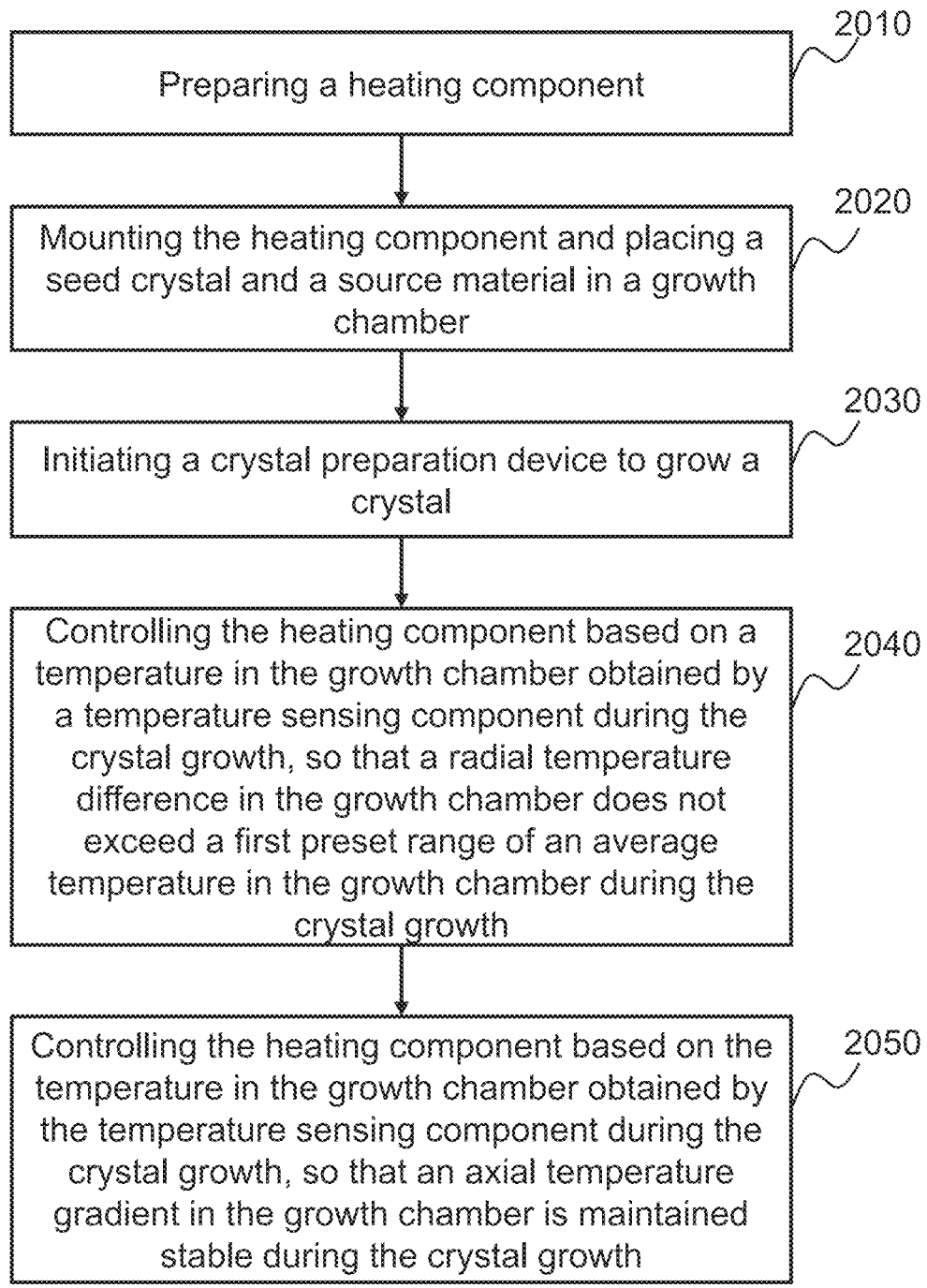
FIG. 20 is a flowchart illustrating an exemplary process for crystal growth according to some embodiments of the present disclosure.

FIG. 20 is a flowchart illustrating an exemplary process for crystal growth according to some embodiments of the present disclosure.

Some embodiments also disclose a process for crystal growth. A semiconductor crystal may be prepared based on the process using the crystal preparation device 100. For convenience, the following may be described by taking preparing a silicon carbide single crystal as an example. As shown in FIG. 20, the process may include the following operations.

In 2010, a heating component may be prepared.

In some embodiments, as shown in FIG. 13, the heating component may include the second heating component 1240 located inside the growth chamber 110. In some embodiments, as shown in FIG. 15, the heating component may include the first heating component 1220 located outside the growth chamber 110 and the second heating component 1240 located inside the growth chamber 110. More descriptions regarding the heating component may be found elsewhere in the present disclosure (e.g., FIGS. 13-16B and the descriptions thereof), which may not be described herein.

In some embodiments, the preparing the heating component may include disposing at least one flow channel 1250 on heating unit(s) of the second heating component 1240. In some embodiments, information related to the at least one flow channel 1250 may be determined based on a type of the crystal to be prepared, a crystal size, a size of the growth chamber 110, etc. In some embodiments, the information related to the at least one flow channel 1250 may include an opening density of the at least one flow channel 1250, a radius of the at least one flow channel 1250, a shape of the at least one flow channel 1250, a count of flow channel circumferences, a radius of the flow channel circumference, a central spacing distance between two adjacent flow channels on different flow channel circumferences, etc. More descriptions regarding the at least one flow channel 1250 may be found elsewhere in the present disclosure (e.g., FIGS. 13-15 and the descriptions thereof), which may not be described herein.

In 2020, the heating component may be mounted and a seed crystal and a source material may be placed in the growth chamber.

In some embodiments, the seed crystal may include 4H—SiC or 6H—SiC with a diameter of 70 millimeters to 150 millimeters. In some embodiments, the diameter of the seed crystal may be within a range of 80 millimeters to 140 millimeters. In some embodiments, the diameter of the seed crystal may be within a range of 90 millimeters to 130 millimeters. In some embodiments, the diameter of the seed crystal may be within a range of 100 millimeters to 120 millimeters. In some embodiments, the diameter of the seed crystal may be within a range of 105 millimeters to 115 millimeters. In some embodiments, the diameter of the seed crystal may be within a range of 70 millimeters to 150 millimeters. In some embodiments, a direction of a growth surface of the seed crystal may be <0001> deflecting 4 degrees to 6 degrees pointing to a direction of [11$\bar{2}$0].

In some embodiments, a purity of the source material may be larger than or equal to 99.99%. In some embodiments, the purity of the source material may be larger than or equal to 99.999%. In some embodiments, when the source material is in a powder form, a particle diameter of the source material may be within a range of 0.1 millimeters to 0.5 millimeters. In some embodiments, the particle diameter of the source material may be within a range of 0.15 millimeters to 0.45 millimeters. In some embodiments, the particle diameter of the source material may be within a range of 0.2 millimeters to 0.4 millimeters. In some embodiments, the particle size of the source material may be within a range of 0.25 millimeters to 0.35 millimeters.

More descriptions regarding the seed crystal, the source material, and the growth chamber may be found elsewhere in the present disclosure (e.g., FIG. 19 and the descriptions thereof).

When the second heating component 1240 in the heating component is mounted, at least two conduction electrodes may pass through and fixed to at least two electrode insertion pillars at a bottom portion of the growth chamber 110, respectively. In some embodiments, the at least two electrode insertion pillars may be disposed with internal threads, the at least two conduction electrodes may be disposed with external threads, and the at least two electrode insertion pillars may fix the at least two conductive electrodes through a threaded connection. Then, a portion of the source material may be placed at the bottom portion of the growth chamber 110. Further, the at least two conduction electrodes may further pass through at least two first electrode holes of the heating unit in the second heating component 1240, and the heating unit may be fixed inside the growth chamber 110 through a second connection element on the heating unit and a first connection element inside the growth chamber 110. A portion of the source material may be placed on an upper surface of the heating unit. Other heating units of the second heating component 1240 may be mounted respectively and remaining portions of the source material may be placed thereon. The growth chamber cover 111 with the seed crystal bonded may be then covered to a top portion of the growth chamber body 112. The at least two conduction electrodes may be then connected to a copper wire. The copper wire may be connected to a power source. The mounting of the second heating component 1240 and the placement of the source material and the seed crystal may be completed. More descriptions regarding bonding the seed crystal to the growth chamber cover 111 may be found elsewhere in the present disclosure (e.g., FIG. 19 and the descriptions thereof), which may not be described herein. In some embodiments, at least one conduction ring 1241 may also be mounted on an upper surface and/or a lower surface of the at least one heating unit of the second heating component 1240. In some embodiments, at least two conduction electrodes may pass through at least two second electrode holes of the at least one conduction ring 1241, and the at least one conduction ring 1241 may be fixed inside the growth chamber 110 through a third connection element on the at least one conduction ring 1241 and a fourth connection element inside the growth chamber 110. In some embodiments, when the at least one conduction ring 1241 is mounted, the at least one heating unit of the second heating component 1240 may not be fixedly connected to the growth chamber 110. The at least one heating unit of the second heating component 1240 may be placed on the at least one conduction ring 1241.

In some embodiments, a portion of the upper surface and the lower surface of the at least one heating unit that is not connected to the at least one conduction ring 1241 may be coated with a high temperature resistant carbide coating to prevent at least one heating unit from contaminating vapor components of the source material during the crystal growth, which may affect the crystal purity and the crystal quality.

In some embodiments, a filling height of the source material at the bottom portion of the growth chamber 110 may refer to a height of the source material that is tiling at the bottom portion of the growth chamber 110. In some embodiments, a filling height of the source material on the heating unit may refer to a height of the source material that is tiling on the heating unit. In some embodiments, a total filling height of the source material may refer to a sum of the height of the source material that is tiling at the bottom portion of the growth chamber 110 and the height of the source material that is tiling on the heating unit.

In some embodiments, the first heating component 1220 (e.g., an induction coil) may also be mounted (e.g., disposed around) outside the growth chamber 110.

The filling height of the source material at the bottom portion of the growth chamber 110 may refer to a distance between an upper surface of a growth chamber bottom cover and an upper surface of the source material placed on the upper surface of the growth chamber bottom cover. If the filling height of the source material at the bottom portion of the growth chamber 110 is too high, the source material may not be sufficiently heated, and the vapor components of the sublimated source material can't effectively pass through the flow channel on the heating unit in the growth chamber, which may further lead to a low utilization of the source material. If the filling height of the source material at the bottom portion of the growth chamber 110 is too low, an amount of the filled source material may be small, which may affect the size of the crystal growth. Therefore, it is necessary to control the filling height of the source material at the bottom portion of the growth chamber 110 in a preset height range. In some embodiments, the filling height of the source material at the bottom portion of the growth chamber 110 may be within a range of 0.1 to 0.3 of the total filling height of the source material. In some embodiments, the filling height of the source material at the bottom portion of the growth chamber 110 may be within a range of 0.12 to 0.28 of the total filling height of the source material. In some embodiments, the filling height of the source material at the bottom portion of the growth chamber 110 may be within a range of 0.14 to 0.26 of the total filling height of the source material. In some embodiments, the filling height of the source material at the bottom portion of the growth chamber 110 may be within a range of 0.16 to 0.24 of the total filling height of the source material. In some embodiments, the filling height of the source material at the bottom portion of the growth chamber 110 may be within a range of 0.18 to 0.22 of the total filling height of the source material. In some embodiments, the filling height of the source material at the bottom portion of the growth chamber 110 may be within a range of 0.19 to 0.21 of the total filling height of the source material. In some embodiments, the filling height of the source material at the bottom portion of the growth chamber 110 may be 0.2 of the total filling height of the source material.

The filling height of the source material on the heating unit may refer to a distance between the upper surface of the heating unit and an upper surface of the source material placed on the upper surface of the heating unit. If the filling height of the source material on the heating unit is too high, the source material on the upper surface of the heating unit may be heated un-uniformly, and the vapor components of the sublimated source material can't effectively pass through the flow channel on the heating unit in the growth chamber, which may further lead to the low utilization of the source material. If the filling height of the source material on the heating unit is too low, an amount of the filled source material may be small, which may affect the size of the crystal growth. Therefore, it is necessary to control the filling height of the source material on the heating unit in a preset height range. In some embodiments, the filling height of the source material on the heating unit may be within a range of 0.2 to 0.4 of the total filling height of the source material. In some embodiments, the filling height of the source material on the heating unit may be within a range of 0.22 to 0.38 of the total filling height of the source material. In some embodiments, the filling height of the source material on the heating unit may be within a range of 0.24 to 0.36 of the total filling height of the source material. In some embodiments, the filling height of the source material on the heating unit may be within a range of 0.26 to 0.34 of the total filling height of the source material. In some embodiments, the filling height of the source material on the heating unit may be within a range of 0.28 to 0.32 of the total filling height of the source material. In some embodiments, the filling height of the source material on the heating unit may be within a range of 0.29 to 0.31 of the total filling height of the source material. In some embodiments, the filling height of the source material on the heating unit may be 0.3 of the total filling height of the source material.

In some embodiments, there may be no source material placed on an uppermost heating unit (a heating unit closest to the growth chamber cover 111) of the second heating component 1240. In some embodiments, the source material may be placed on the uppermost heating unit of the second heating component 1240. If a distance between the upper surface of the source material on the uppermost heating unit and a growth surface of the seed crystal is too small, a portion of source material may be dispersed on the growth surface of the seed grid, which may further lead to crystal defects. If the distance between the upper surface of the source material on the uppermost heating unit and the growth surface of the seed crystal is too large, a transport distance of the vapor components of the sublimated source material may affect the crystal growth rate. Therefore, it is necessary to control the distance between the upper surface of the source material on the uppermost heating unit and the growth surface of the seed crystal in a preset distance range. In some embodiments, the distance between the upper surface of the source material on the uppermost heating unit and the growth surface of the seed crystal may be within a range of 30 millimeters to 50 millimeters. In some embodiments, the distance between the upper surface of the source material on the uppermost heating unit and the growth surface of the seed crystal may be within a range of 32 millimeters to 48 millimeters. In some embodiments, the distance between the upper surface of the source material on the uppermost heating unit and the growth surface of the seed crystal may be within a range of 34 millimeters to 46 millimeters. In some embodiments, the distance between the upper surface of the source material on the uppermost heating unit and the growth surface of the seed crystal may be within a range of 36 millimeters to 44 millimeters. In some embodiments, the distance between the upper surface of the source material on the uppermost heating unit and the growth surface of the seed crystal may be within a range of 38 millimeters to 42 millimeters. In some embodiments, the distance between the upper surface of the source material on the uppermost heating unit and the growth surface of the seed crystal may be within a range of 39 millimeters to 41 millimeters. In some embodiments, the distance between the upper surface of the source material on the uppermost heating unit and the growth surface of the seed crystal may be 40 millimeters.

In 2030, the crystal preparation device may be initiated to grow the crystal.

In some embodiments, the initiating the crystal preparation device may include performing a vacuum operation on the growth chamber, initiating the heating component (e.g., the second heating component 1240, the first heating component 1220, and the second heating component 1240), performing a heating operation, and introducing the inert gas into the growth chamber for performing a pressure maintenance.

In some embodiments, when the heating component is the second heating component 1240 (the crystal preparation device shown in FIG. 13), operation 2030 may include performing the vacuum operation on the growth chamber 110 to decrease a pressure of the growth chamber to a range of $1\times10^{-5}$ Pa to $1\times10^{-3}$ Pa. The at least two conduction electrodes may be then energized, and the second heating component 1240 may be initiated to perform heat treatment, so that a temperature detected on the growth chamber cover 111 is within a range of 900° C. to 1200° C. The vacuum operation on the growth chamber 110 may be continued, and the vacuum operation may be performed with a constant power for 20 minutes to 120 minutes. Then, the inert gas (e.g., argon) may be introduced into the growth chamber 110 to cause the pressure of the growth chamber 110 to atmospheric pressure. The heating power of the second heating component 1240 may be increased to cause the temperature detected on the growth chamber cover 111 within a range of 1900° C. to 2100° C., and the heating may be performed with a constant power for 20 minutes to 80 minutes. The vacuum operation may be performed on the growth chamber 110 again, and the inert gas (e.g., argon) may be introduced into the growth chamber 110 at a rate of 2 L/min to 5 L/min until the pressure of the growth chamber 110 is within a range of 5 Torr to 30 Torr.

In some embodiments, when the heating component is the first heating component 1220 and the second heating component 1240 (the crystal preparation device shown in FIG. 15), operation 2030 may include performing the vacuum operation on the growth chamber 110 to decrease a pressure of the growth chamber to a range of $1\times10^{-5}$ Pa to $1\times10^{-3}$ Pa. The first heating component 1220 may be initiated to perform heat treatment, so that the temperature detected on the growth chamber cover 111 is within a range of 900° C. to 1200° C. The vacuum operation on the growth chamber 110 may be continued, and the vacuum operation may be performed with a constant power for 20 minutes to 120 minutes. Then, the inert gas (e.g., argon) may be introduced into the growth chamber 110 to cause the pressure of the growth chamber 110 to atmospheric pressure. The first heating component 1220 may continue the heat treatment to cause that the temperature detected on the growth chamber cover 111 is within a range of 1900° C. to 2100° C., and the heating may be performed with a constant power for 20 minutes to 80 minutes and the first heating component 1220 may be maintained operating at the constant power. The second heating component 1420 may be initiated to perform heat treatment, so that the temperature detected on the growth chamber cover 111 is within a range of 2200° C. to 2400° C. The vacuum operation may be performed on growth chamber 110 again, and the inert gas (e.g., argon) may be introduced into the growth chamber 110 at a rate of 2 L/min to 5 L/min until the pressure of the growth chamber 110 is within a range of 5 Torr to 30 Torr.

In 2040, during the crystal growth, the heating component may be controlled based on the temperature in the growth chamber obtained by a temperature sensing component, so that a radial temperature difference in the growth chamber does not exceed a first preset range of an average temperature in the growth chamber during the crystal growth.

More descriptions regarding the temperature sensing component, the control component, the temperature distribution, the radial temperature difference, the first preset range, the preset radial temperature difference threshold, and a control process of operation 2040 may be found elsewhere in the present disclosure (e.g., FIGS. 1, 2, 18, and the descriptions thereof), which may not be described herein.

In 2050, during the crystal growth, the heating component may be controlled based on the temperature in the growth chamber obtained by the temperature sensing component, so that an axial temperature gradient in the growth chamber is maintained stable during the crystal growth.

More descriptions regarding the temperature sensing component, the control component, the temperature distribution, the axial temperature gradient, and a control process of operation 2050 may be found elsewhere in the present disclosure (e.g., FIGS. 1, 2, 18, and the descriptions thereof), which may not be described herein.

It should be noted that the above description of the process 2000 is merely provided for illustration, and not intended to limit the scope of the present disclosure. For persons having ordinary skills in the art, multiple variations and modifications may be made to the process 2000 under the teachings of the present disclosure. However, those variations and modifications do not depart from the scope of the present disclosure. For example, operation 2040 and operation 2050 may be performed synchronously. The above preparation process is merely provided for illustration purposes, process parameters involved in different embodiments may be the same or different. A sequence of the above operations may not be unique, and the sequence between the operations may be adjusted in different embodiments. One or more operations may be omitted. The above examples should not be intended to limit the scope of the present disclosure.

In the embodiment, the crystal preparation device shown in FIG. 13 may be used. A silicon carbide crystal may be prepared using silicon carbide powders with a purity larger than 99.999% as the source material. The heating component may include the second heating component 1240 which may include at least one heating unit. In the embodiment, the heating unit may be referred to as a heating plate. The preparation process may include the following operations. In S1, a graphite crucible with an inner diameter of 100 millimeters to 300 millimeters, a difference between a height and the inner diameter less than 80 millimeters, and a bottom thickness of 40 millimeters to 100 millimeters may be selected as the growth chamber 110.

A heating plate with a thickness of 5 millimeters to 10 millimeters and a diameter of 50 millimeters to 300 millimeters may be selected. A plurality of flow channels may be drilled on each heating plate. A radius of each flow channel may be within a range of 0.2 millimeters to 1 millimeter. The plurality of flow channels may be arranged with a center of the heating plate as a center to form 10 to 30 flow channel circumferences. A central spacing distance between two adjacent flow channels on a same flow channel circumference may be within a range of 1 millimeter to 5 millimeters. If radii of two adjacent flow channel circumferences are $R_n$ and $R_{n-1}$ respectively, $R_n - R_{n-1} = (R_2 - R_1)\exp^{(-(n-1)\times0.015)}$, where n is an integer not less than 2, $R_1$ is a distance within a range of 1 millimeter to 20 millimeters, and $R_2 - R_1$ is within a range of 1 millimeter to 10 millimeters. A radius difference $R_n - R_{n-1}$ between an n-th flow channel circumference and a (N−1)-th flow channel circumference may be within a range of 1 millimeter to 5 millimeters.

A first electrode hole A and at least two first electrode holes B (e.g., three first electrode holes B) may be drilled on each heating plate. The first electrode hole A may be located at the center of the heating plate and the at least two first electrode holes B may be arranged in an edge region of the heating plate in a circle with the first electrode hole A as a center. The manufactured heating plate is shown in FIG. 16A. A diameter of the first electrode hole A may be within a range of 10 millimeters to 20 millimeters and a diameter of the first electrode hole B may be within a range of 2 millimeters to 10 millimeters.

A conduction ring with a thickness of 5 millimeters to 15 millimeters, an outer diameter of 100 millimeters to 300 millimeters, and an inner diameter of 110 millimeters to 280 millimeters may be selected. The second electrode hole may be drilled on the conduction ring as shown in FIG. 17. The second electrode hole on the conduction ring may be matched with the diameter of the first electrode hole B on the heating plate.

In S2, the first conduction electrode 1242 may be fixed through the first electrode insertion pillar 1244 at the bottom portion of the crucible. The second conduction electrode 1243 may be fixed through the second electrode insertion pillar 1245 at the bottom portion of the crucible. Similarly, the third conduction electrode and the fourth conduction electrode (not shown) may be fixed respectively through the third electrode insertion pillar and the fourth electrode insertion pillar at the bottom portion of the crucible.

A first layer of source material may be paved on the bottom portion of the graphite crucible. A filling height of the first layer of source material may be within a range of 2 millimeters to 10 millimeters.

In S3, the conduction ring may be enclosed on the second conduction electrode, the third conduction electrode, and the fourth conduction electrode, and the conduction ring may be fixed above the silicon carbide powder. The heating plate may be placed on the conduction ring through the first conduction electrode 1242, the second conduction electrode 1243, the third conduction electrode, and the fourth conduction electrode. Then, another conduction ring may be fixed to the heating plate, so that the heating plate is fixed and in contact with the first conduction electrode 1242, the second conduction electrode 1243, the third conduction electrode, and the fourth conduction electrode. A second layer of source material may be paved on the upper surface of the heating plate. A filling height of the second layer of source material may be within a range of 5 millimeters to 20 millimeters.

In S4, operation S3 may be repeated. Filling heights of a third layer of source material, a fourth layer of source material, and a fifth layer of source material may be within ranges of 10 millimeters to 30 millimeters, 10 millimeters to 30 millimeters, 3 millimeters to 25 millimeters, respectively. A distance between an upper surface of the fifth layer of source material and the growth surface of the seed crystal may be within a range of 20 millimeters to 40 millimeters.

In S5, a 6H—SiC seed crystal with a diameter of 100 millimeters to 200 millimeters and a thickness of 0.4 millimeters to 2 millimeters may be fixed to a crucible cover by a bonding connection. A direction of a growth surface of the seed crystal may be [0001] deflecting 1 degree to 10 degrees pointing to a direction of [11$\bar{2}$0]. The crucible cap with the seed crystal bonded may be sealed and fitted onto a crucible body, and then the crucible may be placed into a temperature field.

In S6, water-cooled copper wires of the conduction electrodes may be connected, and the copper wires may be led out of the temperature field and connected to a DC power source. The first conduction electrode 1242 may be connected to a positive electrode of the power source through a copper wire, and the second conduction electrode 1243, the third conduction electrode, and the fourth conduction electrode may be connected to a negative electrode of the power source through a copper wire.

In S7, the growth chamber 110 may be closed and a vacuum operation may be performed, so that a pressure of the growth chamber 110 may be reduced to $1\times10^{-5}$ Pa to $1\times10^{-3}$ Pa. Then a power source of the heating plate may be initiated to heat the heating plate until the temperature of the crucible cover measured by the temperature sensing component is within a range of 900° C. to 1400° C. The vacuum operation on the growth chamber 110 may be continued, and the vacuum operation may be performed with a constant power for 20 minutes to 120 minutes. Then, the inert gas (e.g., argon) may be introduced into the growth chamber 110 to cause the pressure of the growth chamber 110 to the atmospheric pressure.

In S8, the heating may be continued until the temperature of the crucible cover measured by the temperature sensing component is within a range of 2000° C. to 2300° C. A heating power of the heating plate may be adjusted by a control component, so that the temperature of the crucible cover measured by the temperature sensing component is maintained within the range of 2000° C. to 2300° C. and the heating plate operates stably. The vacuum operation may be performed on the growth chamber 110, and argon may be introduced into the growth chamber 110 at a rate of 2 L/min to 5 L/min to maintain the pressure of the growth chamber 110 within a range of 5 Torr to 30 Torr.

In S9, the crystal growth may be started. A growth time may be within a range of 40 hours to 60 hours. After the growth chamber 110 is slowly cooled for 30 hours to 60 hours, the silicon carbide crystal and the crucible may be taken out.

A diameter of the growth surface of the prepared silicon carbide crystal is 154 millimeters and a protrusion height of the growth surface is 7.1 millimeters. The prepared silicon carbide crystal was cut and a wafer above the seed crystal surface 3 millimeters along a growth direction was obtained. Then the wafer was polished and observed by an optical microscope. A statistical density of carbon inclusion particles is $4.9/cm^2$.

Figure 21:
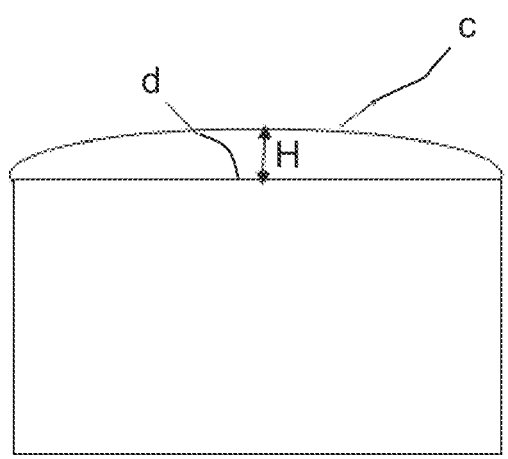
FIG. 21 is a schematic diagram illustrating an exemplary prepared crystal according to some embodiments of the present disclosure.

FIG. 21 is a schematic diagram illustrating an exemplary prepared crystal according to some embodiments of the present disclosure. As shown in FIG. 21, a growth surface of a crystal may be represented as a C surface and a substrate surface may be represented as a D surface. A protrusion height of the growth surface may be represented as a distance H between a highest point of the growth surface and the substrate surface.

In the embodiment, the crystal preparation device as shown in FIG. 15 may be used. A silicon carbide crystal may be prepared using silicon carbide powders with a purity larger than 99.999% as a source material. The heating component may include the first heating component 1220 and the second heating component 1240. The first heating component 1220 may use an induction coil, which is disposed around a periphery of the growth chamber 110. The second heating component 1240 may be located inside the growth chamber 110. The second heating component 1240 may include at least one heating unit. In the embodiment, the heating unit may be referred to as a heating plate. The preparation process may include the following operations. In S1, a graphite crucible with an inner diameter of 100 millimeters to 300 millimeters, a difference between a height and the inner diameter not larger than 50% of the inner diameter, and a bottom thickness not larger than 40% of the inner diameter may be selected as the growth chamber 110.

A heating plate with a thickness of 4 millimeters to 12 millimeters and a diameter of 50 millimeters to 300 millimeters may be selected. A plurality of flow channels may be drilled on each heating plate. A radius of each flow channel may be within a range of 0.2 millimeters to 1 millimeter. The plurality of flow channels may be arranged with a center of the heating plate as a center to form 18 to 30 flow channel circumferences. A central spacing distance between two adjacent flow channels on a same flow channel circumference may be within a range of 1 millimeter to 2 millimeters. If radii of two adjacent flow channel circumferences are $R_n$ and $R_{n-1}$ respectively, $R_n - R_{n-1} = (R_2 - R_1) \exp^{((n-1) \times 0.02 + 0.009)}$, where n is an integer not less than 2, $R_1$ is a distance within a range of 5 millimeter to 20 millimeters, and $R_2 - R_1$ is within a range of 1 millimeter to 4 millimeters. A radius difference $R_n - R_{n-1}$ between an n-th flow channel circumference and a (N−1)-th flow channel circumference may be within a range of 2 millimeter to 6 millimeters.

A first electrode hole A and at least two first electrode holes B (e.g., three first electrode holes B) may be drilled on each heating plate. The first electrode hole A may be located at the center of the heating plate, and the at least two first electrode holes B may be arranged in an edge region of the heating plate in a circle with the first electrode hole A as a center. The manufactured heating plate is shown in FIG. 16A. A diameter of the first electrode hole A may be within a range of 10 millimeters to 20 millimeters and a diameter of the first electrode hole B may be within a range of 4 millimeters to 15 millimeters.

A conduction ring with a thickness of 2 millimeters to 20 millimeters, an outer diameter of 100 millimeters to 300 millimeters, and an inner diameter of 120 millimeters to 280 millimeters may be selected. The second electrode hole may be drilled on the conduction ring as shown in FIG. 17. The second electrode hole on the conduction ring may be matched with the diameter of the first electrode hole B on the heating plate.

In S2, the first conduction electrode 1242 may be fixed through the first electrode insertion pillar 1244 at the bottom portion of the crucible. The second conduction electrode 1243 may be fixed through the second electrode insertion pillar 1245 at the bottom portion of the crucible. Similarly, the third conduction electrode and the fourth conduction electrode (not shown) may be fixed respectively through the third electrode insertion pillar and the fourth electrode insertion pillar at the bottom portion of the crucible.

A first layer of source material may be paved on the bottom portion of the graphite crucible. A filling height of the first layer of source material may be within a range of 10 millimeters to 20 millimeters.

In S3, the conduction ring may be enclosed on the second conduction electrode, the third conduction electrode, and the fourth conduction electrode, and the conduction ring may be fixed above the silicon carbide powder. The heating plate may be placed on the conduction ring through the first conduction electrode 1242, the second conduction electrode 1243, the third conduction electrode, and the fourth conduction electrode. Then, another conduction ring may be fixed to the heating plate, so that the heating plate is fixed and in contact with the first conduction electrode 1242, the second conduction electrode 1243, the third conduction electrode, and the fourth conduction electrode. A second layer of source material may be paved on the upper surface of the heating plate. A filling height of the second layer of source material may be within a range of 20 millimeters to 30 millimeters.

In S4, operation S3 may be repeated. Filling heights of a third layer of source material and a fourth layer of source material may be within ranges of 20 millimeters to 30 millimeters and 10 millimeters to 20 millimeters, respectively. A distance between an upper surface of the fourth layer of source material and the growth surface of the seed crystal may be within a range of 30 millimeters to 60 millimeters.

In S5, a 4H—SiC seed crystal with a diameter of 100 millimeters to 200 millimeters and a thickness of 0.5 millimeters to 2 millimeters may be fixed to a crucible cover by a bonding connection. A direction of a growth surface of the seed crystal may be [000$\bar{1}$] deflecting 2 degrees to 8 degrees pointing to a direction of [11$\bar{2}$0]. The bonded crucible cap with the seed crystal bonded may be sealed and fitted onto a crucible body, and then the crucible may be placed into a temperature field.

In S6, water-cooled copper wires of the conduction electrodes may be connected, and the copper wires may be led out of the temperature field and connected to a DC power source. The first conduction electrode 1242 may be connected to a positive electrode of the power source through a copper wire, and the second conduction electrode 1243, the third conduction electrode, and the fourth conduction electrode may be connected to a negative electrode of the power source through a copper wire.

In S7, the growth chamber 110 may be closed and a vacuum operation may be performed, so that a pressure of the growth chamber 110 may be reduced to $1 \times 10^{-5}$ Pa to $1 \times 10^{-3}$ Pa. Then a power source of the induction coil may be initiated to heat the induction coil until the temperature of the crucible cover measured by the temperature sensing component is within a range of 1000° C. to 1500° C. The vacuum operation on the growth chamber 110 may be continued, and the vacuum operation may be performed with a constant power for 20 minutes to 120 minutes. Then, the inert gas (e.g., argon) may be introduced into the growth chamber 110 to cause the pressure of the growth chamber 110 to the atmospheric pressure.

In S8, the heating may be continued until the temperature of the crucible cover measured by the temperature sensing component is within a range of 1800° C. to 2100° C. A heating power of the induction coil may be continued to operate at a constant power for 20 minutes to 80 minutes by a control component.

At the same time, the second heating component 1240 may be used to heat by the control component until the temperature of the crucible cover measured by the temperature sensing component is within a range of 2000° C. to 2300° C. The vacuum operation may be performed on the growth chamber 110, and argon may be introduced into the growth chamber 110 at a rate of 2 L/min to 5 L/min to maintain the pressure of the growth chamber 110 within a range of 5 Torr to 30 Torr.

In S9, the crystal growth may be started. A growth time may be within a range of 40 hours to 60 hours. After the growth chamber 110 is slowly cooled for 40 hours to 60 hours, the silicon carbide crystal and the crucible may be taken out.

A diameter of the growth surface of the prepared silicon carbide crystal is 154 millimeters, and a protrusion height of the growth surface is 7.5 millimeters. The prepared silicon carbide crystal was cut and a wafer above the seed crystal surface 3 millimeters along a growth direction was obtained. Then the wafer was polished and observed by an optical microscope. A statistical density of carbon inclusion particles is 4.1/cm².

According to the above embodiments 1-3, the second heating component may be used for heat treatment alone and the first heating component and the second heating component may be used in combination for heat treatment, which can compensate the radial temperature. In some embodiments, the radial temperature difference and/or the radial temperature gradient may be reduced. The flow channel(s) on the heating unit(s) of the second heating component may prevent graphitized carbon particles in the source material to move upward, thereby reducing the defects such as carbon inclusion microtubules in the crystal and improving crystal quality. When the second heating component is used for heat treatment, the source material may be distributed on the heating units of the second heating component at different heights to heat the source material in multi layers and segments, which can heat the source material more uniformly and fully, improve the utilization rate of the source material, reduce carbonization of the source material, and further improve crystal quality. In some embodiments, the growth surface of the prepared crystal may be flat and a protrusion degree may be low. For example, for a crystal with a diameter of a growth surface within a range of 100 millimeters to 200 millimeters, the protrusion height of the growth surface may be within a range of 5 millimeters to 7.5 millimeters. In addition, the density of carbon inclusion particles in the crystal may be low. For example, the density of carbon inclusion particles may be within a range of $3/cm^2$ to $5/cm^2$.

FIG. 22 is a flowchart illustrating an exemplary process for preparing a seed crystal according to some embodiments of the present disclosure.

Figure 23:
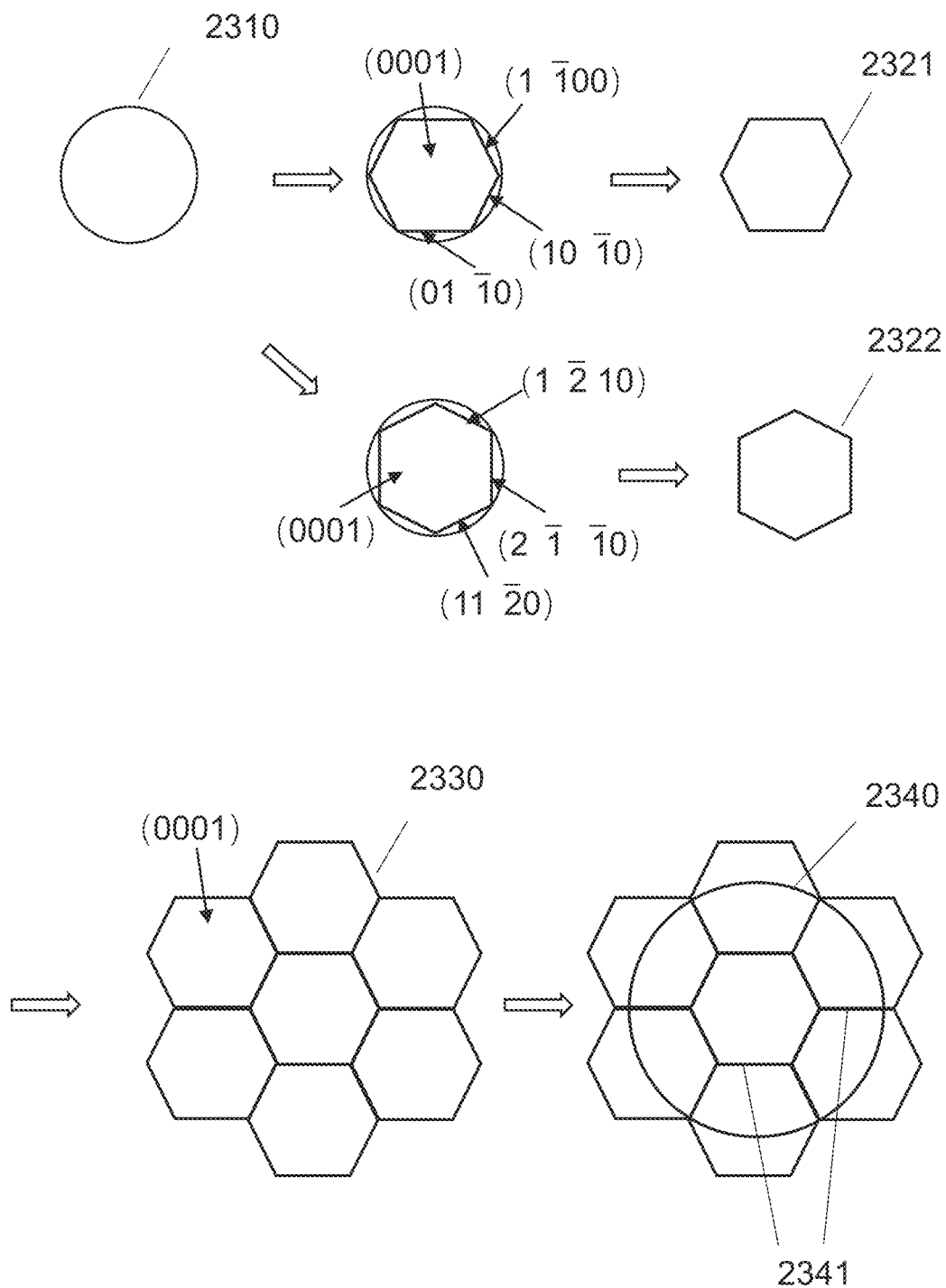
FIG. 23 is a schematic diagram illustrating an exemplary process for preparing a seed crystal according to some embodiments of the present disclosure.

FIG. 23 is a schematic diagram illustrating an exemplary process for preparing a seed crystal according to some embodiments of the present disclosure.

In 2210, a plurality of orthohexagonal seed crystals in a hexagonal crystal system may be obtained by performing a first cutting on a plurality of seed crystals in the hexagonal crystal system to be expanded, respectively, wherein cutting faces of the plurality of orthohexagonal seed crystals may correspond to a same lattice plane family.

The seed crystal in the hexagonal crystal system may refer to a seed crystal with six-fold axis or six-fold anti-axis characteristic symmetry elements in a direction of a major axis of a higher order. In some embodiments, the seed crystal in the hexagonal crystal system to be expanded may refer to a seed crystal in the hexagonal crystal system planned to be expanded in diameter. As shown in FIG. 23, 2310 represents the seed crystal in the hexagonal crystal system to be expanded. In some embodiments, a diameter of the seed crystal in the hexagonal crystal system to be expanded may be less than 8 inches. In some embodiments, a thickness of the seed crystal in the hexagonal crystal system to be expanded may be within a range of 100 microns to 500 microns. In some embodiments, the seed crystal in the hexagonal crystal system to be expanded may be prepared based on a physical vapor transport (PVT), a chemical vapor deposition (CVD), a Czochralski technique, etc. In some embodiments, the seed crystal in the hexagonal crystal system may include 4H—SiC or 6H—SiC.

In some embodiments, the first cutting may refer to cutting the seed crystal in the hexagonal crystal system to be expanded along a setting cutting direction to be a seed crystal with a first setting size (e.g., 4 inches or 6 inches) and a first setting shape (e.g., a hexagon). In some embodiments, the setting cutting direction may refer to a direction perpendicular to a surface (0001) of the seed crystal. In some embodiments, the cutting surface may refer to a new surface formed after the first cutting is performed on the seed crystal. In some embodiments, the lattice plane family may refer to all crystal surfaces where arrangements of atoms, ions, or molecules in a crystal are exactly the same. In some embodiments, the plurality of orthohexagonal seed crystals in the hexagonal crystal system with the cutting faces being the same lattice plane family may be obtained by cutting the plurality of seed crystals in the hexagonal crystal system to be expanded along a plane perpendicular to the (0001) plane, respectively. The lattice plane family may include $\{11\bar{2}0\}$ or $\{1\bar{1}00\}$. As shown in FIG. 23, after the first cutting, the orthohexagonal seed crystal 2321 in the hexagonal crystal system with the lattice plane family of $\{1\bar{1}00\}$ and/or the orthohexagonal seed crystal 2322 in the hexagonal crystal system with the lattice plane family of $\{11\bar{2}0\}$ may be obtained.

In some embodiments, before the first cutting is performed on the plurality of seed crystals in the hexagonal crystal system to be expanded, a polishing operation (e.g., a double-surface polishing) may be performed on the plurality of seed crystals in the hexagonal crystal system to be expanded respectively. Scratches on surfaces of the seed crystals in the hexagonal crystal system to be expanded may be removed by performing the polishing operation, so that the surfaces are flat to facilitate subsequent processing. In some embodiments, the polishing operation may be firstly performed on the $(000\bar{1})$ surface of the seed crystal in the hexagonal crystal system to be expanded, and then the polishing operation may be performed on the (0001) surface. In some embodiments, a thickness of the seed crystal in the hexagonal crystal system to be expanded after the polishing operation is performed may be within a range of 100 microns to 500 microns. In some embodiments, the thickness of the seed crystal in the hexagonal crystal system to be expanded after the polishing operation is performed may be within a range of 150 microns to 450 microns. In some embodiments, the thickness of the seed crystal in the hexagonal crystal system to be expanded after the polishing operation is performed may be within a range of 200 microns to 400 microns. In some embodiments, the thickness of the seed crystal in the hexagonal crystal system to be expanded after the polishing operation is performed may be within a range of 250 microns to 350 microns. In some embodiments, the thickness of the seed crystal in the hexagonal crystal system to be expanded after the polishing operation is performed may be within a range of 280 microns to 320 microns.

In 2220, the plurality of orthohexagonal seed crystals in the hexagonal crystal system may be spliced (e.g., tightly spliced).

The tightly splicing may refer to splicing the cutting surfaces of the plurality of orthohexagonal seed crystals in the hexagonal crystal system to a largest extent, so that splicing gaps between the plurality of spliced orthohexagonal seed crystals in the hexagonal crystal system are as little as possible. In some embodiments, the splicing the plurality of orthohexagonal seed crystals in the hexagonal crystal system may include taking one of the plurality of orthohexagonal seed crystals in the hexagonal crystal system as a center, and tightly splicing each of six sides of the central orthohexagonal seed crystal in the hexagonal crystal system with one side of six orthohexagonal seed crystals in the hexagonal crystal system. In some embodiments, tightly splicing seven orthohexagonal seed crystals in the hexagonal crystal system may include taking one orthohexagonal seed crystal in the hexagonal crystal system as a center, and tightly splicing six orthohexagonal seed crystals in the hexagonal crystal system in a periphery of the orthohexagonal seed crystal in the hexagonal crystal system located at the center. In some embodiments, upward surfaces of the plurality of orthohexagonal seed crystals in the hexagonal crystal system may include the (0001) surface or the (000$\bar{1}$) surface. As shown in FIG. 23, the plurality of orthohexagonal seed crystals in the hexagonal crystal system after tightly spliced may be represented as 2330.

In 2230, a seed crystal in the hexagonal crystal system to be grown may be obtained by performing a second cutting on the plurality of spliced orthohexagonal seed crystals in the hexagonal crystal system.

In some embodiments, the second cutting may include grinding the plurality of the plurality of tightly spliced orthohexagonal seed crystals in the hexagonal crystal system so that the plurality of tightly spliced orthohexagonal seed crystals in the hexagonal crystal system after the grinding operation is performed include a second setting size (e.g., 8 inches or 10 inches) and a second setting shape (e.g., a circle). In some embodiments, the plurality of tightly spliced orthohexagonal seed crystals in the hexagonal crystal system may be cut into spliced circular seed crystals with a diameter not less than 8 inches. In some embodiments, the second setting size may be larger than the first setting size. In some embodiments, the grinding operation may include grinding operation by a bias shaft. In some embodiments, a direction of the grinding operation by the bias shaft may be [0001] deflecting 3 degrees to 6 degrees pointing to the direction of the [11$\bar{2}$0], so that a step flow growth may be performed during the crystal growth to improve crystal quality.

In some embodiments, the performing the second cutting on the plurality of tightly spliced orthohexagonal seed crystals in the hexagonal crystal system may include performing a circular cutting by taking a center point of the central orthohexagonal seed crystal in the hexagonal crystal system as a center and a setting radius as a radius. In some embodiments, the setting radius may be determined according to a radius of a target seed crystal in the hexagonal crystal system. In some embodiments, the seed crystal in the hexagonal crystal system to be grown may be obtained by drawing a circular trajectory on a surface of the plurality of tightly spliced orthohexagonal seed crystals in the hexagonal crystal system with a range of 100 millimeters to 130 millimeters, and then performing the grinding operation on the circular trajectory. As shown in FIG. 23, the seed crystal in the hexagonal crystal system to be grown after the second cutting is performed may be represented as 2340.

During the crystal growth, the radial temperature gradient may cause a large thermal stress on a growth surface of the seed crystal, so that the growth surface of the seed crystal may be severely convex in a direction of the source material, and a defect (e.g., a microtubule, an inclusion) may be generated. In order to avoid more defects in the splicing gaps during the growth process due to the radial temperature gradient, a surface area of the central orthohexagonal seed crystal in the hexagonal crystal system may be larger than surface areas of orthohexagonal seed crystals in the hexagonal crystal system located in other positions. In some embodiments, the larger the surface area of the central orthohexagonal seed crystal in the hexagonal crystal system is, the less the defects in the splicing gap may be. In some embodiments, the surface area of the central orthohexagonal seed crystal in the hexagonal crystal system may be within a range of 25% to 55% of a surface area of the target seed crystal in the hexagonal crystal system or the seed crystal in the hexagonal crystal system to be grown. In some embodiments, the surface area of the central orthohexagonal seed crystal in the hexagonal crystal system may be within a range of 28% to 52% of the surface area of the target seed crystal in the hexagonal crystal system or the seed crystal in the hexagonal crystal system to be grown. In some embodiments, the surface area of the central orthohexagonal seed crystal in the hexagonal crystal system may be within a range of 30% to 50% of the surface area of the target seed crystal in the hexagonal crystal system or the seed crystal in the hexagonal crystal system to be grown. In some embodiments, the surface area of the central orthohexagonal seed crystal in the hexagonal crystal system may be within a range of 32% to 48% of the surface area of the target seed crystal in the hexagonal crystal system or the seed crystal in the hexagonal crystal system to be grown. In some embodiments, the surface area of the central orthohexagonal seed crystal in the hexagonal crystal system may be within a range of 35% to 45% of the surface area of the target seed crystal in the hexagonal crystal system or the seed crystal in the hexagonal crystal system to be grown. In some embodiments, the surface area of the central orthohexagonal seed crystal in the hexagonal crystal system may be within a range of 38% to 42% of the surface area of the target seed crystal in the hexagonal crystal system or the seed crystal in the hexagonal crystal system to be grown. In some embodiments, the surface area of the central orthohexagonal seed crystal in the hexagonal crystal system may be 40% of the surface area of the target seed crystal in the hexagonal crystal system or the seed crystal in the hexagonal crystal system to be grown.

In some embodiments, the seed crystal in the hexagonal crystal system to be grown may refer to a spliced seed crystal by splicing the plurality of orthohexagonal seed crystals in the hexagonal crystal system. A shape and a diameter of the seed crystal in the hexagonal crystal system to be grown may be equal to or substantially equal to a shape and a diameter of the target seed crystal in the hexagonal crystal system. In some embodiments, the shape of the target seed crystal in the hexagonal crystal system may be a circle and the diameter of the target seed crystal in the hexagonal crystal system may be 8 inches. The seed crystal in the hexagonal crystal system to be grown may a spliced circular seed crystal with a diameter of 8 inches by tightly splicing seven orthohexagonal seed crystals in the hexagonal crystal system.

In 2240, an intermediate seed crystal in the hexagonal crystal system may be obtained by performing a gap growth on the seed crystal in the hexagonal crystal system to be grown under a first setting condition.

In some embodiments, the gap growth may refer to a gap growth of the splicing gaps 2341 of the seed crystal in the hexagonal crystal system to be grown, so that the tightly spliced seed crystal in the hexagonal crystal system to be grown is grown into a whole with no gaps or gaps filled. In some embodiments, the gap growth may be performed under the first setting condition to promote the growth of crystal surfaces {11$\bar{2}$0} or {1$\bar{1}$00} and inhibit the growth of crystal surfaces (0001) or (000$\bar{1}$), thereby achieving the gap growth of the seed crystal in the hexagonal crystal system to be grown. In some embodiments, the first setting condition may refer to a condition that the gap growth can be performed on the seed crystal in the hexagonal crystal system to be grown. In some embodiments, the first setting condition may include a first setting temperature, a first setting pressure, a first setting carbon to silicon ratio, a setting gap growth time, etc.

The growth conditions in the first setting condition may be mutually restricted, accordingly, one or more growth conditions can be controlled according to one or more other growth conditions. In some embodiments, at different first setting temperatures and different first setting carbon to silicon ratios, growth rates of the crystal plane family {11

$\overline{2}0\}$ or $\{1\overline{1}00\}$ may be different. In some embodiments, when the first setting temperature is within a range of 1600° C. to 1700° C., the first setting carbon to silicon ratio may be controlled within a range of 1.1 to 1.6, the growth rate of the crystal plane family $\{11\overline{2}0\}$ or $\{1\overline{1}00\}$ may be quick, which is conducive to the gap growth.

If a temperature of the gap growth is too high, a rate of the gap growth may be slow, and the seed crystal in the hexagonal crystal system to be grown may be epitaxially grown to form a film portion, which results in many defects inside the intermediate seed crystal in the hexagonal crystal system and the target seed crystal in the hexagonal crystal system, and further results in a poor crystal quality. If the temperature of the gap growth is too low, source gases required for the gap growth can't fully react, which may result in that the rate of the gap growth is slow and the gap can't be filled, and further results in a poor quality of the intermediate seed crystal in the hexagonal crystal system. Therefore, the first setting temperature may be controlled within a preset temperature range. In some embodiments, the first setting temperature may be within a range of 1000° C. to 2000° C. In some embodiments, the first setting temperature may be within a range of 1050° C. to 1950° C. In some embodiments, the first setting temperature may be within a range of 1100° C. to 1900° C. In some embodiments, the first setting temperature may be within a range of 1150° C. to 1850° C. In some embodiments, the first setting temperature may be within a range of 1200° C. to 1800° C. In some embodiments, the first setting temperature may be within a range of 1300° C. to 1750° C. In some embodiments, the first setting temperature may be within a range of 1400° C. to 1700° C. In some embodiments, the first setting temperature may be within a range of 1420° C. to 1680° C. In some embodiments, the first setting temperature may be within a range of 1440° C. to 1660° C. In some embodiments, the first setting temperature may be within a range of 1460° C. to 1640° C. In some embodiments, the first setting temperature may be within a range of 1480° C. to 1620° C. In some embodiments, the first setting temperature may be within a range of 1500° C. to 1600° C. In some embodiments, the first setting temperature may be within a range of 1520° C. to 1580° C. In some embodiments, the first setting temperature may be within a range of 1540° C. to 1560° C.

If the first setting pressure is too large, a mean free path of the source gases required for the gap growth may be reduced, the splicing gap can't be filled and even some voids are left, resulting in the poor quality of the intermediate seed crystal in the hexagonal crystal system. If the first setting pressure is too small, the rate of the gap growth may be slow and a surface of the seed crystal in the hexagonal crystal system to be grown may be partially etched, which may increase the defects in the intermediate seed crystal in the hexagonal crystal system and lower the quality of the intermediate seed crystal in the hexagonal crystal system. Therefore, the first setting pressure may be controlled within a preset pressure range. In some embodiments, the first setting pressure may be within a range of 10 Pa to 1000 Pa. In some embodiments, the first setting pressure may be within a range of 15 Pa to 800 Pa. In some embodiments, the first setting pressure may be within a range of 20 Pa to 600 Pa. In some embodiments, the first setting pressure may be within a range of 25 Pa to 400 Pa. In some embodiments, the first setting pressure may be within a range of 30 Pa to 200 Pa. In some embodiments, the first setting pressure may be within a range of 40 Pa to 170 Pa. In some embodiments, the first setting pressure may be within a range of 50 Pa to 150 Pa. In some embodiments, the first setting pressure may be within a range of 60 Pa to 120 Pa. In some embodiments, the first setting pressure may be within a range of 70 Pa to 100 Pa. In some embodiments, the first setting pressure may be within a range of 80 Pa to 90 Pa.

In some embodiments, the first setting carbon to silicon ratio may be determined based on of a setting flow rate of a first setting source gas. In some embodiments, the first setting source gas may include a component required for the gap growth. In some embodiments, the first setting source gas may include silane, a carbon source (e.g., alkane), etc.

Whether the first setting carbon to silicon ratio is too high or too low, the source gases can't fully react. Therefore, the first setting carbon to silicon ratio may be controlled within a preset range. In some embodiments, the first setting carbon to silicon ratio may be within a range of 1.0 to 10.0. In some embodiments, the first setting carbon to silicon ratio may be within a range of 1.0 to 9.0. In some embodiments, the first setting carbon to silicon ratio may be within a range of 1.0 to 8.0. In some embodiments, the first setting carbon to silicon ratio may be within a range of 1.0 to 7.0. In some embodiments, the first setting carbon to silicon ratio may be within a range of 1.0 to 6.0. In some embodiments, the first setting carbon to silicon ratio may be within a range of 1.0 to 5.0. In some embodiments, the first setting carbon to silicon ratio may be within a range of 1.0 to 4.0. In some embodiments, the first setting carbon to silicon ratio may be within a range of 1.0 to 3.0. In some embodiments, the first setting carbon to silicon ratio may be within a range of 1.2 to 2.8. In some embodiments, the first setting carbon to silicon ratio may be within a range of 1.4 to 2.6. In some embodiments, the first setting carbon to silicon ratio may be within a range of 1.6 to 2.4. In some embodiments, the first setting carbon to silicon ratio may be within a range of 1.8 to 2.2. In some embodiments, the first setting carbon to silicon ratio may be within a range of 1.9 to 2.0.

In some embodiments, the first setting source gas may include $SiH_4$, $C_3H_8$, $H_2$, etc.

In some embodiments, a setting flow of $SiH_4$ may be within a range of 50 mL/min to 300 mL/min. In some embodiments, the setting flow of $SiH_4$ may be within a range of 60 mL/min to 280 mL/min. In some embodiments, the setting flow of $SiH_4$ may be within a range of 70 mL/min to 260 mL/min. In some embodiments, the setting flow of $SiH_4$ may be within a range of 80 mL/min to 240 mL/min. In some embodiments, the setting flow of $SiH_4$ may be within a range of 90 mL/min to 220 mL/min. In some embodiments, the setting flow of $SiH_4$ may be within a range of 100 mL/min to 200 mL/min. In some embodiments, the setting flow of $SiH_4$ may be within a range of 110 mL/min to 190 mL/min. In some embodiments, the setting flow of $SiH_4$ may be within a range of 120 mL/min to 180 mL/min. In some embodiments, the setting flow of $SiH_4$ may be within a range of 130 mL/min to 170 mL/min. In some embodiments, the setting flow of $SiH_4$ may be within a range of 140 mL/min to 160 mL/min. In some embodiments, the setting flow of $SiH_4$ may be 150 mL/min.

In some embodiments, a setting flow of $C_3H_8$ may be within a range of 10 mL/min to 200 mL/min. In some embodiments, the setting flow of $C_3H_8$ may be within a range of 20 mL/min to 180 mL/min. In some embodiments, the setting flow of $C_3H_8$ may be within a range of 30 mL/min to 160 mL/min. In some embodiments, the setting flow of $C_3H_8$ may be within a range of 40 mL/min to 140 mL/min. In some embodiments, the setting flow of $C_3H_8$ may be within a range of 50 mL/min to 120 mL/min. In some embodiments, the setting flow of $C_3H_8$ may be within a range of 60 mL/min to 100 mL/min. In some embodiments, the setting flow of $C_3H_8$ may be within a range of 70 mL/min to 90 mL/min. In some embodiments, the setting flow of $C_3H_8$ may be within a range of 75 mL/min to 85 mL/min.

In some embodiments, a setting flow of $H_2$ may be within a range of 10 mL/min to 200 mL/min. In some embodiments, the setting flow of $H_2$ may be within a range of 20 mL/min to 180 mL/min. In some embodiments, the setting flow of $H_2$ may be within a range of 30 mL/min to 160 mL/min. In some embodiments, the setting flow of $H_2$ may be within a range of 40 mL/min to 140 mL/min. In some embodiments, the setting flow of $H_2$ may be within a range of 50 mL/min to 120 mL/min. In some embodiments, the setting flow of $H_2$ may be within a range of 60 mL/min to 100 mL/min. In some embodiments, the setting flow of $H_2$ may be within a range of 70 mL/min to 90 mL/min. In some embodiments, the setting flow of $H_2$ may be within a range of 75 mL/min to 85 mL/min.

In some embodiments, the gap growth time may be determined based on a gap size (e.g., a gap depth) and the rate of the gap growth of the seed crystal in the hexagonal crystal system to be grown. If the gap growth time is too long, the seed crystal in the hexagonal crystal system to be grown may be epitaxially grown to form a film portion, which results in many defects inside the intermediate seed crystal in the hexagonal crystal system and the target seed crystal in the hexagonal crystal system, and further results in the poor crystal quality. If the gap growth time is too short, the splicing gap can't be filled, and even some voids may be left, resulting in the poor quality of the intermediate seed crystal in the hexagonal crystal system. Therefore, the gap growth time may be controlled within a preset time range. In some embodiments, the gap growth time may be set within a range of 3 hours to 7 hours. In some embodiments, the gap growth time may be set within a range of 3.5 hours to 6.5 hours. In some embodiments, the gap growth time may be set within a range of 4 hours to 6 hours. In some embodiments, the gap growth time may be set within a range of 4.5 hours to 5.5 hours. In some embodiments, the gap growth time may be set to 5 hours.

In some embodiments, the gap growth may be performed by chemical vapor deposition (CVD). Correspondingly, the gap growth may be performed in a chemical vapor deposition (CVD) device.

The intermediate seed crystal in the hexagonal crystal system may refer to a seed crystal after the splicing gap growth of the seed crystal in the hexagonal crystal system to be grown is completed.

In 2250, the target seed crystal in the hexagonal crystal system may be obtained by performing an epitaxial growth on the intermediate seed crystal in the hexagonal crystal system under a second setting condition.

In some embodiments, the epitaxial growth may refer to that the intermediate seed crystal in the hexagonal crystal system grows along a direction perpendicular to the crystal surface (0001) or (000 $\bar{1}$), so that the intermediate seed crystal in the hexagonal crystal system grows into the target seed crystal in the hexagonal crystal system with a setting thickness. In some embodiments, the setting thickness may be within a range of 400 microns to 700 microns. In some embodiments, the setting thickness may be within a range of 450 microns to 650 microns. In some embodiments, the setting thickness may be within a range of 500 microns to 600 microns. In some embodiments, the setting thickness may be within a range of 540 microns to 560 microns.

In some embodiments, the epitaxial growth may be performed under the second setting condition to promote the growth of crystal surfaces (0001) or (000 $\bar{1}$) and inhibit the growth of crystal surfaces $\{11\bar{2}0\}$ or $\{1\bar{1}00\}$. In some embodiments, the second setting condition may refer to a condition that the epitaxial growth can be performed on the intermediate seed crystal in the hexagonal crystal system. In some embodiments, the second setting condition may include a second setting temperature, a second setting pressure, a second setting carbon to silicon ratio, a setting epitaxial growth time, etc.

If a temperature of the epitaxial growth is too high, a rate of the epitaxial growth may be slow and a surface of the intermediate seed crystal in the hexagonal crystal system may be partially etched, which results in many defects inside the intermediate seed crystal in the hexagonal crystal system and the target seed crystal in the hexagonal crystal system, and further results in a poor crystal quality. If the temperature of the epitaxial growth is too low, the source gases required for the epitaxial growth can't fully react, which may result in that the rate of the epitaxial growth is slow, and further results in the poor quality of the target seed crystal in the hexagonal crystal system. Therefore, the second setting temperature may be controlled within a preset temperature range. In some embodiments, the second setting temperature may be within a range of 1100° C. to 2000° C. In some embodiments, the second setting temperature may be within a range of 1200° C. to 1900° C. In some embodiments, the second setting temperature may be within a range of 1300° C. to 1800° C. In some embodiments, the second setting temperature may be within a range of 1400° C. to 1700° C. In some embodiments, the second setting temperature may be within a range of 1420° C. to 1680° C. In some embodiments, the second setting temperature may be within a range of 1440° C. to 1640° C. In some embodiments, the second setting temperature may be within a range of 1480° C. to 1620° C. In some embodiments, the second setting temperature may be within a range of 1500° C. to 1600° C. In some embodiments, the second setting temperature may be within a range of 1520° C. to 1580° C. In some embodiments, the second setting temperature may be within a range of 1540° C. to 1560° C.

If the second setting pressure is too large, a mean free path of the source gases required for the epitaxial growth may be reduced, resulting in that the rate of the epitaxial growth is slow. If the second setting pressure is too small, the rate of the gap growth may be slow, and the surface of the intermediate seed crystal in the hexagonal crystal system may be partially etched, which further increases the defects in the target seed crystal in the hexagonal crystal system. Therefore, the second setting pressure may be controlled within a preset pressure range. In some embodiments, the second setting pressure may be within a range of 10 Pa to 1000 Pa. In some embodiments, the second setting pressure may be within a range of 15 Pa to 800 Pa. In some embodiments, the second setting pressure may be within a range of 20 Pa to 600 Pa. In some embodiments, the second setting pressure may be within a range of 25 Pa to 400 Pa. In some embodiments, the second setting pressure may be within a range of 30 Pa to 200 Pa. In some embodiments, the second setting pressure may be within a range of 40 Pa to 170 Pa. In some embodiments, the second setting pressure may be within a range of 50 Pa to 150 Pa. In some embodiments, the second setting pressure may be within a range of 60 Pa to 120 Pa. In some embodiments, the second setting pressure may be within a range of 70 Pa to 100 Pa. In some embodiments, the second setting pressure may be within a range of 80 Pa to 90 Pa.

In some embodiments, the second setting carbon to silicon ratio may be determined based on a setting a flow of a second setting source gas. In some embodiments, the second setting source gas may include a component required for the epitaxial growth. In some embodiments, the second setting source gas may include silane, a carbon source (e.g., alkane), etc. In some embodiments, the component of the second setting source gas and the component of the first setting source gas may be the same or different. In some embodiments, the first setting source gas may include $SiH_4$, $C_3H_8$, $H_2$, etc.

Whether the second setting carbon to silicon ratio is too high or too low, the source gases can't fully react to perform the epitaxial growth. Therefore, the second setting carbon to silicon ratio may be controlled within a preset range.

In some embodiments, the second setting carbon to silicon ratio may be within a range of 0.1 to 2. In some embodiments, the second setting carbon to silicon ratio may be within a range of 0.3 to 1.7. In some embodiments, the second setting carbon to silicon ratio may be within a range of 0.5 to 1.5. In some embodiments, the second setting carbon to silicon ratio may be within a range of 0.8 to 1.2. In some embodiments, the second setting carbon to silicon ratio may be within a range of 0.9 to 1.1. In some embodiments, the second setting carbon to silicon ratio may be within a range of 0.92 to 1.08. In some embodiments, the second setting carbon to silicon ratio may be within a range of 0.95 to 1.05. In some embodiments, the second setting carbon to silicon ratio may be within a range of 0.96 to 1.04. In some embodiments, the second setting carbon to silicon ratio may be within a range of 0.97 to 1.03. In some embodiments, the second setting carbon to silicon ratio may be within a range of 0.98 to 1.02. In some embodiments, the second setting carbon to silicon ratio may be within a range of 0.99 to 1.01. In some embodiments, the second setting carbon to silicon ratio may be 1.

In some embodiments, the epitaxial growth time may be determined based on a thickness of the target seed crystal in the hexagonal crystal system. In some embodiments, the epitaxial growth may be performed in a chemical vapor deposition (CVD) device.

In some embodiments, the target seed crystal in the hexagonal crystal system may refer to a seed crystal after a diameter expanding operation is performed on the seed crystal in the hexagonal crystal system to be expanded. In some embodiments, a diameter of the target seed crystal in the hexagonal crystal system may be not less than twice a diameter of the seed crystal in the hexagonal crystal system to be expanded. In some embodiments, the diameter of the target seed crystal in the hexagonal crystal system may be not less than 2.5 times the diameter of the seed crystal in the hexagonal crystal system to be expanded. In some embodiments, the diameter of the target seed crystal in the hexagonal crystal system may be not less than 3 times the diameter of the seed crystal in the hexagonal crystal system to be expanded. In some embodiments, the diameter of the target seed crystal in the hexagonal crystal system may be larger than or equal to 8 inches. In some embodiments, the diameter of the target seed crystal in the hexagonal crystal system may include 8 inches, 9 inches, 10 inches, etc. In some embodiments, the target seed crystal in the hexagonal crystal system may be repeated the process 2200 as the seed crystal in the hexagonal crystal system to be expanded to grow a seed crystal in the hexagonal crystal system with a larger diameter.

In some embodiments, the epitaxial growth may include growing a crystal layer with a setting size and a same crystal orientation as the seed crystal on the seed crystal. Since the seed crystal includes various defects and the defects are usually inherited during the crystal growth, the seed crystal is required to eliminate the defects by performing an in-situ etching operation. In some embodiments, before the gap growth is performed, the in-situ etching operation may be performed on the seed crystal in the hexagonal crystal system to be grown under a third setting condition to improve a surface flatness of the seed crystal in the hexagonal crystal system to be grown. In some embodiments, the in-situ etching operation may be performed in a chemical vapor deposition (CVD) device.

In some embodiments, the CVD device may be pre-treated before the in-situ etching operation is performed. The pre-treatment may include a vacuum operation, a heating operation, etc. In some embodiments, the vacuum operation may refer to that a pressure of the CVD device is reduced to $10^{-5}$ Pa to remove most of air in the CVD device. In some embodiments, the heating operation may include heating a temperature of the CVD device within a range of 400° C. to 800° C. In some embodiments, the heating operation may also include maintaining the temperature of the CVD device within the range of 400° C. to 800° C. for about 1 hour.

In some embodiments, the third setting condition may include a setting flow of a setting gas, a third setting temperature, a third setting pressure, and a setting etching time. In some embodiments, the setting gas may refer to a gas that reacts with carbon. In some embodiments, the setting gas may include hydrogen. Hydrogen can react with carbon in a silicon carbide seed crystal in the hexagonal crystal system to be grown to form hydrocarbon to perform the in-situ etching operation.

If the setting flow is too high, the introduced setting gas (e.g., hydrogen) may be excessive, resulting in a waste of the setting gas. In addition, if the setting flow is too high, the temperature field may be unstable, which further affects an etching uniformity of the silicon carbide seed crystal in the hexagonal crystal system to be grown. If the setting flow is too low, an etching efficiency may be low. Therefore, the setting flow may be controlled within a preset flow range. In some embodiments, the setting flow may be within a range of 5 L/min to 200 L/min. In some embodiments, the setting flow may be within a range of 10 L/min to 150 L/min. In some embodiments, the setting flow may be within a range of 15 L/min to 100 L/min. In some embodiments, the setting flow may be within a range of 20 L/min to 80 L/min. In some embodiments, the setting flow may be within a range of 25 L/min to 75 L/min. In some embodiments, the setting flow may be within a range of 30 L/min to 70 L/min. In some embodiments, the setting flow may be within a range of 35 L/min to 65 L/min. In some embodiments, the setting flow may be within a range of 40 L/min to 60 L/min. In some embodiments, the setting flow may be within a range of 44 L/min to 46 L/min.

If the third setting temperature is too high, the etching efficiency may be too fast or uncontrollable, which affects the quality of the seed crystal in the hexagonal crystal system to be grown. If the third setting temperature is too low, the setting gas can't react with the carbon the silicon carbide seed crystal in the hexagonal crystal system to be grown, which results in that the in-situ etching operation can't be performed. Therefore, the third setting temperature may be controlled within a preset temperature range. In some embodiments, the third setting temperature may be within a range of 1200° C. to 1500° C. In some embodiments, the third setting temperature may be within a range of 1250° C. to 1450° C. In some embodiments, the third setting temperature may be within a range of 1300° C. to 1400° C. In some embodiments, the third setting temperature may be within a range of 1340° C. to 1360° C.

If the third setting pressure is too high, vapor substances generated by the reaction between the setting gas and the seed crystal in the hexagonal crystal system to be grown can't be effectively discharged, which further results in the poor quality of the etched seed crystal in the hexagonal crystal system to be grown. If the third setting pressure is too low, the etching efficiency may be too fast or uncontrollable, which affects the quality of the seed crystal in the hexagonal crystal system to be grown. Therefore, the third setting pressure may be controlled within a preset pressure range. In some embodiments, the third setting pressure may be within a range of 1 kPa to 12 kPa. In some embodiments, the third setting pressure may be within a range of 2 kPa to 11 kPa. In some embodiments, the third setting pressure may be within a range of 3 kPa to 10 kPa. In some embodiments, the third setting pressure may be within a range of 4 kPa to 9 kPa range. In some embodiments, the third setting pressure may be within a range of 5 kPa to 8 kPa. In some embodiments, the third setting pressure may be within a range of 6 kPa to 7 kPa range.

The setting etching time may be determined based on a surface flatness and a surface morphology of the seed crystal in the hexagonal crystal system to be grown. If the setting etching time is too long, the uniformity of the etched seed crystal in the hexagonal crystal system to be grown can't be ensured. If the setting etching time is too short, many defects may be inside the seed crystal in the hexagonal crystal system to be grown, which further results in the poor quality of the seed crystal in the hexagonal crystal system to be grown. Therefore, the setting etching time may be controlled within a setting time range. In some embodiments, the setting etching time may be within a range of 10 minutes to 30 minutes. In some embodiments, the setting etching time may be within a range of 12 minutes to 28 minutes. In some embodiments, the setting etching time may be within a range of 15 minutes to 25 minutes. In some embodiments, the setting etching time may be within a range of 18 minutes to 22 minutes. In some embodiments, the setting etching time may be within a range of 19 minutes to 20 minutes.

In some embodiments, according to intrinsic characteristics of the seed crystal in the hexagonal crystal system, the seed crystal in the hexagonal crystal system may be cut into the orthohexagonal seed crystals in the hexagonal crystal system of which six side surfaces are the crystal plane family $\{11\bar{2}0\}$ or $\{1\bar{1}00\}$. In crystallography, physicochemical characteristics of the six side surfaces of the crystal plane family $\{11\bar{2}0\}$ or $\{1\bar{1}00\}$ are the same, so that the quality of the gap growth between the same crystal plane family may be higher or dislocations may be less, which further results in that the quality the target seed crystal in the hexagonal crystal system is better.

It should be noted that the above description of the process 2200 is merely provided for illustration, and not intended to limit the scope of the present disclosure. For persons having ordinary skills in the art, multiple variations and modifications may be made to the process 2200 under the teachings of the present disclosure. However, those variations and modifications do not depart from the scope of the present disclosure. The above preparation process is merely provided for illustration purposes, process parameters involved in different embodiments may be the same or different. A sequence of the above operations may not be unique, and the sequence between the operations may be adjusted in different embodiments. One or more operations may be omitted. The above examples should not be intended to limit the scope of the present disclosure.

The embodiment provides a method for preparing a seed crystal. The method may include the following operations. In S1, seven 6H—SiC seed crystals with a diameter of 110 millimeters to 160 millimeters may be prepared, and the seven 6H—SiC seed crystals may be polished to make surfaces of the 6H—SiC seed crystals flat. For example, a surface $(000\bar{1})$ of the 6H—SiC seed crystal may be polished, and then a surface (0001) may be polished. A thickness of the polished 6H—SiC seed crystal may be about 100 microns to 150 microns.

In S2, orthohexagonal 6H—SiC seed crystals with cutting faces being corresponding to the lattice plane family $\{1\bar{1}00\}$ may be obtained by performing a first cutting on the polished 6H—SiC seed crystals perpendicular to the surface (0001), for example, the orthohexagonal seed crystals 2321 in the hexagonal crystal system with the crystal plane family $\{1\bar{1}00\}$.

In S3, the seven orthohexagonal 6H—SiC seed crystals may be tightly spliced by taking one orthohexagonal 6H—SiC seed crystal as a center, tightly splicing six orthohexagonal 6H—SiC seed crystals in a periphery of the orthohexagonal 6H—SiC seed crystal located at the center, and arranging as a plurality of tightly spliced orthohexagonal 6H—SiC crystal seed crystals 2330 shown in FIG. 23. The tightly spliced seven orthohexagonal 6H—SiC seed crystals may be bonded to a platform with a horizontal surface (e.g., a stainless steel plate) by an adhesion agent, so that the (0001) surfaces of the seven orthohexagonal 6H—SiC seed crystals are all facing upwards and the splicing surfaces are aligned.

In S4, a second cutting may be performed on the tightly spliced seven orthohexagonal 6H—SiC seed crystals that are bonded to the platform. A circular trajectory may be drawn on a surface of the tightly spliced seven orthohexagonal 6H—SiC seed crystals that are bonded to the platform by taking a center point of the orthohexagonal 6H—SiC seed crystal located at the center as a center and a range of 100 millimeters to 130 millimeters as a radius. Then a grinding operation by the bias shaft with a grinding direction by the bias shaft being [0001] deflecting 3.8 degrees pointing to a direction of $[11\bar{2}0]$ may be performed on the circular trajectory to obtain a circular 6H—SiC seed crystal, for example, as shown in FIG. 23, a seed crystal 2340 in the hexagonal crystal system to be grown after the second cutting is performed.

In S5, the circular 6H—SiC seed crystal bonded on the platform may be removed. The circular 6H—Si seed crystal may be placed in an acetone solution and an ultrasonic cleaning may be performed, and then washed with deionized water to remove paraffin and particulates on the circular 6H—SiC seed crystal. A grinding operation and a finely polishing operation may be performed on a periphery of the circular 6H—SiC seed crystal to remove scratches on the surface of the circular 6H—SiC seed crystal.

After the grinding operation and the finely polishing operation are performed, the circular 6H—SiC seed crystal may be placed in an isopropyl alcohol solution and ultrasonically washed at a temperature of 30° C. to 100° C. for 10 minutes to 100 minutes. Then an ultrasonic cleaning with deionized water may be performed on the circular 6H—SiC seed crystal for 5 minutes to further remove impurities and organics on the surface of the circular 6H—SiC seed crystal to obtain a clean circular 6H—SiC seed crystal. Since the adhesive (e.g., paraffin) bonded on the circular 6H—SiC seed crystal is cleaned off, the clean circular 6H—SiC seed crystal may refer to the seven circular small seed crystals that can be spliced to the seed crystal 2340 shown in FIG. 23 in the hexagonal crystal system to be grown after the second cutting is performed.

In S6, the cleaned circular 6H—SiC seed crystals may be arranged according to a grinding sequence in S4, and bonded to a graphite tray with a horizontal surface by an adhesion agent (e.g., sucrose). The tray with the circular 6H—SiC seed crystals boned may be put into a CVD device. The CVD device may be first vacuumized to $1\times10^{-5}$ Pa to $1\times10^{-3}$ Pa and then heated to 600° C. to 1000° C. at a heating rate of 1° C./min to 20° C./min. The temperature of the CVD device may be maintained for 0.5 hours to 2 hours to remove the air in the CVD device. Then, the CVD device may be heated to 1200° C. to 1600° C., hydrogen may be introduced into the CVD device at a rate of 20 L/min to 80 L/min to maintain a pressure in the CVD device within a range of 2000 Pa to 10000 Pa, and an in-situ etching operation may be performed on the circular 6H—SiC seed crystals by maintaining the temperature of the CVD device for 10 minutes to 30 minutes to remove scratches on the surface of the circular 6H—SiC seed crystals and improve the surface flatness and the surface morphology of the circular 6H—SiC seed crystals.

In S7, a gap growth with a crystal plane family {1 $\overline{1}$00} may be performed on the circular 6H—SiC seed crystal. Hydrogen may be introduced into the CVD device so that the pressure in the CVD device is atmospheric pressure and the CVD device may be heated to a temperature of 1500° C. to 2000° C. SiH$_4$, C$_3$H$_8$, and H$_2$ may be introduced into the CVD device at rates of 100 mL/min to 200 mL/min, 40 mL/min to 100 mL/min, 40 mL/min to 100 mL/min respectively to maintain a silicon to carbon ratio in the CVD device within a range of 0.0 to 5.0. Then the pressure in the CVD device may be reduced to 30 Pa to 200 Pa and the gap growth of the crystal plane family {1 $\overline{1}$00} may be performed. The gap growth time may be within a range of 2 hours to 5 hours.

In S8, an epitaxial growth may be performed on the circular 6H—SiC seed crystal in S7. The temperature of the CVD device may be adjusted to a range of 1500° C. to 1700° C. The epitaxial growth of a crystal surface (0001) may be performed by introducing SiH$_4$, C$_3$H$_8$, and H$_2$ into the CVD device at rates of 100 mL/min to 300 mL/min, 40 mL/min to 100 mL/min, 40 mL/min to 100 mL/min respectively to maintain a silicon to carbon ratio in the CVD device within a range of 0.5 to 1.5. When the epitaxial growth reaches a setting thickness of 500 microns to 900 microns, the pressure in the CVD device may be adjusted to the atmospheric pressure by introducing helium to stop the epitaxial growth. Then the temperature of the CVD device may be slowly cooled to room temperature through 60 hours to 120 hours. The 6H—SiC seed crystal with a diameter larger than 250 millimeters may be taken out of the CVD device.

The embodiment provides another process for preparing a seed crystal. The method may include the following operations. In S1, seven 6H—SiC seed crystals with a diameter of 110 millimeters to 160 millimeters may be prepared, and the seven 6H—SiC seed crystals may be polished to make surfaces of the 6H—SiC seed crystals flat. For example, a surface (000 $\overline{1}$) of the 6H—SiC seed crystal may be polished, and then a surface (0001) may be polished. A thickness of the polished 6H—SiC seed crystal may be about 100 microns to 150 microns.

In S2, orthohexagonal 6H—SiC seed crystals with cutting faces being corresponding to a lattice plane family {11 $\overline{2}$0} may be obtained by performing a first cutting on the polished 6H—SiC seed crystals perpendicular to the surface (0001), for example, the orthohexagonal seed crystal 2322 in the hexagonal crystal system with the crystal plane family {11 $\overline{2}$0}.

In S3, the seven orthohexagonal 6H—SiC seed crystals may be tightly spliced by taking one orthohexagonal 6H—SiC seed crystal as a center, tightly splicing six orthohexagonal 6H—SiC seed crystals in a periphery of the orthohexagonal 6H—SiC seed crystal located at the center, and arranging as a plurality of tightly spliced orthohexagonal 6H—SiC crystal seed crystals 2330 shown in FIG. 23. The tightly spliced seven orthohexagonal 6H—SiC seed crystals may be bonded to a platform with a horizontal surface (e.g., a stainless steel plate) by an adhesion agent (e.g., paraffin), so that the (0001) surfaces of the seven orthohexagonal 6H—SiC seed crystals are all facing upwards, and the splicing surfaces are aligned.

In S4, a second cutting may be performed on the tightly spliced seven orthohexagonal 6H—SiC seed crystals that are bonded to the platform. A circular trajectory may be drawn on a surface of the tightly spliced seven orthohexagonal 6H—SiC seed crystals that are bonded to the platform by taking a center point of the orthohexagonal 6H—SiC seed crystal located at the center as a center and a range of 100 millimeters to 130 millimeters as a radius. Then a grinding operation by the bias shaft with a grinding direction by the bias shaft being [0001] deflecting 3.8 degrees pointing to a direction of [11 $\overline{2}$0] may be performed on the circular trajectory to obtain a circular 6H—SiC seed crystal, for example, as shown in FIG. 23, the seed crystal 2340 in the hexagonal crystal system to be grown after the second cutting is performed.

In S5, the circular 6H—SiC seed crystal bonded on the platform may be removed. The circular 6H—Si seed crystal may be placed in an acetone solution and an ultrasonic cleaning may be performed, and then washed with deionized water to remove paraffin and particulates on the circular 6H—SiC seed crystal. A grinding operation and a finely polishing operation may be performed on a periphery of the circular 6H—SiC seed crystal to remove scratches on the surface of the circular 6H—SiC seed crystal.

After the grinding operation and the finely polishing operation are performed, the circular 6H—SiC seed crystal may be placed in an isopropyl alcohol solution and ultrasonically washed at a temperature of 30° C. to 100° C. for 10 minutes to 70 minutes. Then an ultrasonic cleaning with deionized water may be performed on the circular 6H—SiC seed crystal for 5 minutes to 20 minutes to further remove impurities and organics on the surface of the circular 6H—SiC seed crystal to obtain a clean circular 6H—SiC seed crystal. Since the adhesive (e.g., paraffin) bonded on the circular 6H—SiC seed crystal is cleaned off, the clean circular 6H—SiC seed crystal may refer to the seven circular small seed crystals that can be spliced to the seed crystal 2340 shown in FIG. 23 in the hexagonal crystal system to be grown after the second cutting is performed.

In S6, the cleaned circular 6H—SiC seed crystals may be arranged according to a grinding sequence in S4, and bonded to a graphite tray with a horizontal surface by an adhesion agent (e.g., sucrose). The tray with the circular 6H—SiC seed crystals boned may be put into a CVD device. The CVD device may be first vacuumized to $1\times10^{-5}$ Pa to $1\times10^{-3}$ Pa, and then heated to 600° C. to 1000° C. at a heating rate of 1° C./min to 20° C./min. The temperature of the CVD device may be maintained for 0.5 hours to 2 hours to remove the air in the CVD device. Then, the CVD device may be heated to 1300° C. to 1600° C., hydrogen may be introduced into the CVD device at a rate of 10 L/min to 100 L/min to maintain a pressure in the CVD device within a range of 2000 Pa to 10000 Pa, and an in-situ etching operation may be performed on the circular 6H—SiC seed crystals by maintaining the temperature of the CVD device for 10 minutes to 60 minutes to remove scratches on the surface of the circular 6H—SiC seed crystal and improve the surface flatness and the surface morphology of the circular 6H—SiC seed crystals.

In S7, a gap growth with a crystal plane family $\{11\bar{2}0\}$ may be performed on the circular 6H—SiC seed crystal. Hydrogen may be introduced into the CVD device so that the pressure in the CVD device is atmospheric pressure, and the CVD device may be heated to a temperature of 1500° C. to 1800° C. $SiH_4$, $C_3H_8$, and $H_2$ may be introduced into the CVD device at rates of 50 mL/min to 200 mL/min, 20 mL/min to 150 mL/min, 20 mL/min to 100 mL/min respectively to maintain a silicon to carbon ratio in the CVD device within a range of 1 to 4. Then the pressure in the CVD device may be reduced to 100 Pa to 400 Pa and the gap growth of the crystal plane family $\{11\bar{2}0\}$ may be performed. The gap growth time may be within a range of 2 hours to 5 hours.

In S8, an epitaxial growth may be performed on the circular 6H—SiC seed crystal in S7. The temperature of the CVD device may be adjusted to a range of 1500° C. to 1700° C. The epitaxial growth of a crystal surface (0001) may be performed by introducing $SiH_4$, $C_3H_8$, and $H_2$ into the CVD device at rates of 50 mL/min to 200 mL/min, 20 mL/min to 150 mL/min, 20 mL/min to 100 mL/min respectively to maintain a silicon to carbon ratio in the CVD device within a range of 0.5 to 2. When the epitaxial growth reaches a setting thickness of 500 microns to 800 microns, the pressure in the CVD device may be adjusted to the atmospheric pressure by introducing helium to stop the epitaxial growth. Then the temperature of the CVD device may be slowly cooled to room temperature through 50 hours to 120 hours. The 6H—SiC seed crystal with a diameter larger than 200 millimeters may be taken out of the CVD device.

According to the two embodiments above, a gap growth of a crystal plane family $\{1\bar{1}00\}$ and a gap growth of a crystal plane family $\{11\bar{2}0\}$ are performed respectively. Since the physicochemical characteristics of a specific crystal plane family are the same and both the two embodiments involve the gap growth of a single crystal plane family, the quality of the gap growth can be improved. In addition, atoms deposited on the surfaces of the crystal plane families $\{1\bar{1}00\}$ and $\{11\bar{2}0\}$ are easy to migrate, so that the epitaxial growth is uniform, and defects are not easy to form.

In order to avoid more defects in the splicing gaps during the growth process due to the radial temperature gradient, in some embodiments, one complete orthohexagonal seed crystal in the hexagonal crystal system may be placed at the central position, so that there is no splicing gap in the central portion of the crystal seed crystal in the hexagonal crystal system to be grown after the second cutting is performed, which provides a stable substrate for the gap growth to greatly reduce the defects of the target crystal seed crystal in the hexagonal crystal system and improve the quality of the target crystal seed crystal in the hexagonal crystal system.

The possible beneficial effects of the embodiments of the present disclosure may include but not limited to the following. (1) During the crystal growth, the heating component may be controlled based on the temperature in the growth chamber during the crystal growth obtained by the temperature sensing component, so that the radial temperature difference in the growth chamber does not exceed the first preset range of the average temperature in the growth chamber or the preset radial temperature difference during the crystal growth. In addition, the axial temperature gradient in the growth chamber may be maintained stable during the crystal growth, resulting in that the crystal growth is stable and further large-size and high-quality crystals can be prepared. (2) The growth chamber may be heated by at least one heating component and the radial temperature may be compensated. For example, the radial temperature difference and/or the radial temperature gradient may be reduced. (3) The flow channel(s) on the heating unit(s) of the second heating component may prevent graphitized carbon particles in the source material to move upward, thereby reducing the defects such as carbon inclusion microtubules in the crystal and improving crystal quality. (4) The source material may be distributed on the heating units of the second heating component at different heights to heat the source material in multi layers, which can ensure that the source material can be heated more uniformly and fully. Accordingly, the utilization rate of the source material can be improved, the carbonization of the source material can be reduced, and crystal quality can be further improved. (5) The growth surface of the prepared crystal is flat, a protrusion degree is low, a density of carbon inclusion particles in the crystal is low, and the crystal quality is high. (6) The gap growth of one single crystal plane family may be performed according to the intrinsic characteristics of the seed crystal in the hexagonal crystal system, which can improve the quality of the gap growth. (7) In order to avoid more defects in the splicing gaps during the growth process due to the radial temperature gradient, one complete orthohexagonal seed crystal in the hexagonal crystal system may be placed at the central position and/or the surface area of the orthohexagonal seed crystal in the hexagonal crystal system at the central position may be larger than the surface area of the orthohexagonal seed crystal in the hexagonal crystal system at other positions, which provides a stable substrate for the gap growth to greatly reduce the defects of the target crystal seed crystal in the hexagonal crystal system and improve the quality of the target crystal seed crystal in the hexagonal crystal system. It should be noted that different embodiments may have different beneficial effects. In different embodiments, the possible beneficial effects may be any one of the above effects, or any combination thereof, or any other beneficial effects that may be obtained.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and "some embodiments" mean that a particular feature, structure, or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures, or characteristics may be combined as suitable in one or more embodiments of the present disclosure.

In addition, those skilled in the art can understand that various aspects of the present disclosure can be illustrated and described through a count of patentable categories or situations, including any new and useful process, machine, product, substances, improvements, or any combination thereof. Correspondingly, various aspects of the present disclosure can be completely executed by hardware, can be completely executed by software (including firmware, resident software, microcode, etc.), or can be executed by a combination of hardware and software. The above hardware or software can all be referred to as "data blocks," "modules," "engines," "units," "components," or "systems." In addition, various aspects of the present disclosure may be embodied as a computer product located in one or more computer-readable media, and the product may include computer-readable program codes.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claim subject matter lies in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate" or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting effect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A device for preparing a crystal, comprising:
a growth chamber configured to execute a crystal growth; and
a heating component including at least one heating unit, wherein
the at least one heating unit is located inside the growth chamber, and
the at least one heating unit includes at least one flow channel, wherein the at least one flow channel is opened on an upper surface of the at least one heating unit and a source material is placed on the upper surface of the at least one heating unit during the crystal growth.

2. The device of claim 1, wherein
a density of the at least one flow channel opened in a central region of the upper surface of the at least one heating unit is less than a density of the at least one flow channel opened in an edge area of the upper surface of the at least one heating unit.

3. The device of claim 1, wherein the heating component further includes at least one heating unit located outside the growth chamber.

4. The device of claim 3, wherein
a density of the at least one flow channel opened in a central region of the upper surface of the at least one heating unit is larger than a density of the at least one flow channel opened in an edge area of the upper surface of the at least one heating unit.

5. The device of claim 3, wherein the at least one heating unit located outside the growth chamber is partially disposed around an outer periphery of the growth chamber.

6. The device of claim 3, wherein the at least one heating unit located outside the growth chamber includes at least three first heating units, wherein the at least three first heating units are disposed around an outside of the growth chamber and correspond to positions of a crystallization region, a source material region, and a vapor transport region between the crystallization region and the source material region in the growth chamber, respectively.

7. The device of claim 6, wherein the at least three first heating units are individually controlled.

8. The device of claim 6, wherein each of the at least three first heating units includes at least one first electrode and at least one second electrode distributed along a peripheral direction of the first heating unit.

9. The device of claim 3, wherein the at least one heating unit located outside the growth chamber is located on an upper surface and/or a lower surface outside the growth chamber.

10. The device of claim 9, wherein a contact area between the at least one heating unit located on the upper surface and/or the lower surface and the upper surface and/or the lower surface accounts for more than 50% of an area of the upper surface and/or the lower surface.

11. The device of claim 9, wherein the heating component further includes at least one first electrode, at least one second electrode, and an electrode fixing plate, wherein the electrode fixing plate is configured to fix the at least one first electrode and the at least one second electrode.

12. The device of claim 11, wherein
the at least one first electrode is fixed to the at least one heating unit located on the upper surface and/or the lower surface and the upper surface through at least one first hole, and
the at least one second electrode is fixed to the upper surface and/or the lower surface through at least one second hole.

13. The device of claim 12, wherein a diameter of the at least one first electrode is less than a diameter of the at least one second electrode.

14. The device of claim 1, wherein a cross-sectional area of one of the at least one flow channel does not exceed 1.5 times a particle size of the source material.

15. The device of claim 1, wherein for one of the at least one heating unit, a total opening area of the at least one flow channel on the upper surface of the heating unit is within a range of 20% to 60% of an area of the heating unit.

16. The device of claim 1, wherein the at least one heating unit is connected to at least one conduction ring through at least one conduction electrode, the at least one conduction ring located on an upper surface or/and a lower surface of the at least one heating unit.

17. The device of claim 1, wherein a radius of the at least one flow channel is within a range of 0.1 mm to 1 mm.

18. The device of claim 1, wherein the at least one flow channel is arranged as at least one flow channel circumference.

19. The device of claim 18, wherein a central spacing distance between two adjacent flow channels on a flow channel circumference of the at least one flow channel circumference is within a range of 1.5 mm to 2.5 mm.

20. The device of claim 18, wherein a radius of a flow channel circumference of the at least one flow channel circumference close to the central region of the upper surface of the at least one heating unit is within a range of 1 mm to 20 mm.

* * * * *